(12) United States Patent
Fishburn

(10) Patent No.: US 7,759,193 B2
(45) Date of Patent: Jul. 20, 2010

(54) METHODS OF FORMING A PLURALITY OF CAPACITORS

(75) Inventor: Fred Fishburn, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/170,307

(22) Filed: Jul. 9, 2008

(65) Prior Publication Data

US 2010/0009512 A1    Jan. 14, 2010

(51) Int. Cl.
*H01L 21/8242*    (2006.01)

(52) U.S. Cl. ............... 438/253; 438/254; 438/256; 438/396; 438/397; 438/399

(58) Field of Classification Search .......... None
See application file for complete search history.

(56) References Cited

U.S. PATENT DOCUMENTS

| | | | |
|---|---|---|---|
| 4,517,729 A | 5/1985 | Batra | |
| 5,236,860 A | 8/1993 | Fazan et al. | |
| 5,340,763 A | 8/1994 | Dennison | |
| 5,401,681 A | 3/1995 | Bertin et al. | |
| 5,467,305 A | 11/1995 | Bertin et al. | |
| 5,498,562 A | 3/1996 | Dennison et al. | |
| 5,532,089 A | 7/1996 | Adair et al. | |
| 5,604,696 A | 2/1997 | Takaishi | |
| 5,605,857 A | 2/1997 | Jost et al. | |
| 5,652,164 A | 7/1997 | Dennison et al. | |
| 5,654,222 A | 8/1997 | Sandhu et al. | |
| 5,686,747 A | 11/1997 | Jost et al. | |
| 5,702,990 A | 12/1997 | Jost et al. | |
| 5,705,838 A | 1/1998 | Jost et al. | |
| 5,767,561 A | 6/1998 | Frei et al. | |
| 5,792,691 A * | 8/1998 | Koga ................ | 438/253 |
| 5,821,140 A | 10/1998 | Jost et al. | |

(Continued)

FOREIGN PATENT DOCUMENTS

DE    44447804    1/2002

(Continued)

OTHER PUBLICATIONS

A. M. Kraynik, "Foam Structure: From Soap Froth to Solid Foams", MRS Bulletin, Apr. 2003, pp. 275-278.

(Continued)

*Primary Examiner*—Zandra Smith
*Assistant Examiner*—Khanh B Duong
(74) *Attorney, Agent, or Firm*—Wells St. John P.S.

(57) ABSTRACT

A method of forming a plurality of capacitors includes forming a plurality of individual capacitor electrodes using two masking steps. An earlier of the two masking steps is used to form an array of first openings over a plurality of storage node contacts. A later of the two masking steps is used to form an array of second openings received partially over and partially offset from the array of first openings. Overlapping portions of the first and second openings are received over the storage node contacts. After both of the two masking steps, conductive material of the individual capacitor electrodes is deposited into the overlapping portions of each of the first and second openings. The individual capacitor electrodes are incorporated into a plurality of capacitors. Other aspects and implementations are contemplated.

35 Claims, 50 Drawing Sheets

U.S. PATENT DOCUMENTS

| | | |
|---|---|---|
| 5,869,382 A | 2/1999 | Kubota |
| 5,900,660 A | 5/1999 | Jost et al. |
| 5,955,758 A | 9/1999 | Sandhu et al. |
| 5,981,350 A | 11/1999 | Geusic et al. |
| 5,981,992 A | 11/1999 | Calpine Kenney |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,097,055 A * | 8/2000 | Lee et al. .................. 257/309 |
| 6,108,191 A | 8/2000 | Bruchhaus et al. |
| 6,110,774 A | 8/2000 | Jost et al. |
| 6,133,620 A | 10/2000 | Uochi |
| 6,159,818 A | 12/2000 | Durcan et al. |
| 6,180,450 B1 | 1/2001 | Dennison |
| 6,204,143 B1 | 3/2001 | Roberts et al. |
| 6,204,178 B1 | 3/2001 | Marsh |
| 6,249,019 B1 | 6/2001 | Sandhu et al. |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juengling |
| 6,372,554 B1 | 4/2002 | Kawakita et al. |
| 6,372,574 B1 | 4/2002 | Lane et al. |
| 6,383,861 B1 | 5/2002 | Gonzalez et al. |
| 6,395,613 B1 | 5/2002 | Juengling |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,475,855 B1 | 11/2002 | Fishburn |
| 6,476,432 B1 | 11/2002 | Basceri et al. |
| 6,617,222 B1 | 9/2003 | Coursey |
| 6,620,680 B2 | 9/2003 | Durcan et al. |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,696,745 B2 | 2/2004 | Sandhu et al. |
| 6,707,088 B2 | 3/2004 | Fishburn |
| 6,709,978 B2 | 3/2004 | Geusic et al. |
| 6,720,232 B1 | 4/2004 | Tu et al. |
| 6,727,540 B2 | 4/2004 | Divakaruni et al. |
| 6,767,789 B1 | 7/2004 | Bronner et al. |
| 6,784,112 B2 | 8/2004 | Arita et al. |
| 6,784,479 B2 | 8/2004 | Park |
| 6,787,833 B1 | 9/2004 | Fishburn |
| 6,812,513 B2 | 11/2004 | Geusic et al. |
| 6,822,261 B2 | 11/2004 | Yamazaki et al. |
| 6,822,280 B2 | 11/2004 | Ito et al. |
| 6,844,230 B2 | 1/2005 | Reinberg |
| 6,849,496 B2 | 2/2005 | Jaiprakash et al. |
| 6,861,330 B2 | 3/2005 | Basceri et al. |
| 6,890,814 B2 | 5/2005 | Sandhu et al. |
| 6,893,914 B2 | 5/2005 | Kim et al. |
| 6,897,109 B2 | 5/2005 | Jine et al. |
| 6,927,122 B2 | 8/2005 | Geusic et al. |
| 6,930,640 B2 | 8/2005 | Chung et al. |
| 6,962,846 B2 | 11/2005 | Fishburn et al. |
| 6,991,980 B2 | 1/2006 | Park |
| 7,005,379 B2 | 2/2006 | Sinha et al. |
| 7,279,379 B2 | 2/2006 | Tran et al. |
| 7,042,040 B2 | 5/2006 | Horiguchi |
| 7,053,435 B2 | 5/2006 | Yeo et al. |
| 7,064,028 B2 | 6/2006 | Ito et al. |
| 7,064,365 B2 | 6/2006 | An et al. |
| 7,071,055 B2 | 7/2006 | Fishburn |
| 7,073,969 B2 | 7/2006 | Kamm |
| 7,074,669 B2 | 7/2006 | Iijima et al. |
| 7,078,292 B2 * | 7/2006 | Park et al. .................... 438/250 |
| 7,081,384 B2 | 7/2006 | Birner et al. |
| 7,084,451 B2 | 8/2006 | Forbes et al. |
| 7,125,781 B2 | 10/2006 | Manning et al. |
| 7,153,778 B2 | 12/2006 | Busch et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,226,845 B2 | 6/2007 | Manning et al. |
| 7,268,034 B2 | 9/2007 | Basceri et al. |
| 7,268,039 B2 | 9/2007 | Fishburn et al. |
| 7,273,779 B2 | 9/2007 | Fishburn et al. |
| 7,282,756 B2 | 10/2007 | Agarwal et al. |
| 7,288,806 B2 | 10/2007 | Tran et al. |
| 7,320,911 B2 | 1/2008 | Basceri et al. |
| 7,321,149 B2 | 1/2008 | Busch et al. |
| 7,321,150 B2 | 1/2008 | Fishburn et al. |
| 7,335,935 B2 | 2/2008 | Sinha et al. |
| 7,341,909 B2 | 3/2008 | McDaniel et al. |
| 7,384,847 B2 | 6/2008 | Tran et al. |
| 7,387,939 B2 | 6/2008 | Manning |
| 7,393,741 B2 | 7/2008 | Sandhu et al. |
| 7,413,952 B2 | 8/2008 | Busch et al. |
| 7,440,255 B2 | 10/2008 | McClure et al. |
| 7,442,600 B2 | 10/2008 | Wang et al. |
| 7,445,990 B2 | 11/2008 | Busch et al. |
| 7,449,391 B2 | 11/2008 | Manning et al. |
| 7,517,754 B2 | 4/2009 | McDaniel et al. |
| 7,538,036 B2 | 5/2009 | Busch et al. |
| 7,638,392 B2 | 12/2009 | Wang et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0087501 A1 | 5/2003 | Park |
| 2003/0153146 A1 | 8/2003 | Won et al. |
| 2003/0169629 A1 | 9/2003 | Goebel et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0056295 A1 | 3/2004 | Agarwal et al. |
| 2004/0150070 A1 | 8/2004 | Okada et al. |
| 2004/0188738 A1 | 9/2004 | Farnworth et al. |
| 2005/0023588 A1 | 2/2005 | Sandhu et al. |
| 2005/0051822 A1 | 3/2005 | Manning |
| 2005/0054159 A1 | 3/2005 | Manning et al. |
| 2005/0158949 A1 | 7/2005 | Manning |
| 2005/0176210 A1 | 8/2005 | Kim et al. |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0121672 A1 | 6/2006 | Basceri et al. |
| 2006/0148190 A1 | 7/2006 | Busch |
| 2006/0176210 A1 | 8/2006 | Nakamura et al. |

| | | |
|---|---|---|
| 2006/0186451 A1 | 8/2006 | Dusberg et al. |
| 2006/0211211 A1 | 9/2006 | Sandhu et al. |
| 2006/0237762 A1 | 10/2006 | Park |
| 2006/0249798 A1 | 11/2006 | Manning |
| 2006/0258109 A1 | 11/2006 | Juengling |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0093022 A1 | 4/2007 | Basceri |
| 2007/0099328 A1 | 5/2007 | Chiang et al. |
| 2007/0145009 A1 | 6/2007 | Fucsko et al. |
| 2007/0181929 A1 | 8/2007 | Juengling |
| 2007/0196978 A1 | 8/2007 | Manning |
| 2007/0207622 A1 | 9/2007 | Rana et al. |
| 2007/0238259 A1 | 10/2007 | Bhat |
| 2008/0090416 A1 | 4/2008 | Raghu et al. |
| 2009/0047769 A1 | 2/2009 | Bhat et al. |

FOREIGN PATENT DOCUMENTS

| | | |
|---|---|---|
| JP | 08-274278 | 10/1996 |
| JP | 10-189912 | 7/1998 |
| JP | 11-191615 | 7/1999 |
| JP | 2000-196038 | 7/2000 |
| JP | 2003-142605 | 5/2003 |
| JP | 2003-264246 | 9/2003 |
| JP | 2003-273247 | 9/2003 |
| JP | 2003-297952 | 10/2003 |
| JP | 2004072078 | 3/2004 |
| JP | 2004-111626 | 4/2004 |
| JP | 2004-128463 | 4/2004 |
| JP | 2005032982 | 2/2005 |
| JP | 2006135364 | 5/2006 |
| KR | 20010061020 | 7/2001 |
| KR | 10-2001-108963 | 12/2001 |
| KR | 2001/0114003 | 12/2001 |
| KR | 1020030058018 | 7/2003 |
| KR | 1020050000896 | 1/2005 |
| KR | 10-520223 | 10/2005 |
| WO | PCT/US2004/0040252 | 12/2004 |
| WO | PCT/US2004/0027898 | 2/2005 |
| WO | WO 2005/024936 | 3/2005 |
| WO | PCT/US2006/06806 | 2/2006 |
| WO | PCT/US2006/06806 | 7/2006 |
| WO | PCT/US2006/06806 | 3/2007 |
| WO | PCT/US2008/070071 | 7/2009 |
| WO | PCT/US2009/046946 | 1/2010 |

OTHER PUBLICATIONS

A. Nadeem et al., "Fabrication of Microstructures Using Aluminum Anodization Techniques", pre-2004, pp. 274-277.

C. Y. Liu et al., "Ordered anodic alumina nanochannels on focused-ion-beam-prepatterned aluminum surfaces", Appl. Phys. Lett., vol. 78, No. 1, pp. 120-122 (Jan. 2001).

D. Crouse et al. "Self-Assembled Nanostructures Using Anodized Alumina Thin Films for Optoelectronic Applications", IEEE, pp. 234-235, 1999.

D. H. Kim et al., "A mechanically enhanced storage node for virtually unlimited height (MESH) capacitor aiming at sub 70nm DRAMs", IEEE, Jan. 2004, pp. 69-72.

D. J. Green et al., "Celleular Ceramics: Intriguing Structures, Novel Properties, and Innovative Applications", MRS Bulletin, Apr. 2003, pp. 296-300.

D. J. Green et al., "The Structure and Applications of Cellular Ceramics", MRS Bulletin, Apr. 2003, 10 pages.

E. Maire et al., "In Situ X-Ray tomography Measurements of Deformation in Cellular Solids", MRS Bulletin, Apr. 2003, pp. 284-289.

G. H. Oh et al., "Preparation and Pore-Characteristics Control of Nano-Porous Materials Using Organometallic Building Blocks", Carbon Science, vol. 4, No. 1, Mar. 2003, pp. 1-9.

H. Masuda et al., "Highly ordered nanochannel-array architecture in anodic alumina", App. Phys. Lett, vol. 71, No. 19, Nov. 1997, pp. 2770-2772.

J. Banhart, "Aluminum Foams: On the Road to Real Applications", MRS Bulletin, Apr. 2003, pp. 290-295.

J. Liang et al., "Nonlithographic Fabrication of Lateral Superlattices for Nanometric Electromagnetic-Optic . . .", IEEE J. Selected Topics in Quantum Electr., vol. 8, No. 5, pp. 998-1008 (Sep./Oct. 2002).

J. M. Karp et al., "Scaffolds for Tissue Engineering", MRS Bulletin, Apr. 2003, pp. 301-302.

J. M. Park et al., "Novel Robust Cell Capacitor (Leaning Exterminated Ring Type Insulator) and New Storage Node Contact", IEEE, 2004 Symposium on VLSI Technology Digest of Technical Papers, pp. 34-35.

J. P. O'Sullivan et al., "The Morphology and Mechanism of Formation of Porous Anodic Films on Aluminum", Proc. Roy. Soc. Lond. A, vol. 317, 1970, pp. 511-543.

L. J. Gibson et al., "Cellular Solids", MRS Bulletin, Apr. 2003, pp. 270-274.

M. Park et al., "Block Copolymer Lithography: Periodic Arrays of ~ 1011 Holes in 1 Square Centimeter", Science, vol. 276, May 1997, pp. 1401-1404.

M. Tsukada et al., "Preparation and Application of Porous Silk Fibroin Materials", J. Appl. Polymer Sci., vol. 54, 1994, pp. 507-514.

P. R. Onch, "Scale Effects in Cellular Metals", MRS Bulletin, Apr. 2003, pp. 279-283.

S. Shingubara, "Fabrication of nanomaterials using porous alumina templates", J. Nanoparticle Res., vol. 5, 2003, pp. 17-30.

S. Tan et al., "High Aspect Ratio Microstructures on Porous Anodic Aluminum Oxide", IEEE, 1995, pp. 267-272.

V. V. Konovalov et al., "Chemistry of Materials", Chem. Mater., vol. 11, No. 8, pp. 1949-1951 (Aug. 1999).

X. Li., "Metal-assisted chemical etching in HF/H202 produces porous silicon", Applied Physics Letters, vol. 77, No. 16, Oct. 16, 2000, pp. 2572-2574.

Yasaitis et al., "A modular process for integrating thick polysilicon MEMS devices with submicron CMOS", Analog Devices, Pre-2004.

* cited by examiner

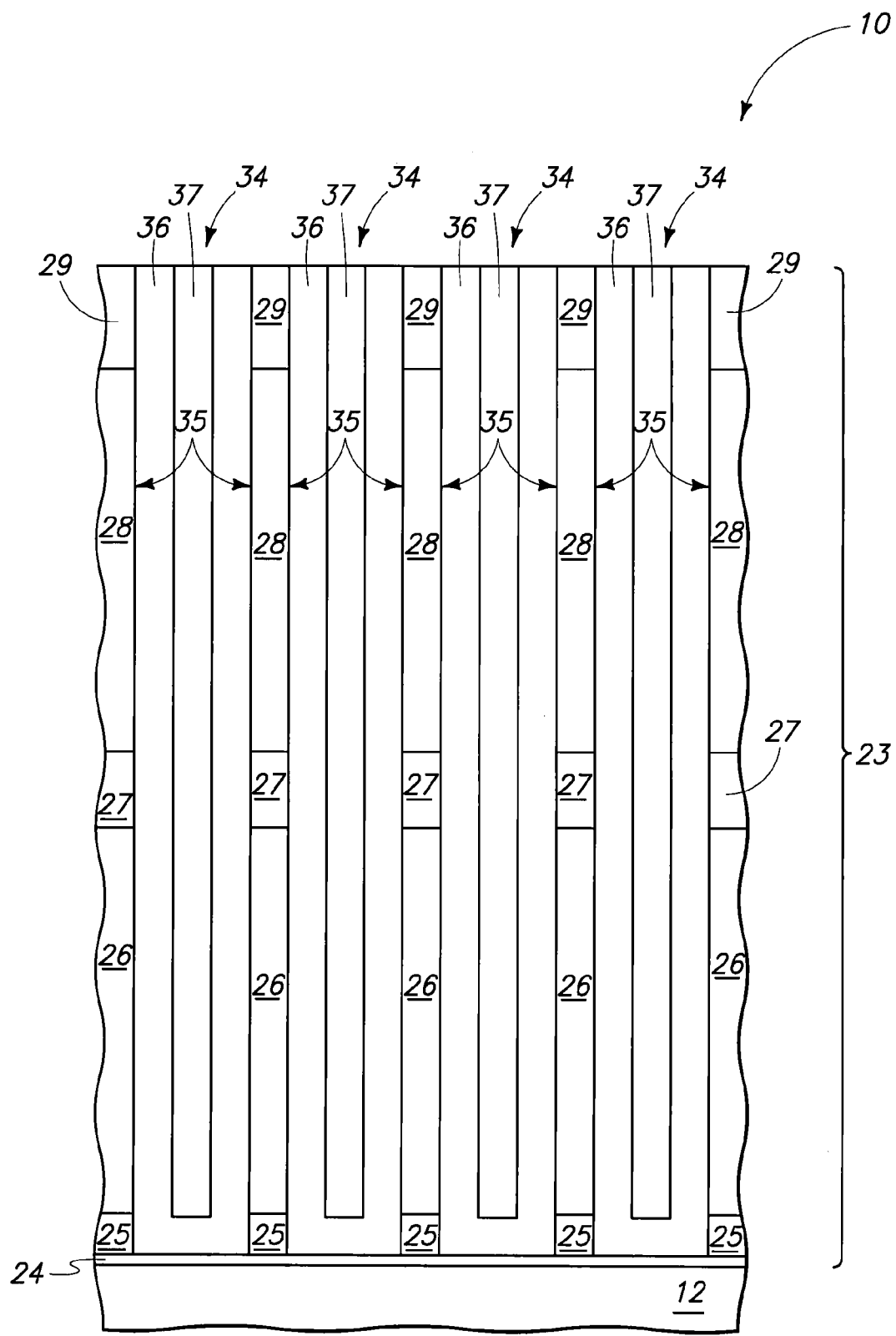
F I G 7

$F_{IT}$ $24$

METHODS OF FORMING A PLURALITY OF CAPACITORS

TECHNICAL FIELD

Embodiments disclosed herein pertain to methods of forming a plurality of capacitors.

BACKGROUND

Capacitors are one type of component commonly used in the fabrication of integrated circuits, for example in DRAM circuitry. A capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. For example, an array of capacitor electrode openings for individual capacitors may be fabricated in such insulative capacitor electrode-forming material, with an example insulative electrode-forming material being silicon dioxide doped with one or both of phosphorus and boron. The capacitor electrode openings may be formed by etching. It can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area and thereby increased capacitance for the capacitors being formed. However, the capacitor electrodes formed in deep openings are often correspondingly much taller than they are wide. This can lead to toppling of the capacitor electrodes, either during the etch to expose the outer sidewalls surfaces, during transport of the substrate, and/or during deposition of the capacitor dielectric layer or outer capacitor electrode layer. Our U.S. Pat. No. 6,667,502 teaches the provision of a brace or retaining structure intended to alleviate such toppling. Other aspects associated in the formation of a plurality of capacitors, some of which include bracing structures, are also disclosed and are:

U.S. Published Application No. 2005/0051822;
U.S. Published Application No. 2005/0054159;
U.S. Published Application No. 2005/0158949;
U.S. Published Application No. 2005/0287780;
U.S. Published Application No. 2006/0014344;
U.S. Published Application No. 2006/0051918;
U.S. Published Application No. 2006/0046420;
U.S. Published Application No. 2006/0121672;
U.S. Published Application No. 2006/0211211;
U.S. Published Application No. 2006/0263968;
U.S. Published Application No. 2006/0261440;
U.S. Published Application No. 2007/0032014;
U.S. Published Application No. 2006/0063344;
U.S. Published Application No. 2006/0063345;

Fabrication of capacitors in memory circuitry may form an array of capacitors within a capacitor array area. Control or other circuitry area is often displaced from the capacitor array area, with the substrate including an intervening area between the capacitor array area and the control or other circuitry area. In some instances, a trench is formed in the intervening area between the capacitor array area and the other circuitry area. Such trench can be formed commensurate with the fabrication of the openings within the capacitor array area within which the isolated capacitor electrodes will be received.

BRIEF DESCRIPTION OF THE DRAWINGS

FIG. 7 is a section view taken through line 7-7 in FIG. 6.

DETAILED DESCRIPTION OF EXAMPLE EMBODIMENTS

Figure 1:
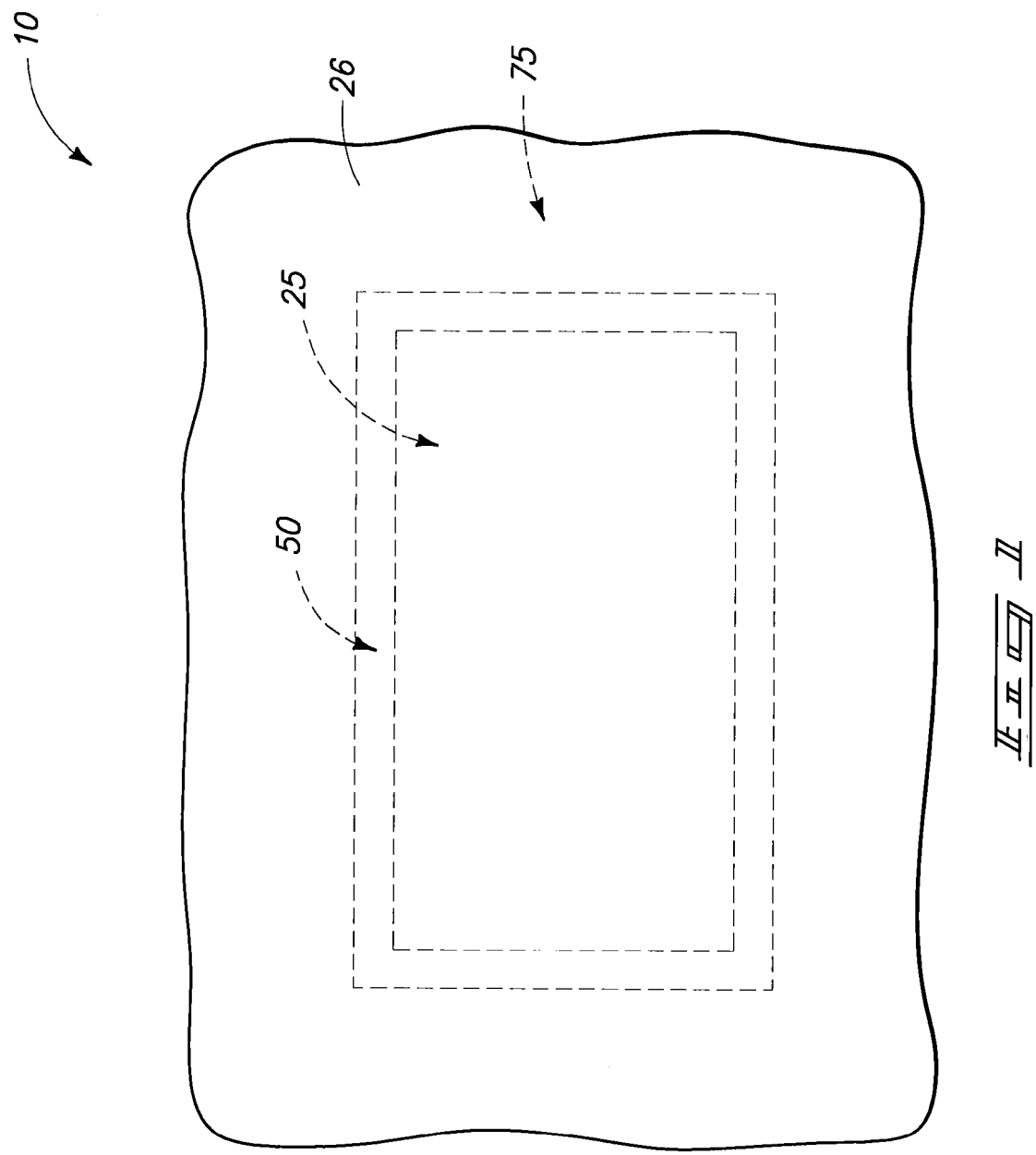
FIG. 1 is a diagrammatic top plan view of substrate fragment in process in accordance with an embodiment of the invention.
Figure 2:
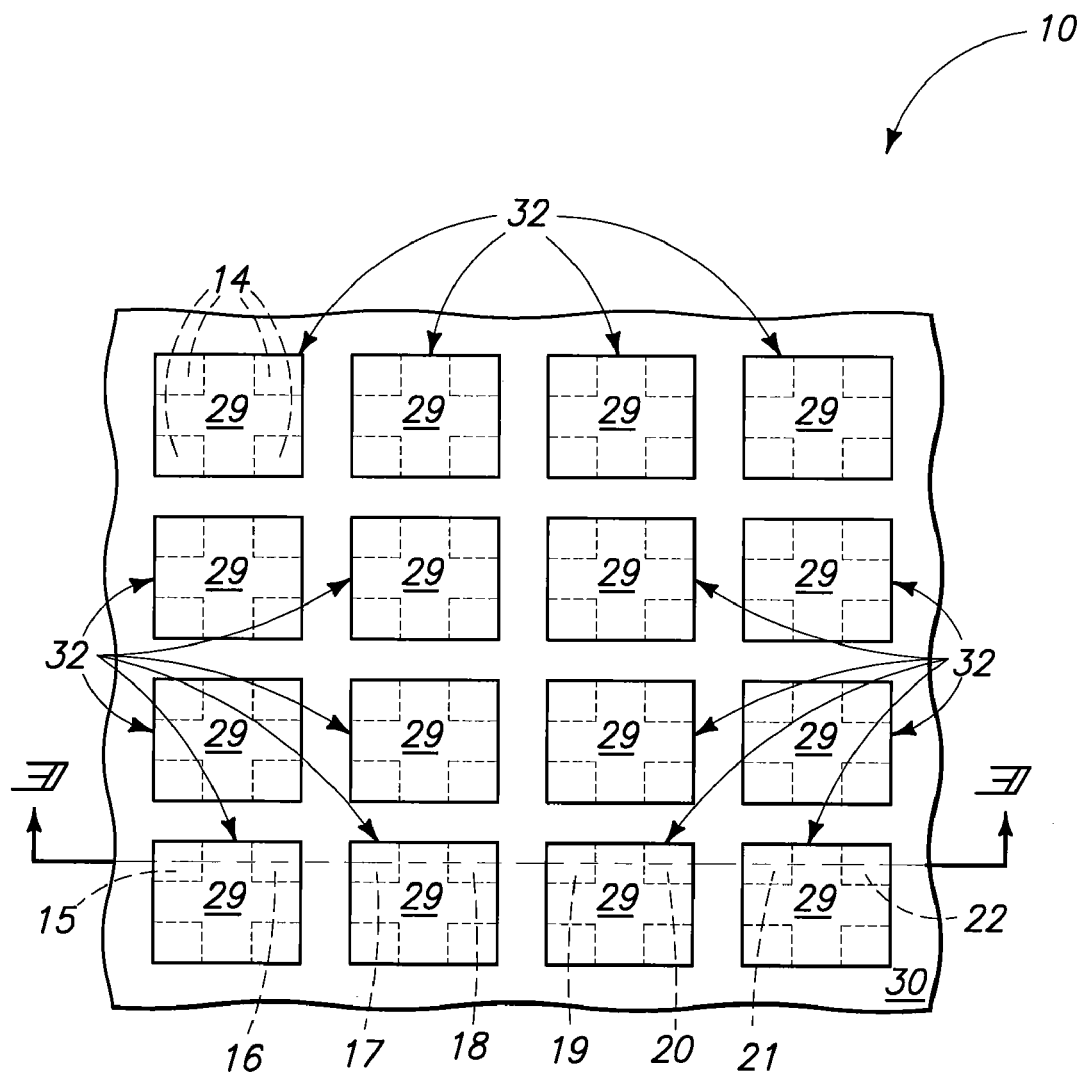
FIG. 2 is an enlarged diagrammatic top plan view of a small portion of the FIG. 1 substrate fragment.
Figure 3:
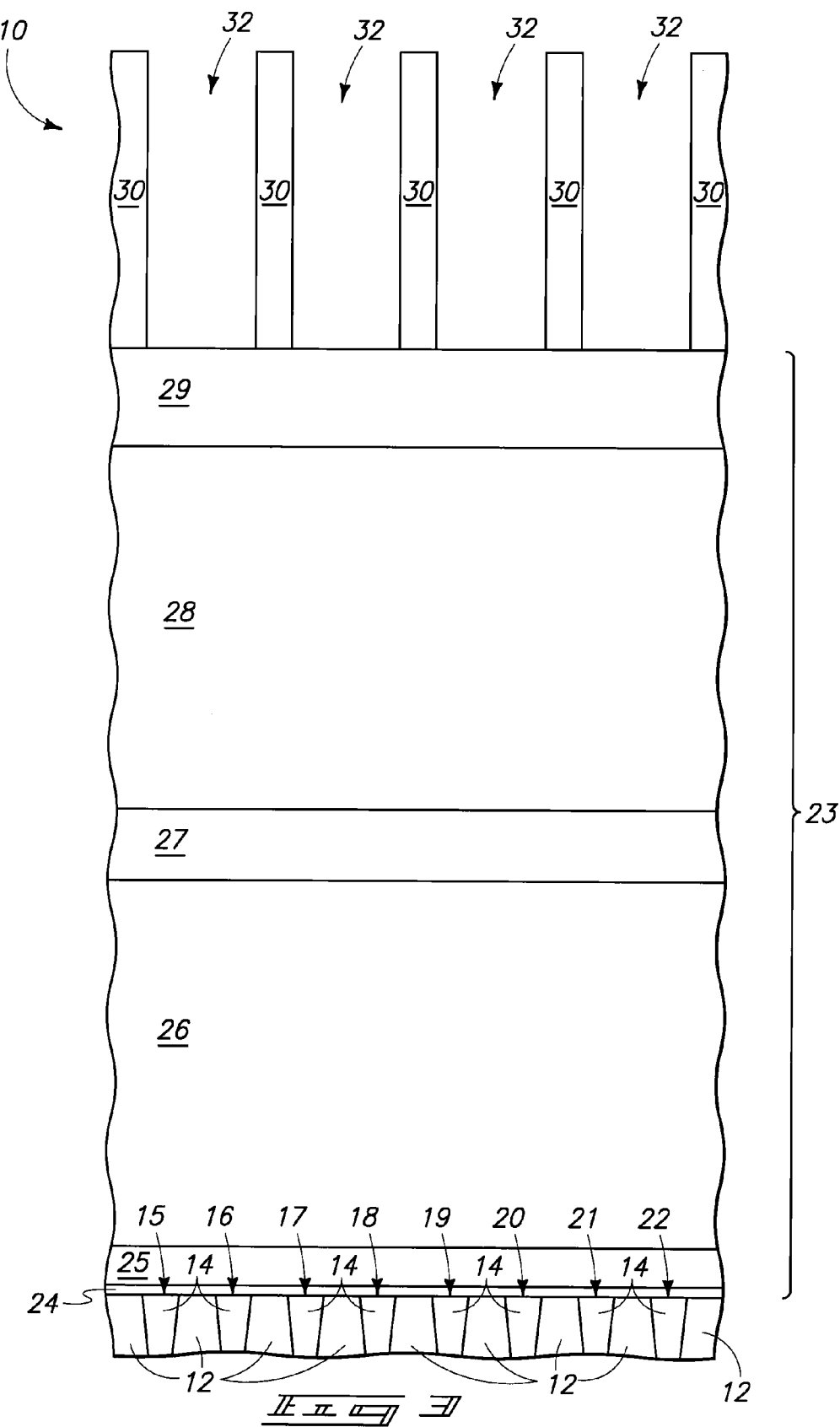
FIG. 3 is a section view taken through line 3-3 in FIG. 2.

Example methods of forming pluralities of capacitors are described with reference to FIGS. 1-50. Referring initially to FIGS. 1-3, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, substrate 10 might comprise a bulk semiconductor material (not shown), for example bulk monocrystalline, and/or comprise semiconductor-on-insulator layers.

Substrate 10 can be considered as comprising a capacitor array area 625, a circuitry area 675 other than capacitor array area 625, and an intervening area 650 between capacitor array area 625 and circuitry area 675. In the depicted example embodiment, intervening area 650 completely surrounds and encircles capacitor array area 625 (FIG. 1), and circuitry area 675 comprises a peripheral circuitry area to that of capacitor array area 625. Alternate constructions are contemplated, of course, for example whereby neither intervening area 650 nor circuitry area 675 completely or partially encircles a capacitor array area 625.

FIG. 3 depicts an insulative material 12 having electrically conductive storage node pillars 14 formed there-through. Materials 12 and 14 may be fabricated over some suitable underlying material, for example bulk monocrystalline and/ or underlying circuitry. Example insulative materials 12 include doped and undoped silicon dioxides, for example silicon dioxide deposited by the decomposition of tetraethylorthosilicate (TEOS) and/or borophosphosilicate glass (BPSG) and/or silicon nitride. Alternately by way of example only, material 12 might comprise anisotropically etched insulative sidewall spacers, for example formed about transistor gate lines (not shown). An example material 14 is conductively doped polysilicon. Conductive material 14 can be considered as comprising or defining a plurality of capacitor storage node locations/contacts on substrate 10, and which have been designated with numerals 15, 16, 17, 18, 19, 20, 21, and 22 in three example rows in FIG. 4. Storage node contacts 15, 16, 17, 18, 19, 20, 21, and 22 are examples only and, regardless, may be conductive at this point in the process, or made conductive subsequently.

A first material 23 is formed over the array of storage node contacts, including over storage node contacts 15, 16, 17, 18, 19, 20, 21, and 22. Such may be homogenous or non-homogenous, for example comprising multiple different and/or alternating composition regions and/or layers. In the example embodiment, first material 23 is depicted as comprising materials 24, 25, 26, 27, 28 and 29. Example respective thicknesses for each are 275 Angstroms, 1,000 Angstroms, 10,000 Angstroms, 2,000 Angstroms, 10,000 Angstroms, and 3,000 Angstroms. Some or all of first material 23 may or may not remain as part of a finished circuitry construction incorporating the plurality of capacitors. Such may be insulative, conductive, or semiconductive. If insulative, example compositions for material 24 comprise silicon nitride and/or undoped silicon dioxide. Material 24 may be included to provide an etch stop, or other function. In one embodiment, materials 25, 27 and 29 are of the same composition, for example undoped silicon dioxide. In one embodiment, materials 26 and 28 are of the same composition, for example doped silicon dioxide such as borophosphosilicate glass, borosilicate glass, or phosphosilicate glass. In one example embodiment, first material 23 comprises at least first and second etchably different materials. In one example, and where materials 26 and 28 are the same composition, such can be considered as a first material which is etchably different from that of a second material comprised of the composition of the material 25, 27 and 29 (when such are of the same composition). Further, of course, fewer or more alternating or different composition layers could also of course be provided for material 23. Also, "first"

and "second" are used for convenience only with respect to differentiating various materials, with such being interchangeable independent of order provided over the substrate and independent of whether other such materials are provided therebelow or thereover.

Referring to FIGS. 2 and 3, a mask 30 has been formed over first material 23. An example for mask 30 includes 8,000 Angstroms of transparent carbon having a 320 Angstrom anti-reflective coating (i.e., DARC) deposited thereover. An array of openings 32 has been formed in mask 30 (i.e., using photolithographic of other processing).

Figure 4:
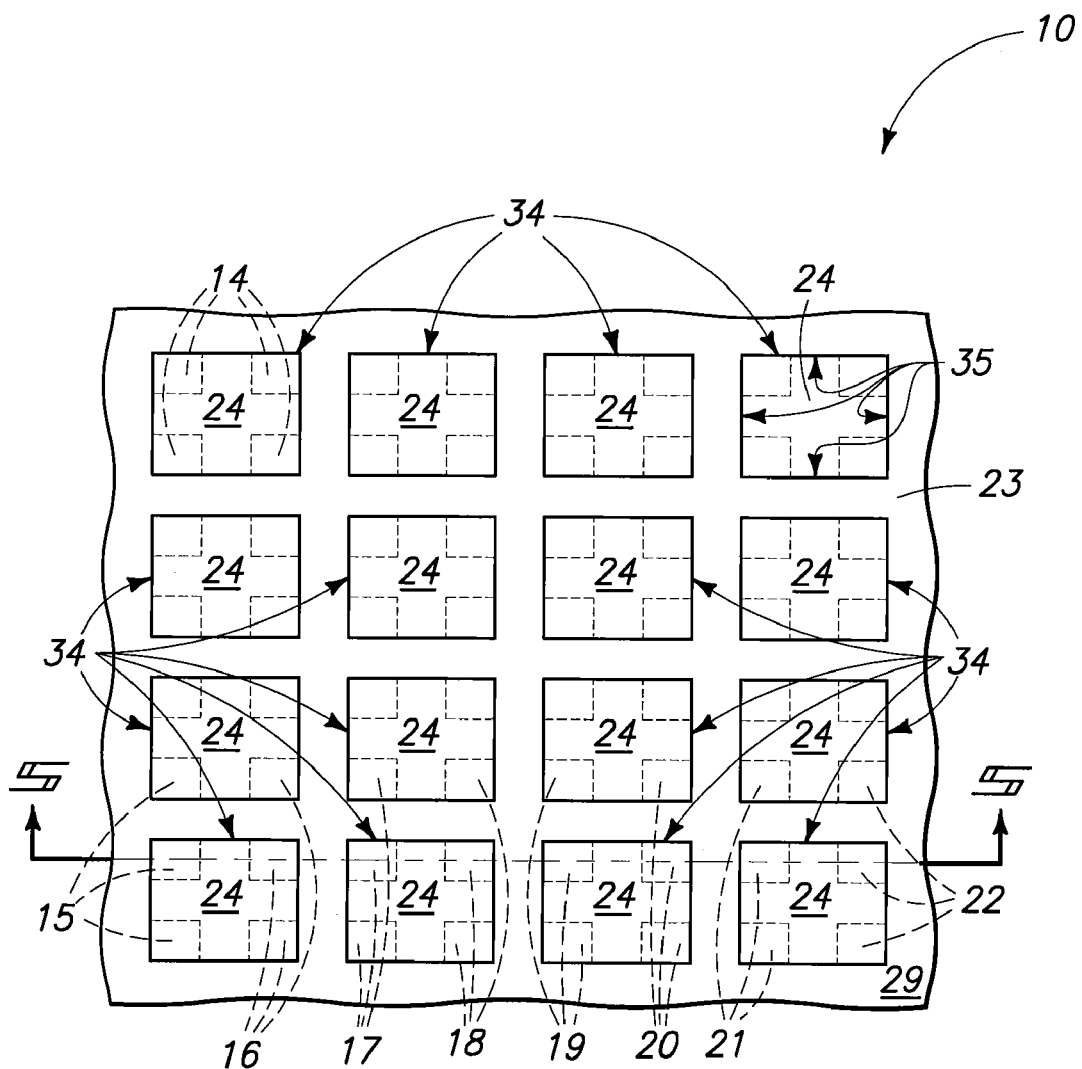
FIG. 4 is a diagrammatic top plan view of the substrate fragment of FIG. 2 at a processing step subsequent to that shown by FIG. 2.
Figure 5:
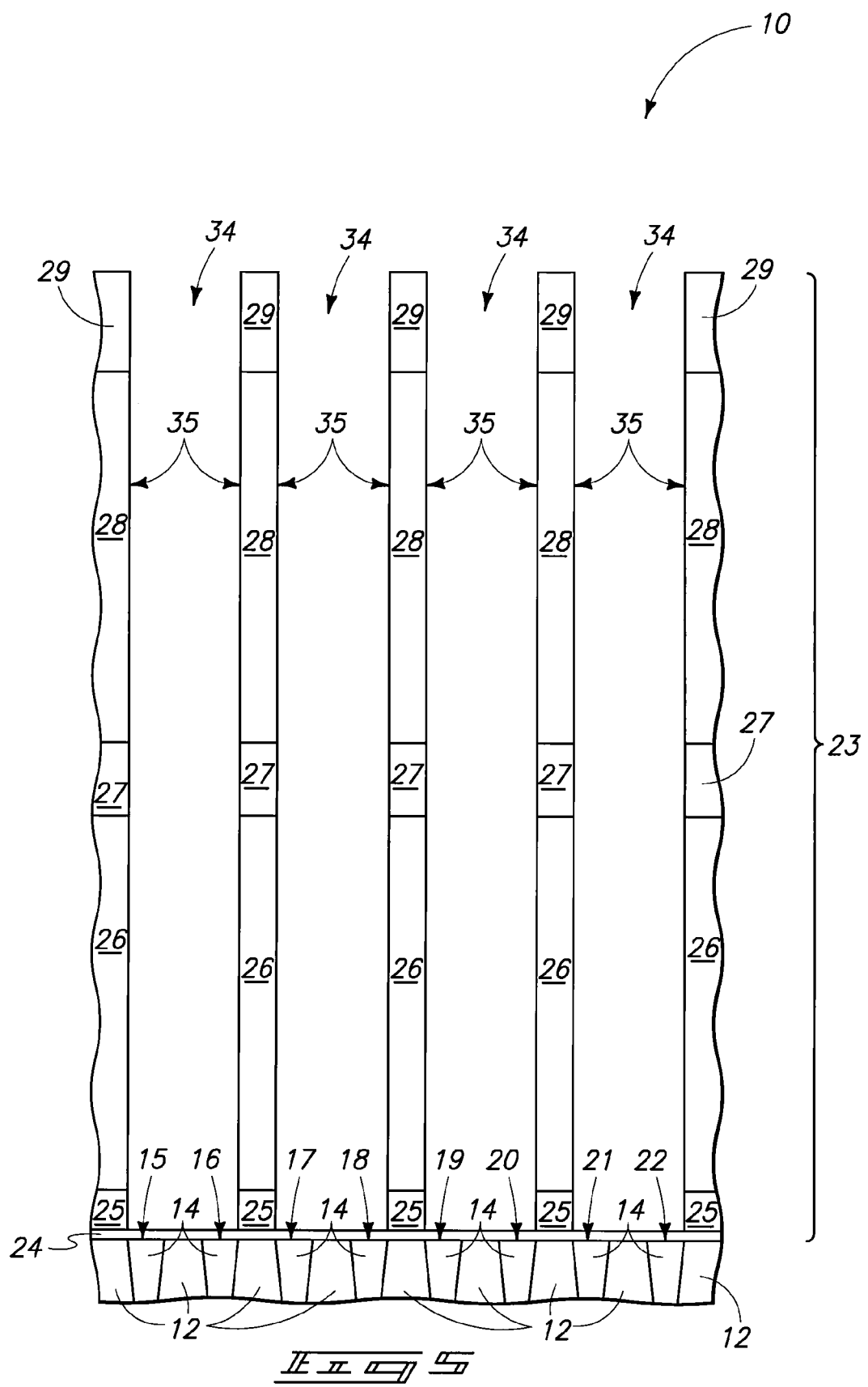
FIG. 5 is a section view taken through line 5-5 in FIG. 4.

Referring to FIGS. 4 and 5, an array of first openings 34 has been formed into first material 23 over the storage node contacts, for example using openings 32 (not shown) in mask 30 (not shown) and which has been subsequently removed. Individual of first openings 34 are formed over at least two of the storage node contacts. In one embodiment, individual of the first openings are formed over four or less of the storage node contacts, with the embodiments of FIGS. 4 and 5 showing first openings 34 being individually formed over four, and only four, storage node contacts. In one embodiment, individual of first openings 34 are quadrilateral in shape in at least one horizontal cross section through the substrate, in one embodiment comprise parallelograms, and in one embodiment comprise rectangles, for example as shown. Other shapes and/or sub-plurality collections of storage node contacts are also of course contemplated. Further, first openings 34 may or may not extend entirely to the storage node contacts which such overlie at this point of processing. In the depicted example FIGS. 4 and 5 embodiment, formation of first openings 34 may occur by using any suitable anisotropic etching chemistries to ultimately etch selectively to and stop upon material 24 as shown. In the context of this document, a selective etch defines an etch rate of one material relative another of at least 2:1. For purposes of the continuing discussion, individual first openings 34 can be considered as comprising surrounding sidewalls 35.

Figure 6:
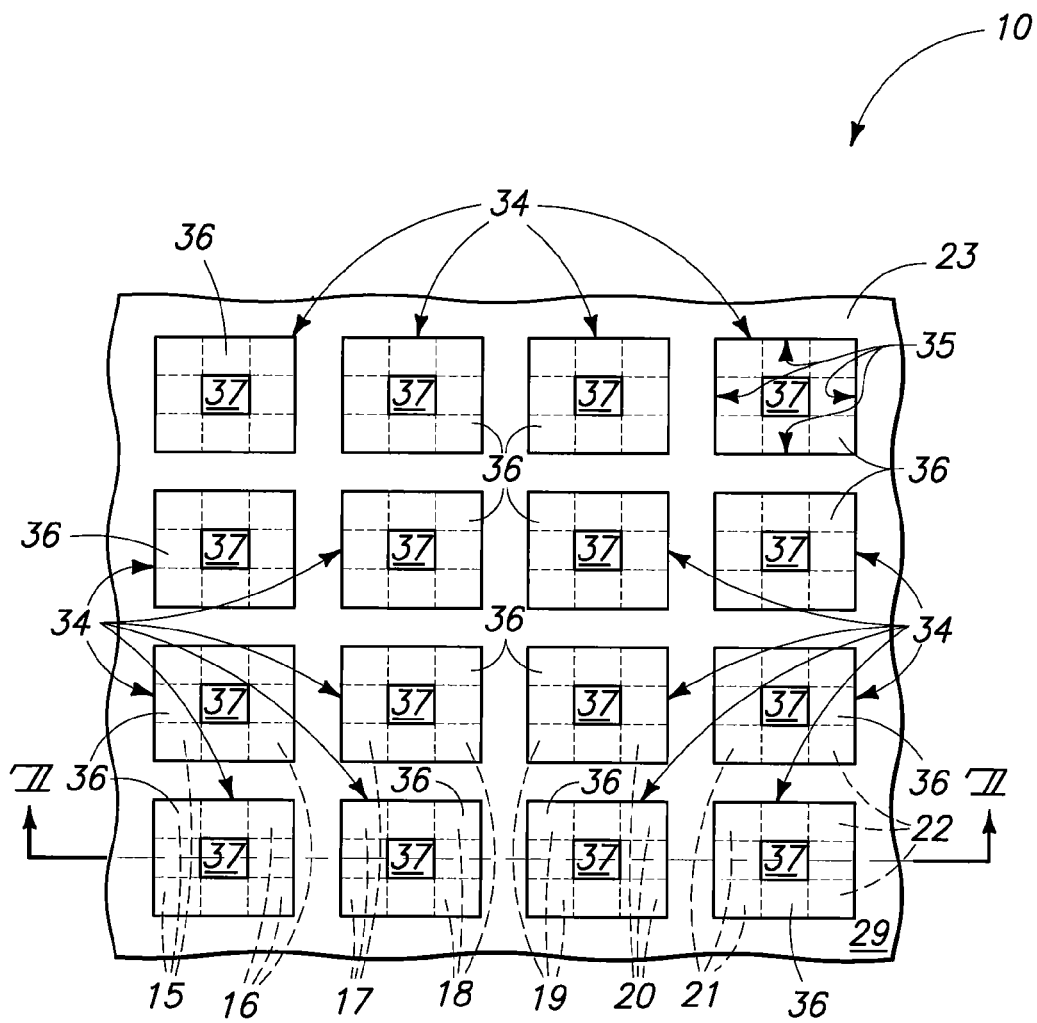
FIG. 6 is a diagrammatic top plan view of the substrate fragment of FIG. 4 at a processing step subsequent to that shown by FIG. 4.

Referring to FIGS. 6 and 7, masking material 36 has been deposited within first openings 34 and which is received over the storage node contacts within individual of such openings. An example masking material comprises polysilicon. Alternate example masking materials include carbon or other organic materials. Ideally, masking material 26 is capable of conformal deposition, for example at 70% to 100% step coverage. In the first depicted example embodiment, masking material 36 has been deposited to line surrounding first openings sidewalls 35 and to less than fill such first openings 34. In one example where the widest open dimension of first openings 34 are about 1,650 by 1900 Angstroms, an example deposition thickness for masking material 36 is 600 Angstroms to leave a center gap or open dimensions of about 450 Angstroms by 700 Angstroms. FIGS. 6 and 7 depict such center volume as having been subsequently filled with another material 37 (for example photoresist), with materials 36 and 37 then having been collectively planarized back at least to an outermost surface of first material 23. In one embodiment, the act of lining to form masking material 36 within first openings 34 is conducted to provide a lateral thickness of material 36 within first openings 34 which is no greater than forty percent of a minimum horizontal cross sectional open dimension at outermost portions of individual first openings 34 within first material 23.

Figure 8:
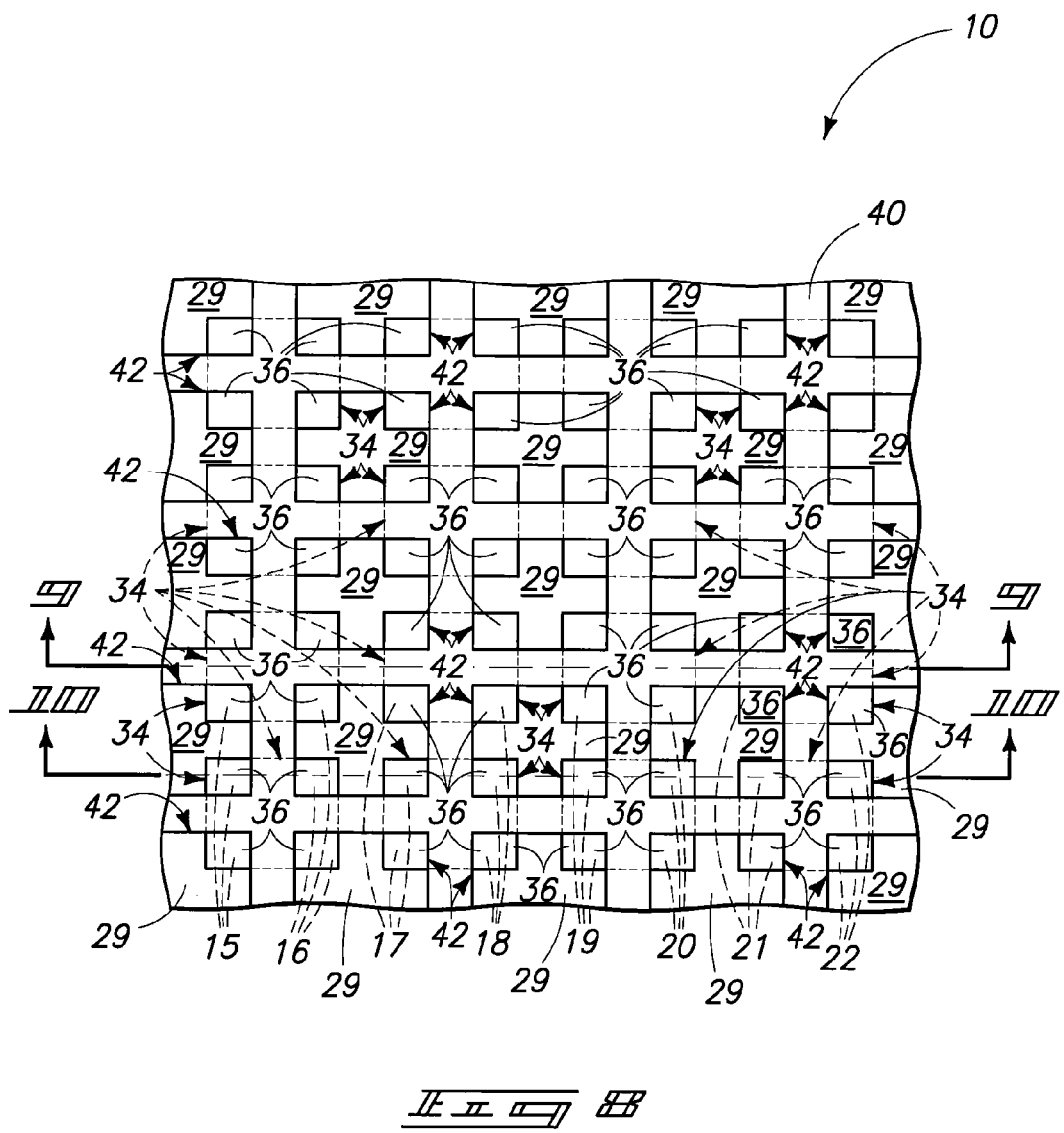
FIG. 8 is a diagrammatic top plan view of the substrate fragment of FIG. 6 at a processing step subsequent to that shown by FIG. 6.
Figure 9:
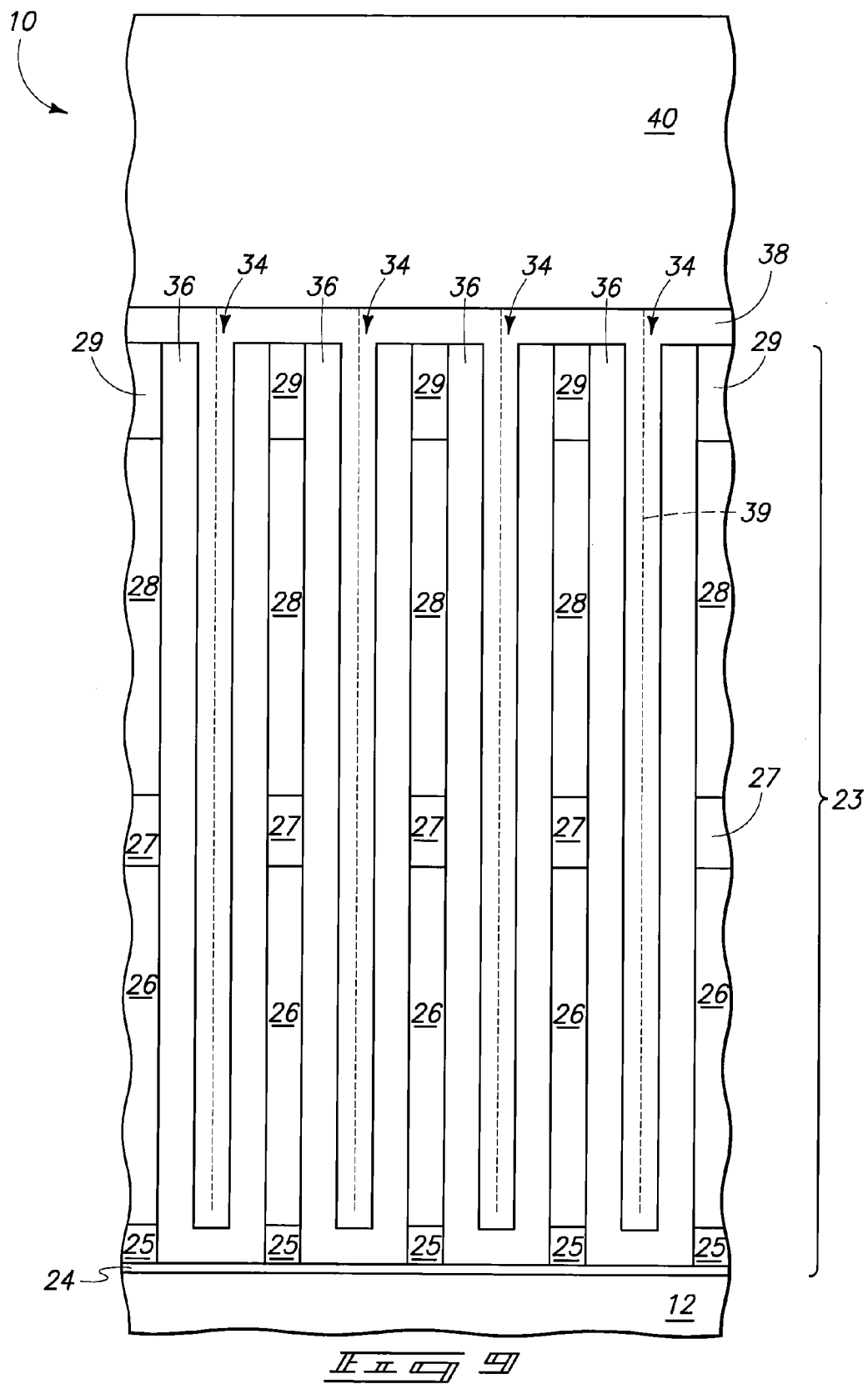
FIG. 9 is a section view taken through line 9-9 in FIG. 8.
Figure 10:
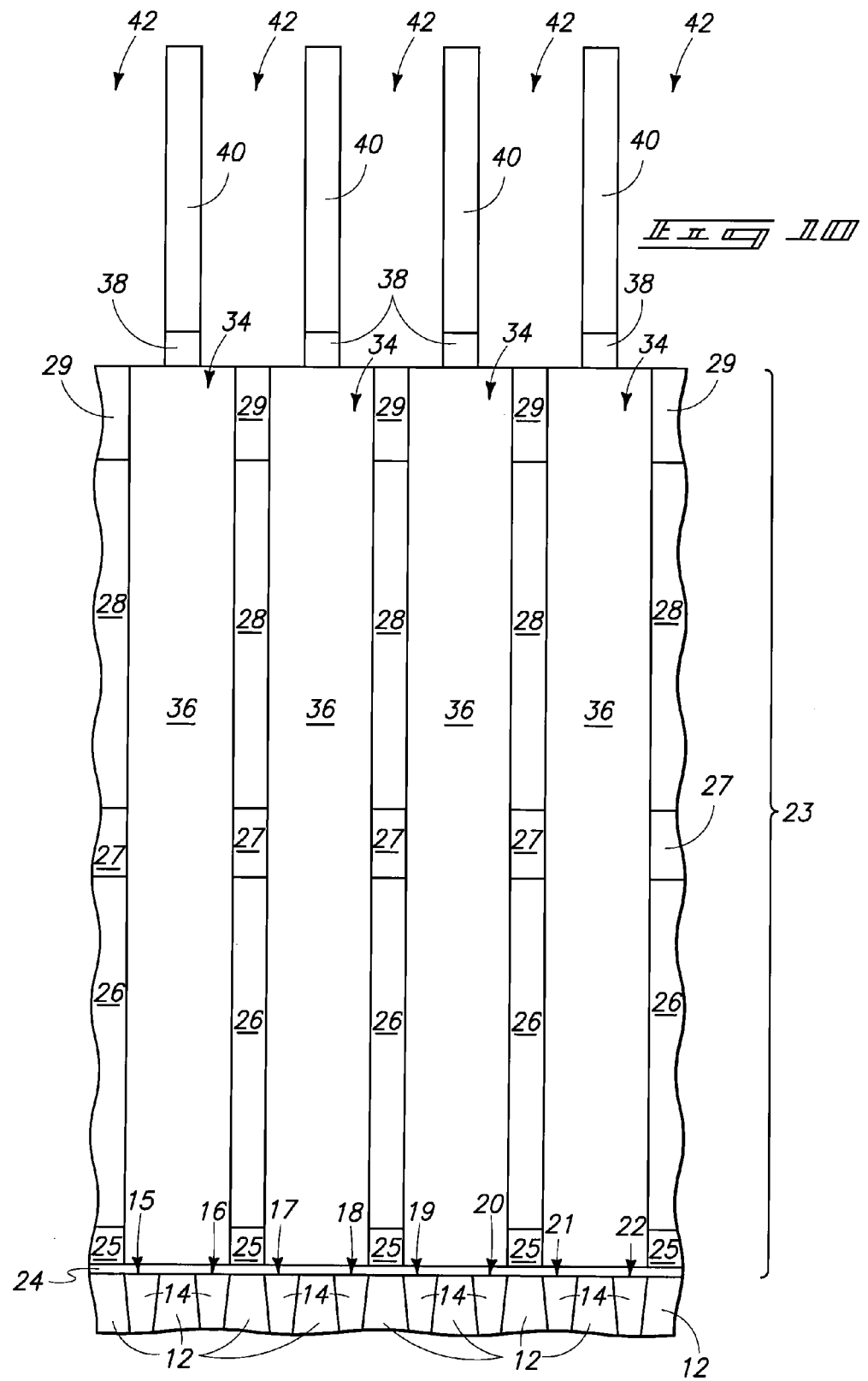
FIG. 10 is a section view taken through line 10-10 in FIG. 8.
Figure 11:
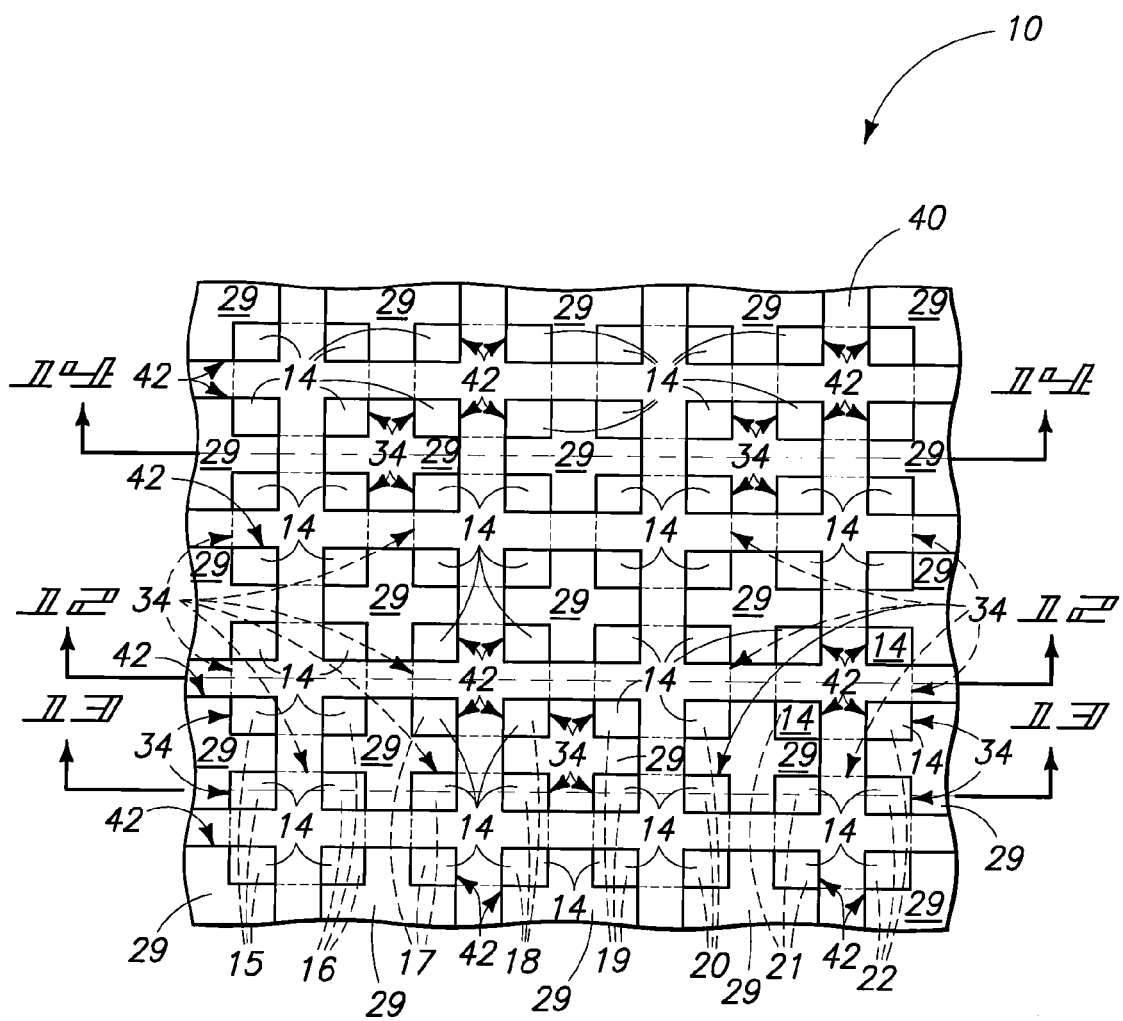
FIG. 11 is a diagrammatic top plan view of the substrate fragment of FIG. 8 at a processing step subsequent to that shown by FIG. 8.
Figure 12:
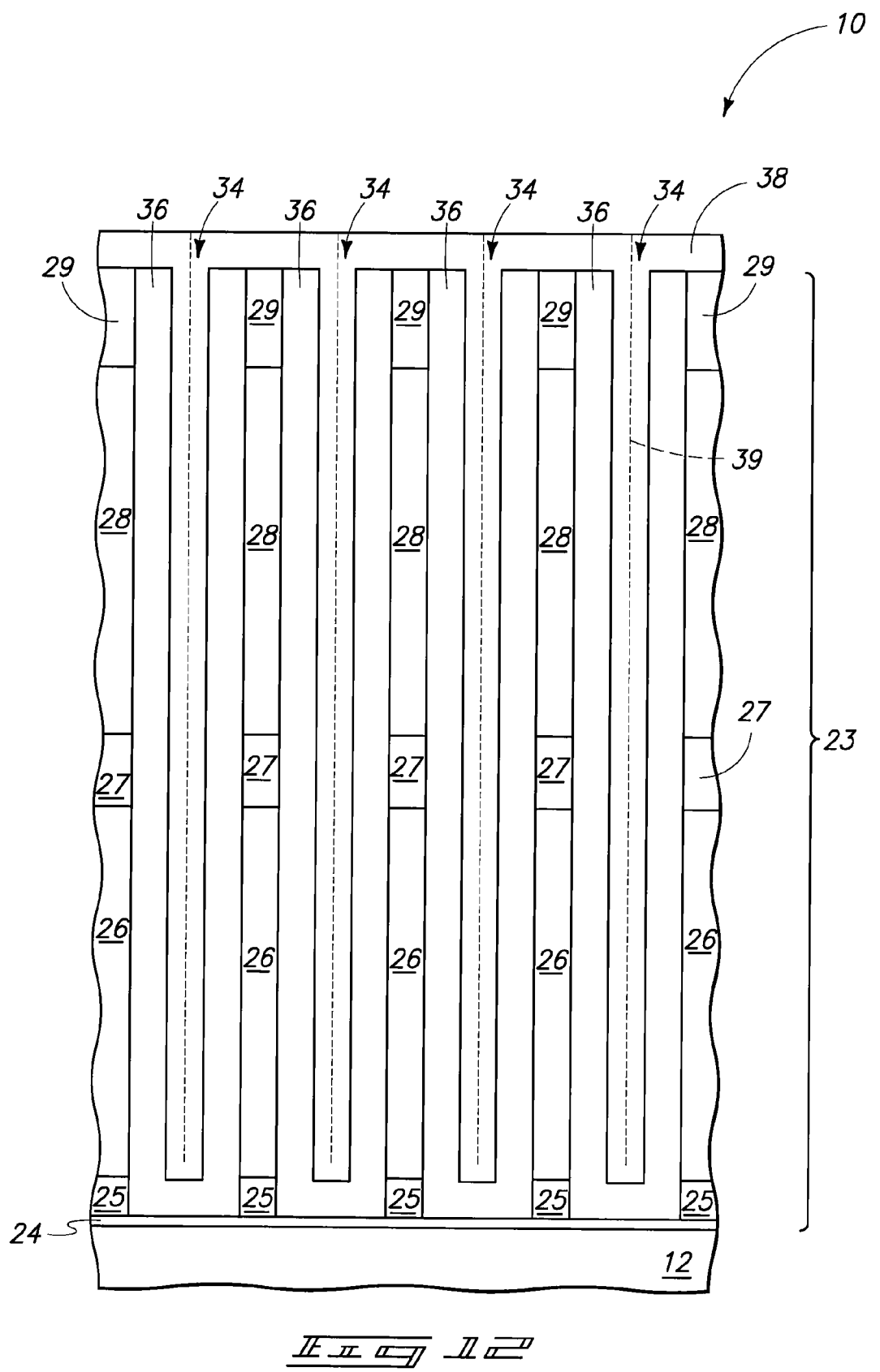
FIG. 12 is a section view taken through line 12-12 in FIG. 11.

Referring to FIGS. 8-10, material 37 (not shown) has been removed, and second material 38 has been formed to within first openings 34 adjacent masking material 36. An example second material 38 is undoped silicon dioxide, for example deposited using tetraethyl orthosilicate. Example seams 39 from such deposition may or may not form. In one embodiment and as shown, second material 38 is deposited to be received elevationally over first material 23, for example by a thickness of about 500 Angstroms. Alternately by way of example only, such might not be provided to be received elevationally over any of first masking material 23. Further as an alternative in such instance, deposition of material 37 as shown in FIGS. 6 and 7 might be eliminated, and substituted with deposition of example second material 38, followed by etch-back or planarize polishing of masking material 36 and second material 38 in a common etch-back or polishing step.

Further, a mask 40 has been formed as part of substrate 10. Mask 40 may be of the same composition as that of mask 30 described above. An array of second openings 42 has been formed as part of mask 40. Such are received partially over and partially offset from the array of first openings 34. Individual of second openings 42 are formed over at least two storage node contacts that are received under different and adjacent of first openings 34. In one embodiment, individual of the second openings are formed over four or less of the storage node contacts. In the depicted example embodiment, individual of second openings 42 are formed over four storage node contacts that are received under different and adjacent of first openings 34, with the overlapping portions of the first and second openings being received over the storage node contacts. In one embodiment, second openings 42 are individually quadrilateral in shape in at least one horizontal cross section, in one embodiment parallelogram in shape in at least one horizontal cross section, and in one embodiment rectangular in shape in at least one horizontal cross section as is shown. In one embodiment, first openings 34 and second openings 42 are all of the same size and shape in at least one horizontal cross section, and regardless of whether such size and shape in at least one horizontal cross section is quadrilateral. If quadrilateral, the first and second openings might individually comprise parallelogram shapes in at least one horizontal cross section independent of whether all are of the same size and shape, with first openings 34 and second openings 42 in the depicted embodiment being of the same size and shape and being rectangular in at least one horizontal cross section.

Figure 13:
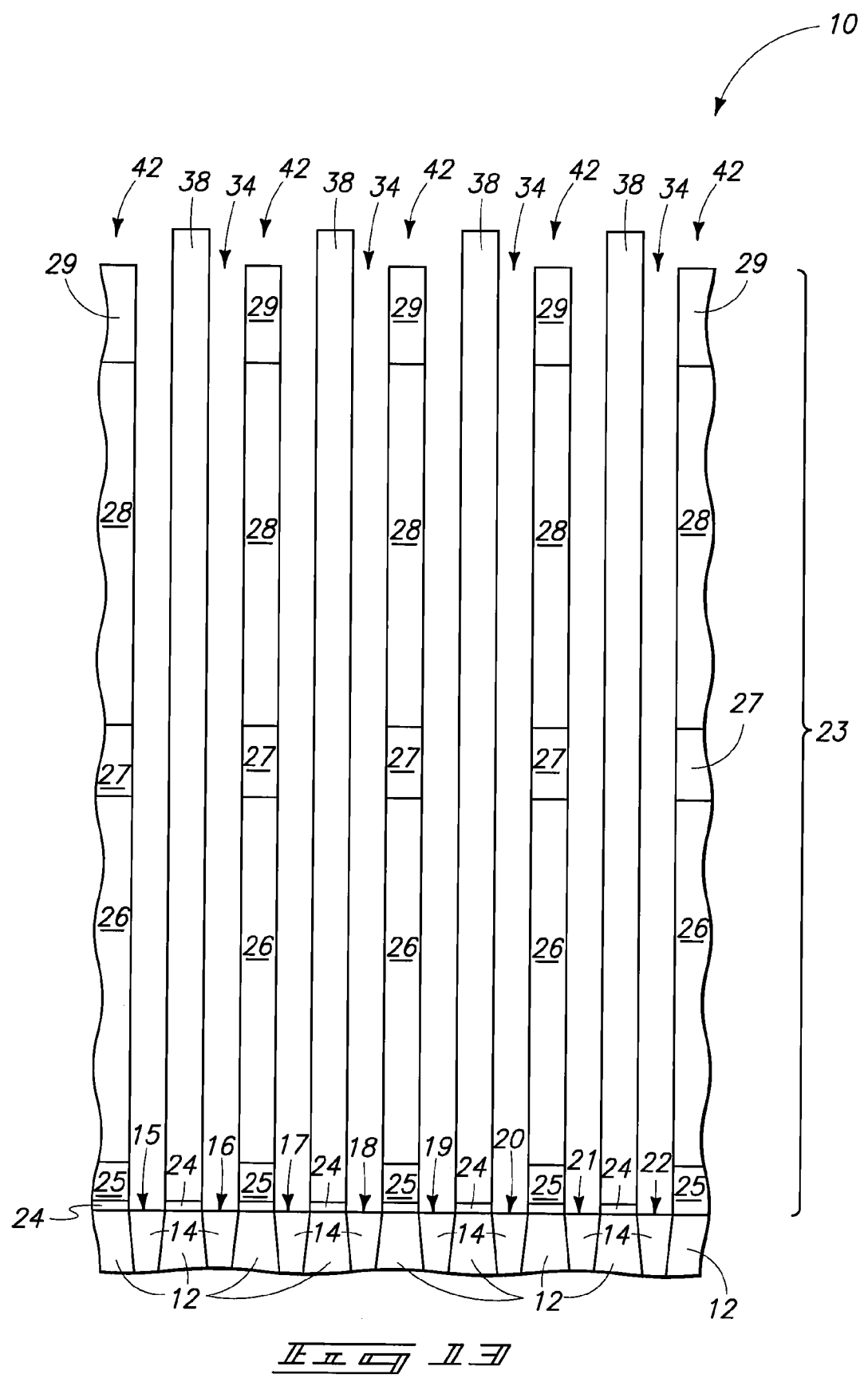
FIG. 13 is a section view taken through line 13-13 in FIG. 11.
Figure 14:
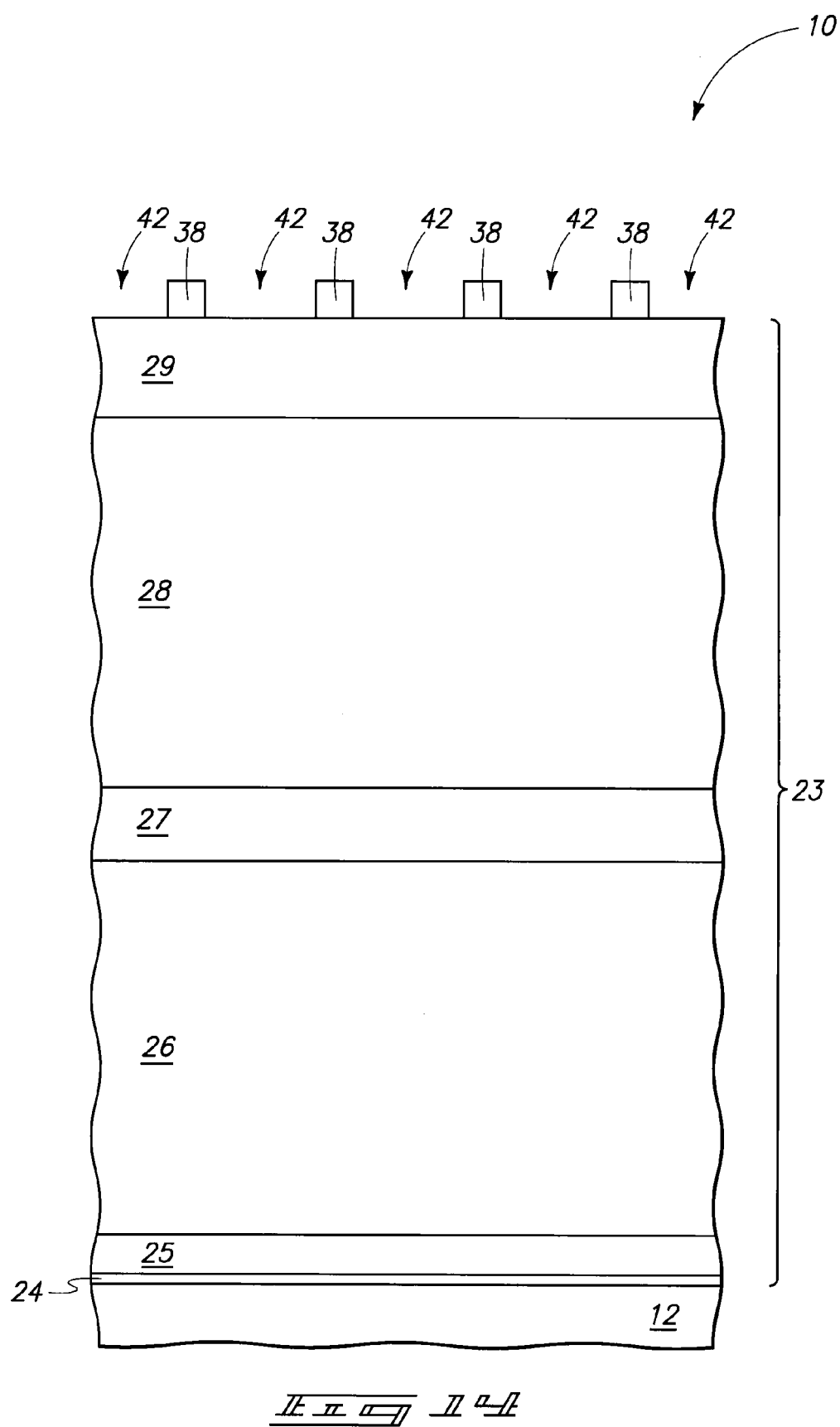
FIG. 14 is a section view taken through line 14-14 in FIG. 11.

Referring to FIGS. 11-14, masking material 36 has been etched through second openings 42 in mask 40 to remove masking material 36 from being received over the storage node contacts within first openings 34. Ideally, such etching is conducted selectively relative to second material 38 and first material 23. FIG. 13 also depicts removal of material 24 subsequent to etching of masking material 36 effective to expose the depicted array of storage node contacts. Further, FIGS. 11-14 depict material of mask 40 (not shown) outwardly of second material 38 as having been removed.

Figure 15:
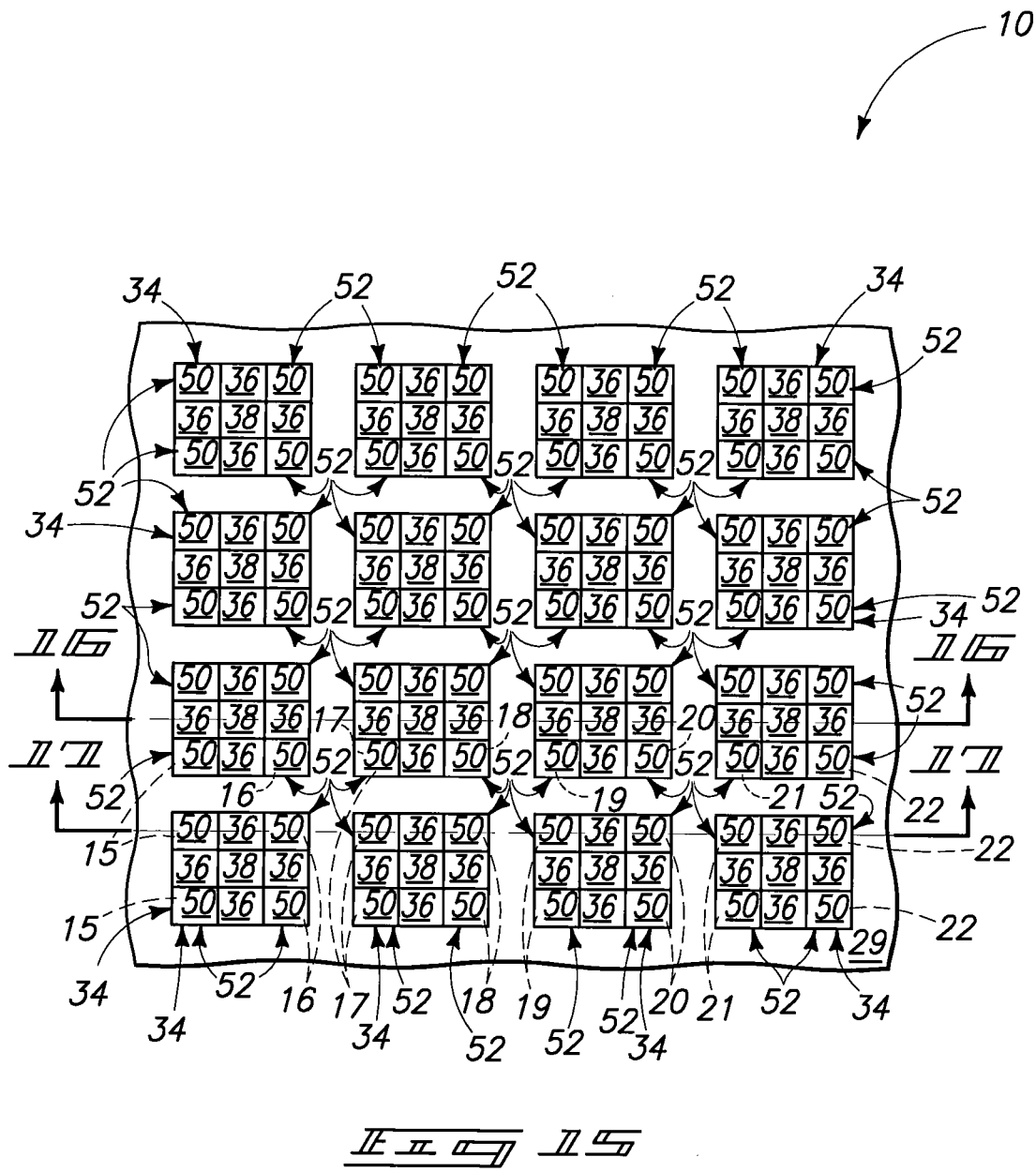
FIG. 15 is a diagrammatic top plan view of the substrate fragment of FIG. 11 at a processing step subsequent to that shown by FIG. 11.
Figure 16:
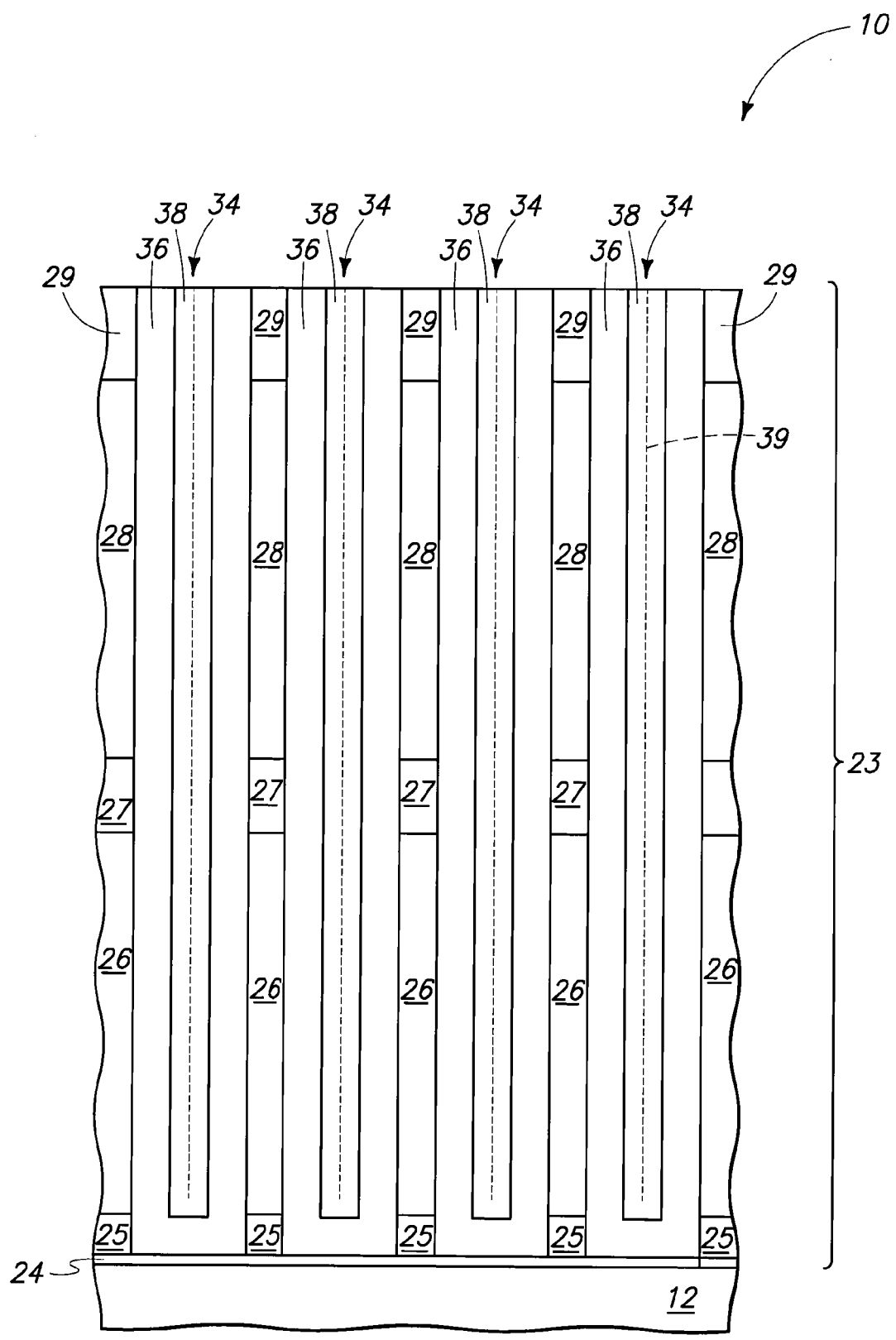
FIG. 16 is a section view taken through line 16-16 in FIG. 15.
Figure 17:
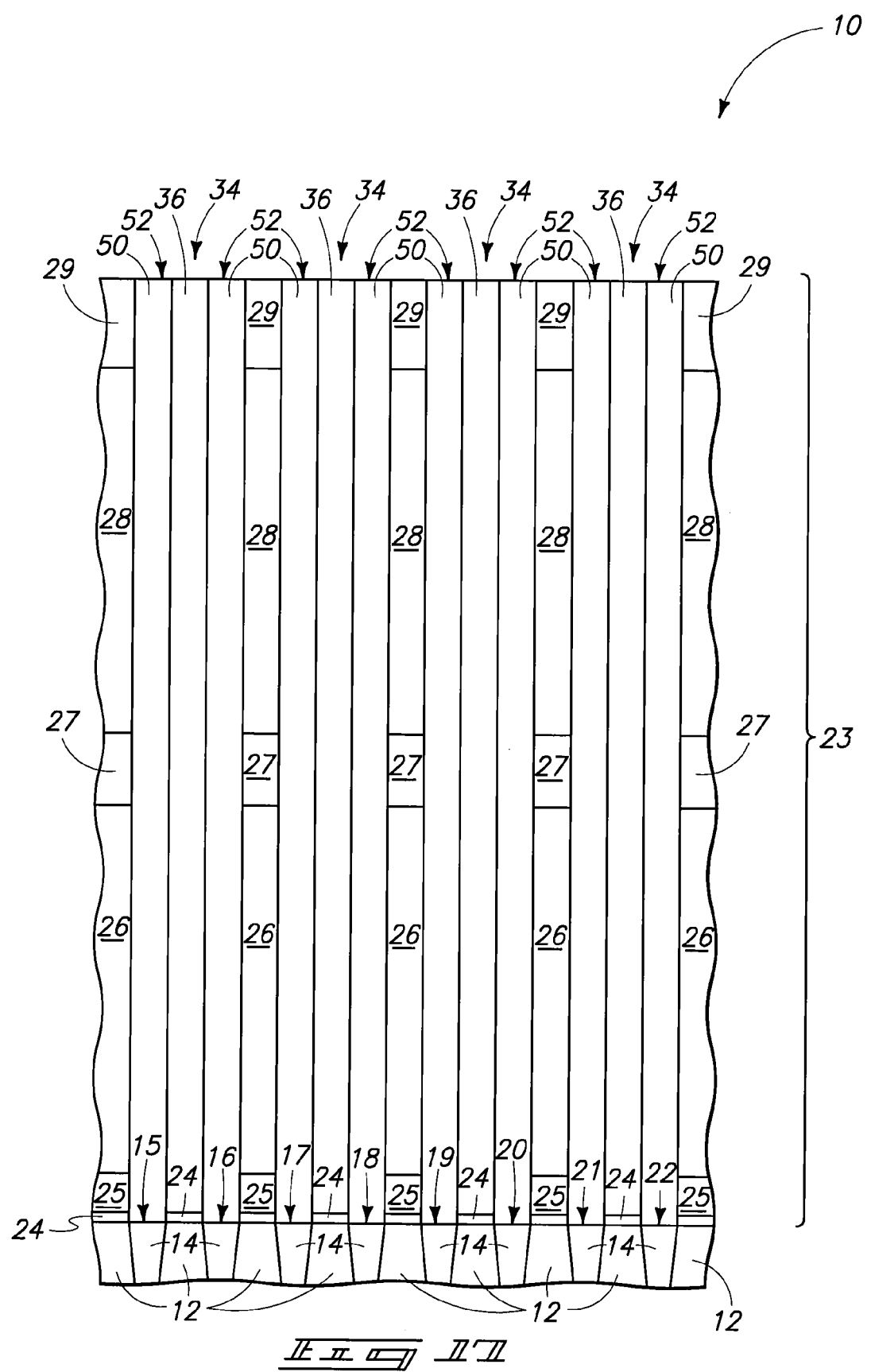
FIG. 17 is a section view taken through line 17-17 in FIG. 15.
Figure 18:
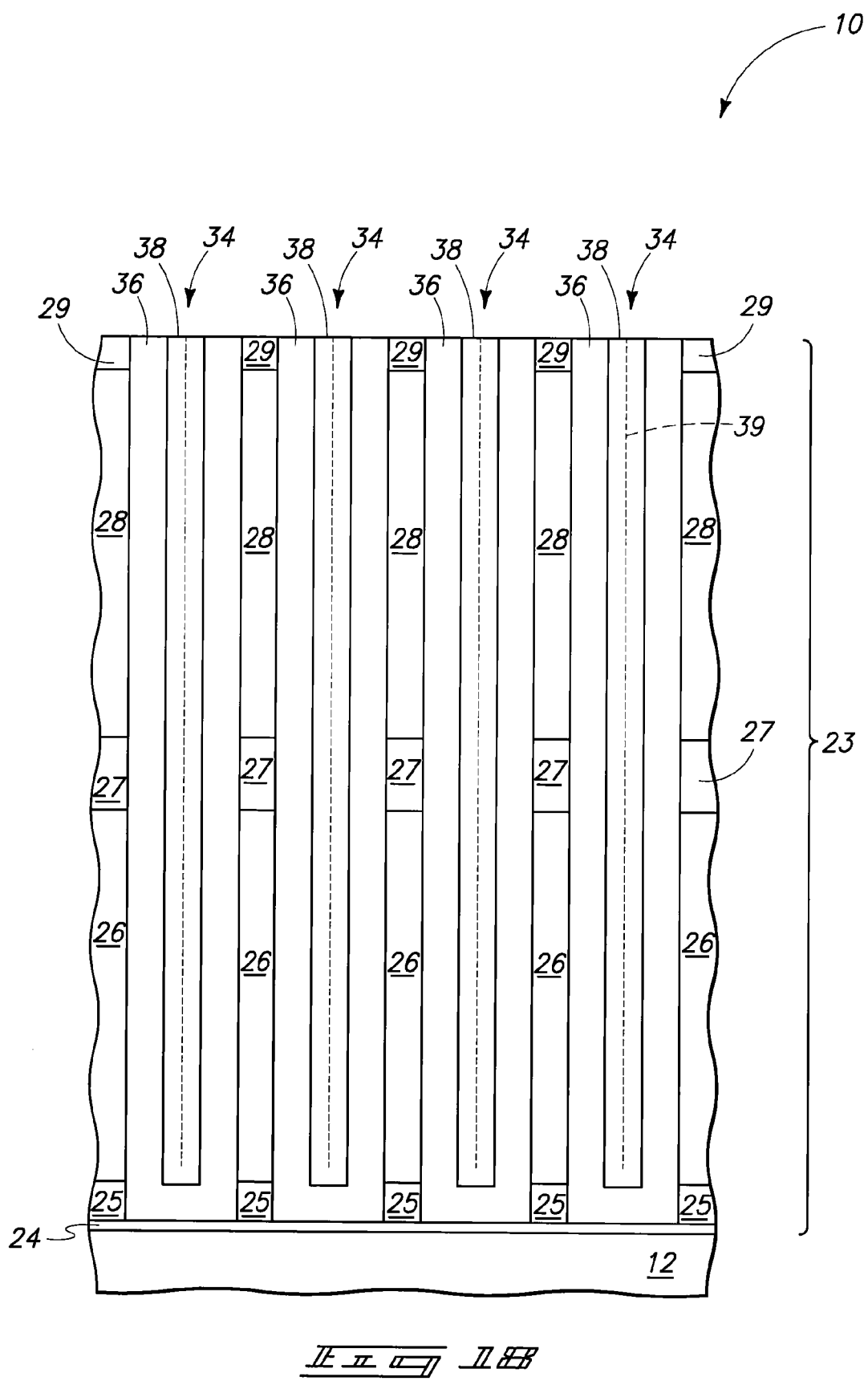
FIG. 18 is a view of the FIG. 16 substrate fragment subsequent to that shown by FIG. 16.
Figure 19:
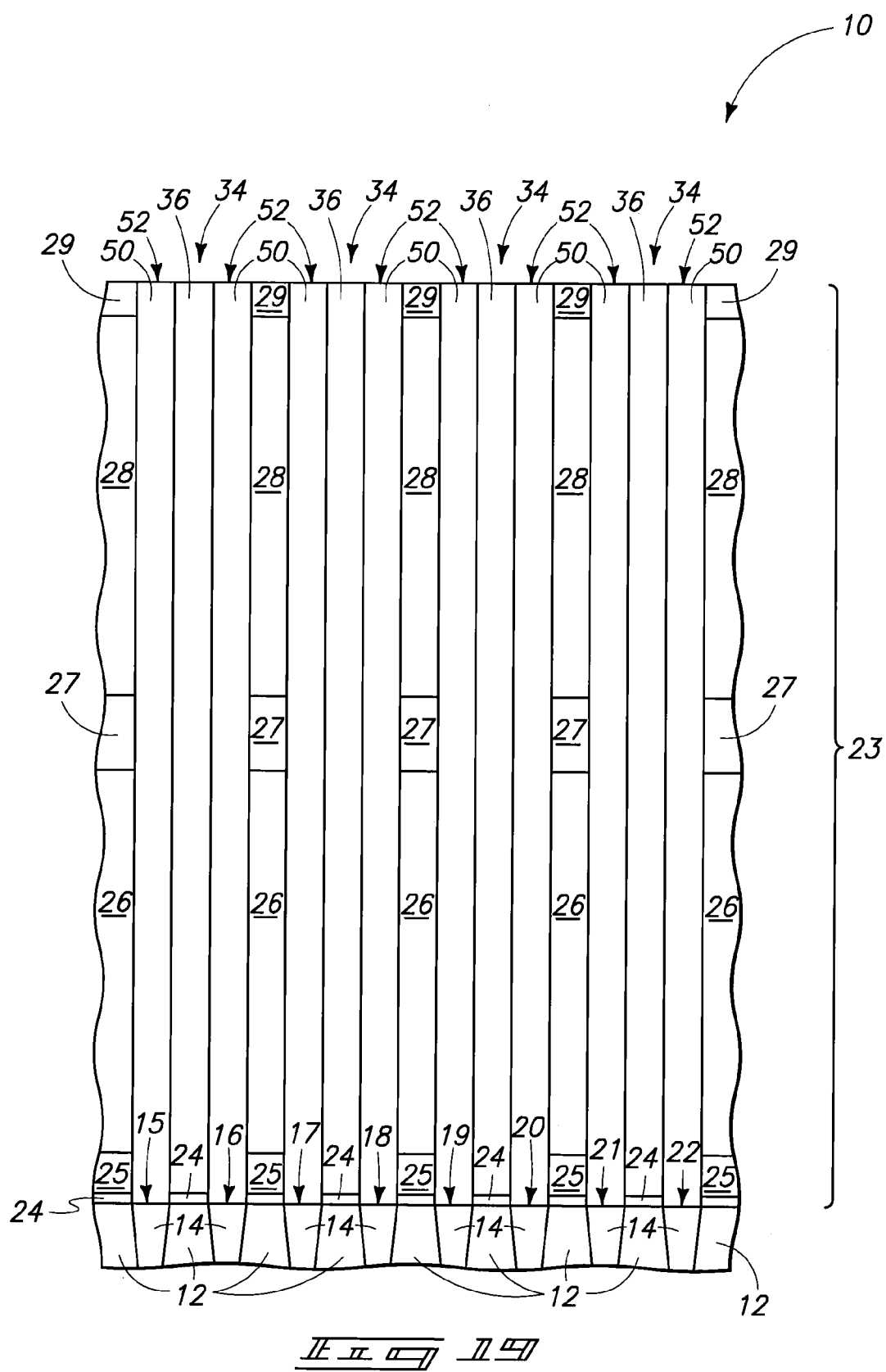
FIG. 19 is a view of the FIG. 17 substrate fragment subsequent to that shown by FIG. 17.
Figure 20:
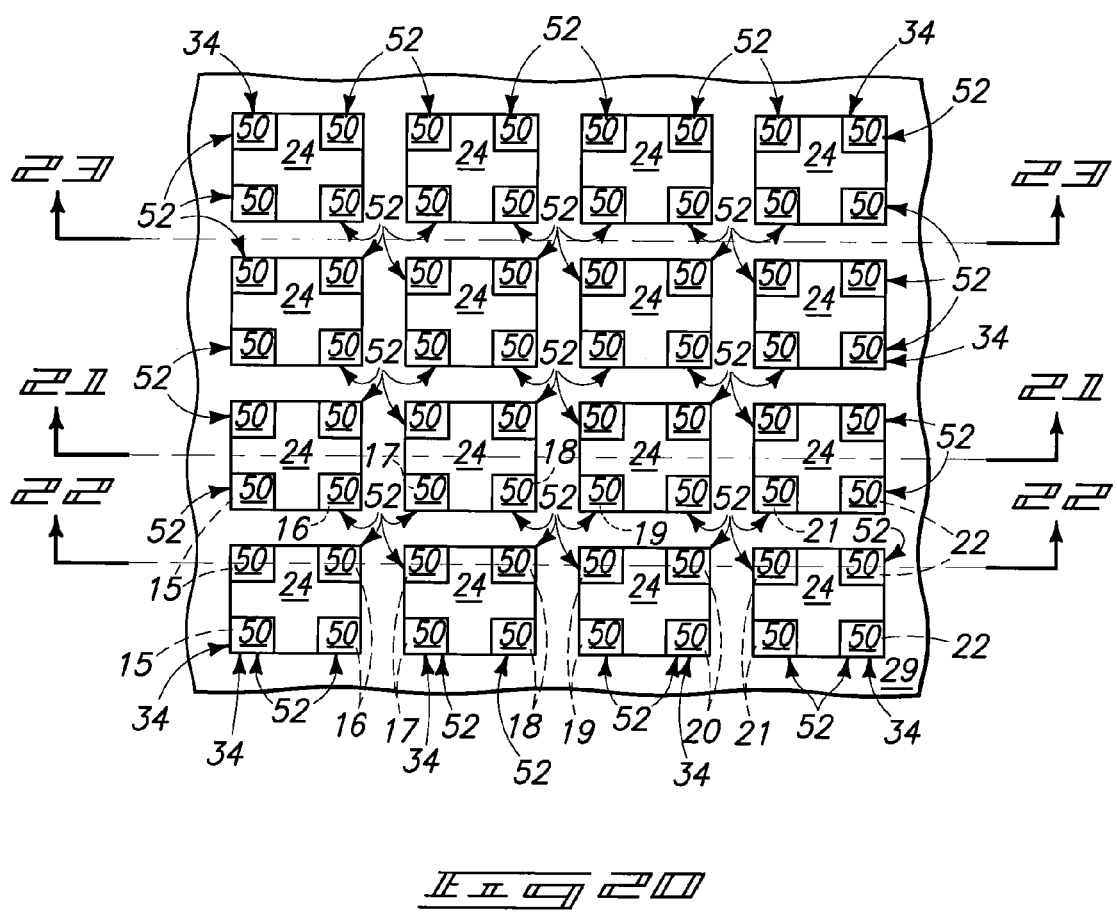
FIG. 20 is a diagrammatic top plan view of the substrate fragment of FIG. 15 at a processing step subsequent to that shown by FIGS. 18 and 19.
Figure 21:
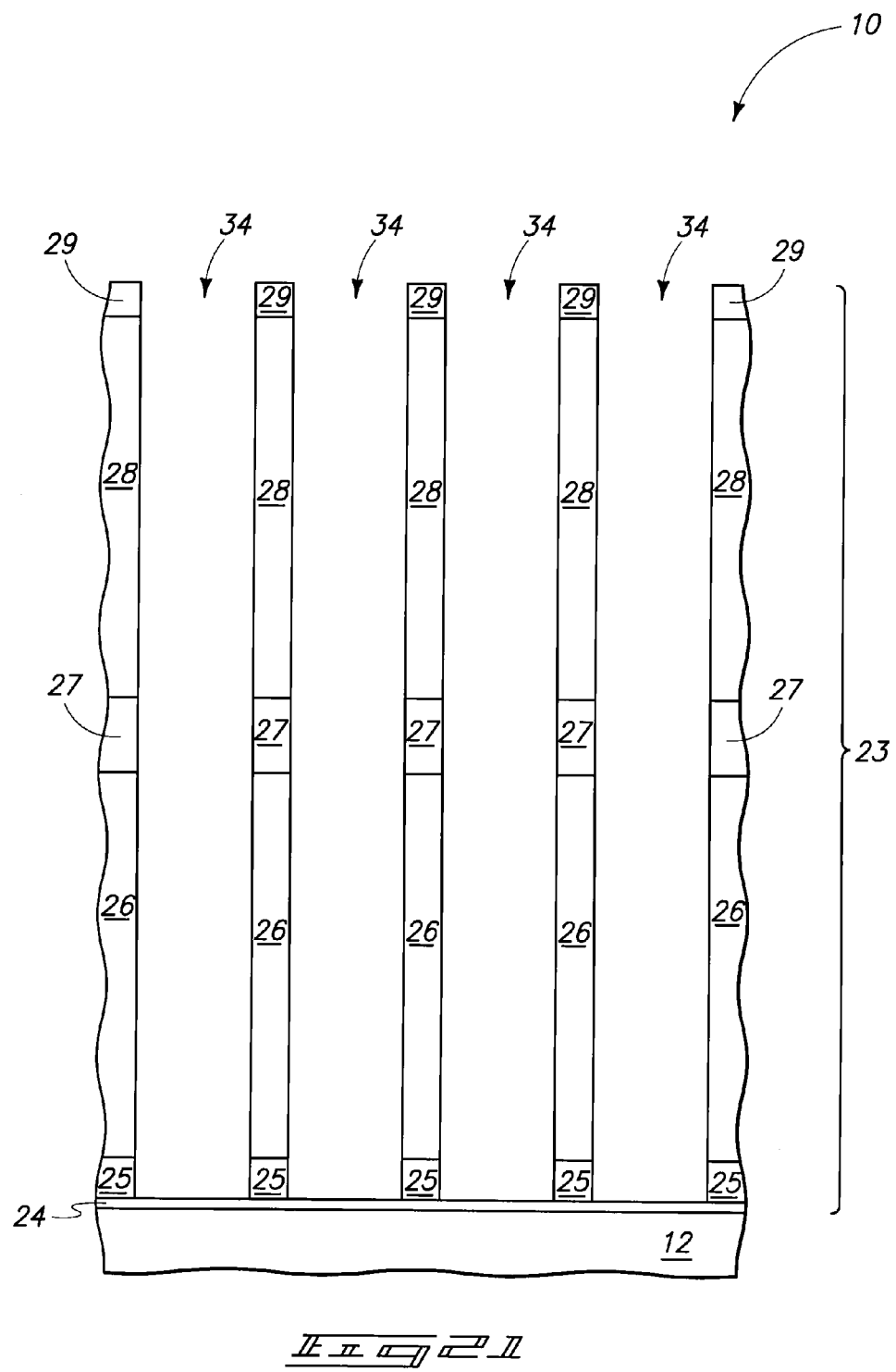
FIG. 21 is a section view taken through line 21-21 in FIG. 20.
Figure 22:
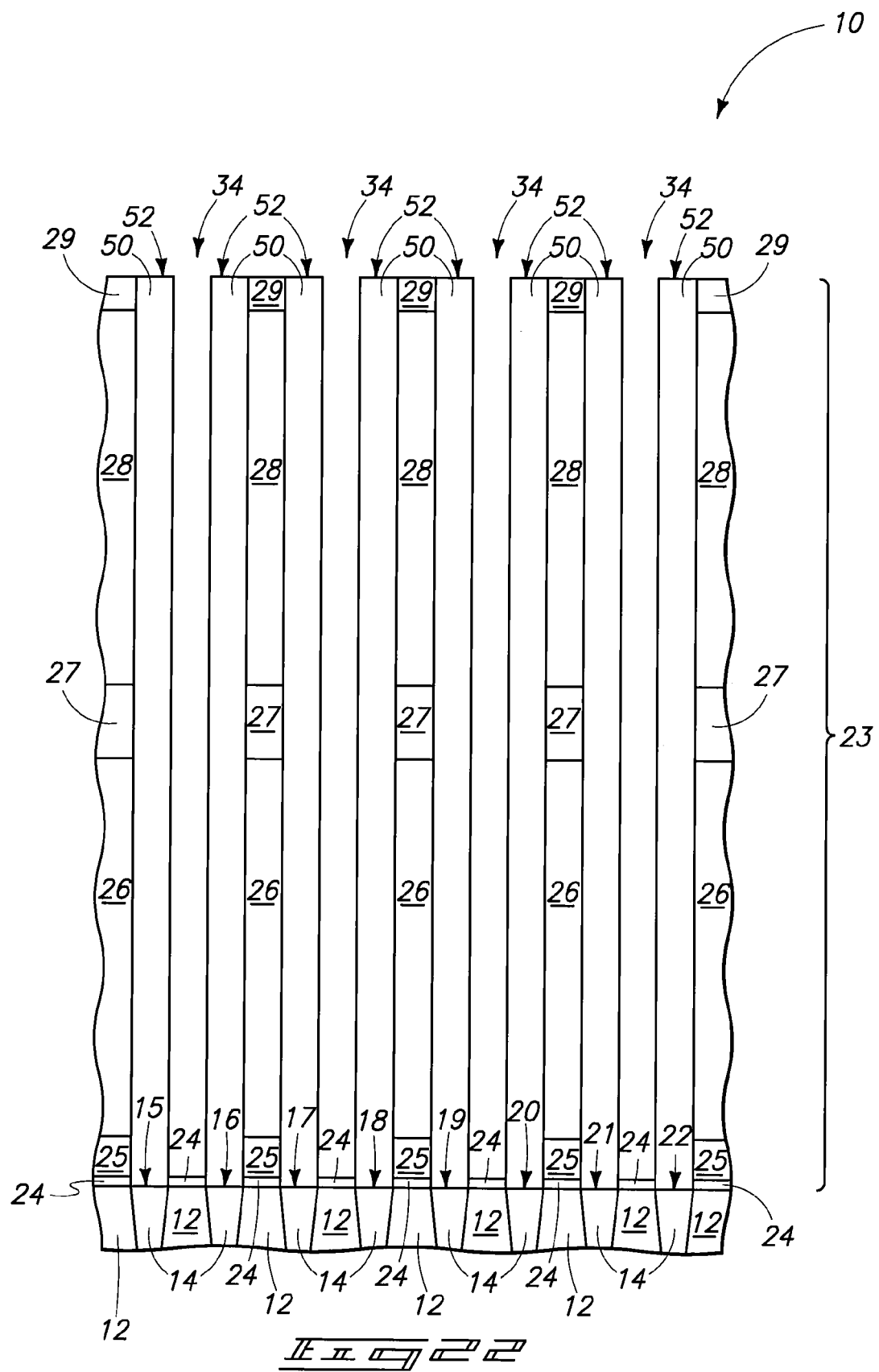
FIG. 22 is a section view taken through line 22-22 in FIG. 20.
Figure 23:
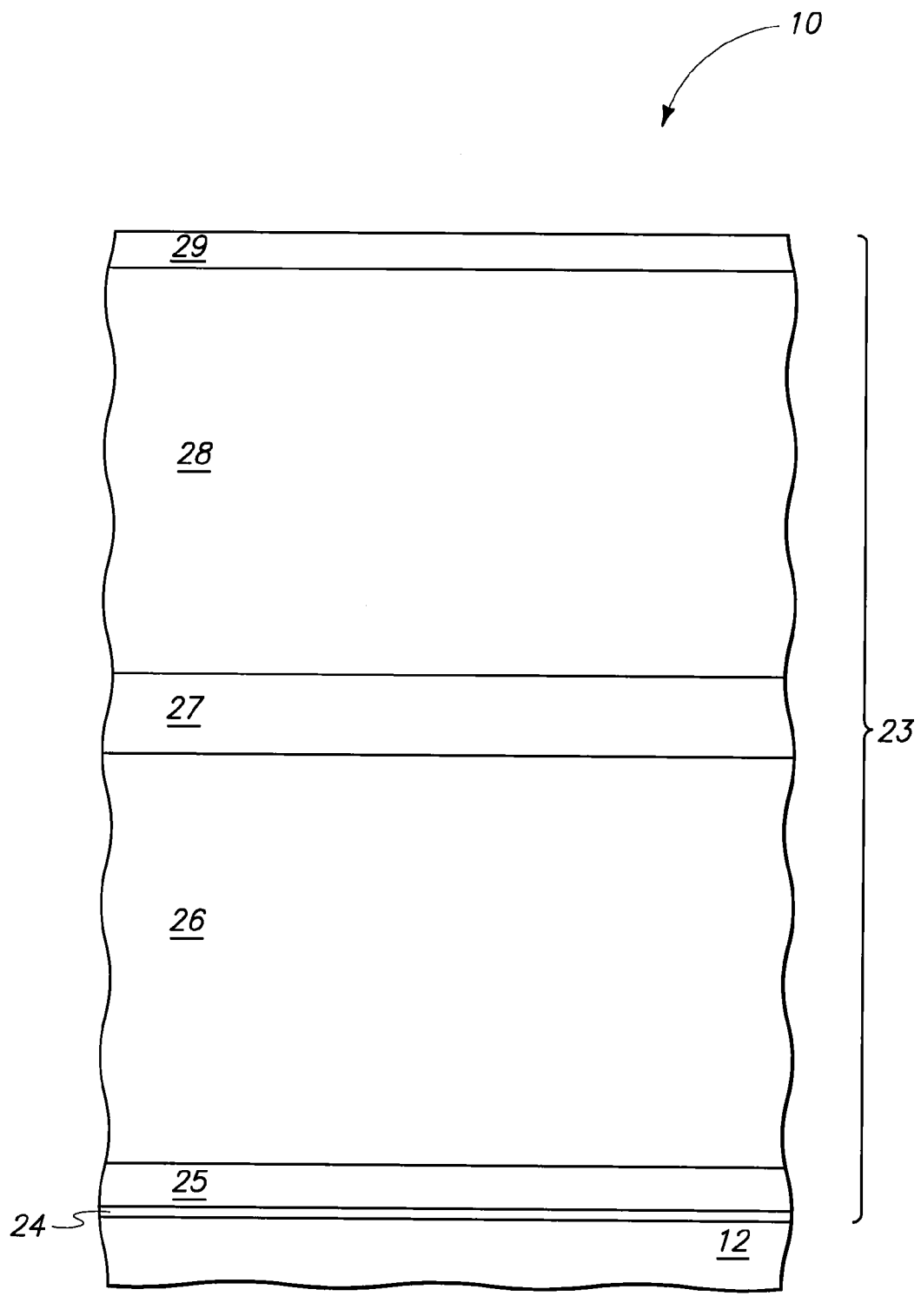
FIG. 23 is a section view taken through line 23-23 in FIG. 20.
Figure 24:
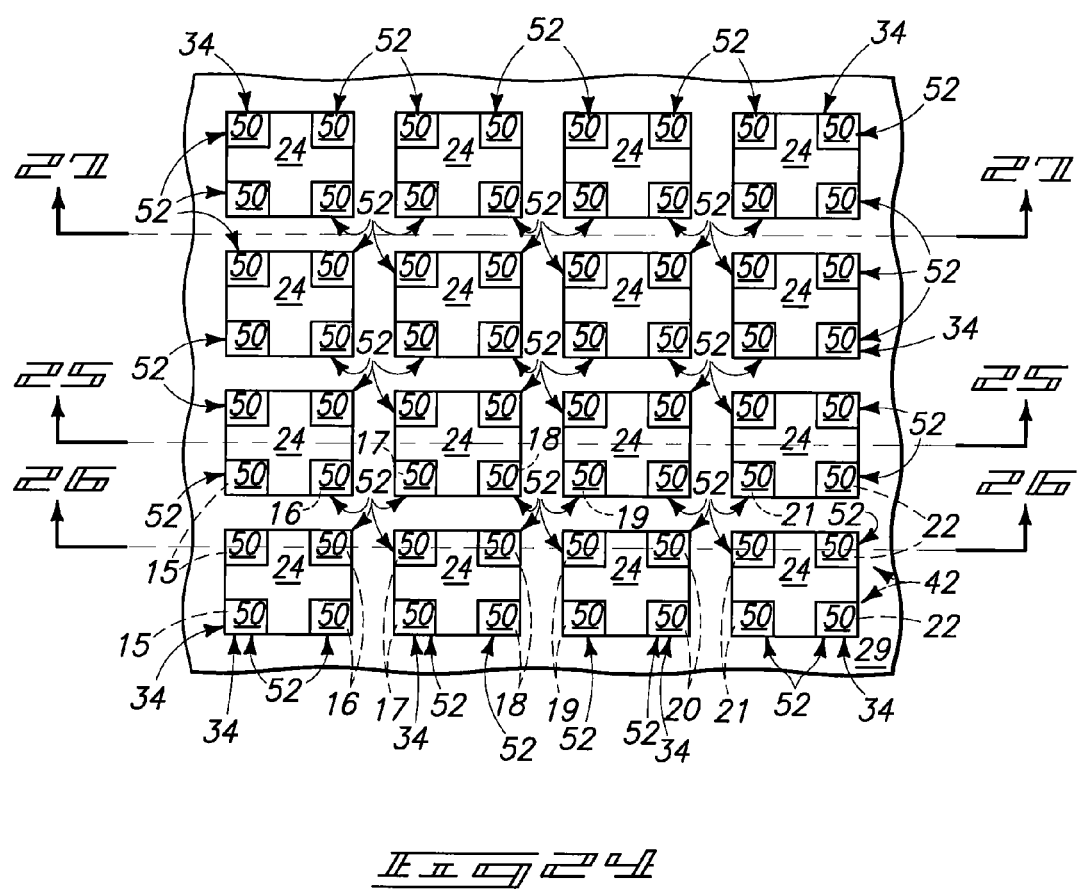
FIG. 24 is a diagrammatic top plan view of the substrate fragment of FIG. 20 at a processing step subsequent to that shown by FIG. 20.
Figure 25:
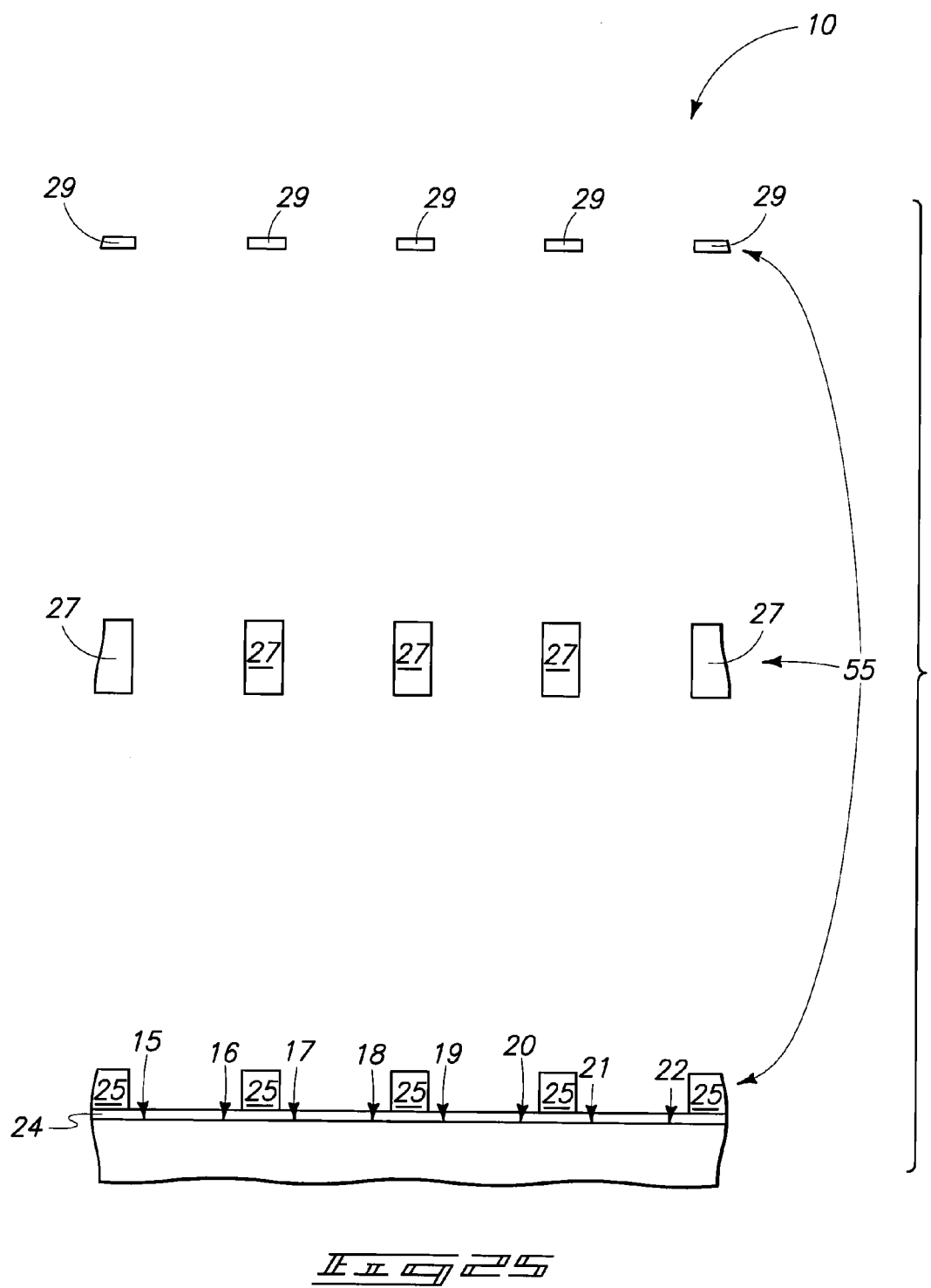
FIG. 25 is a section view taken through line 25-25 in FIG. 24.
Figure 26:
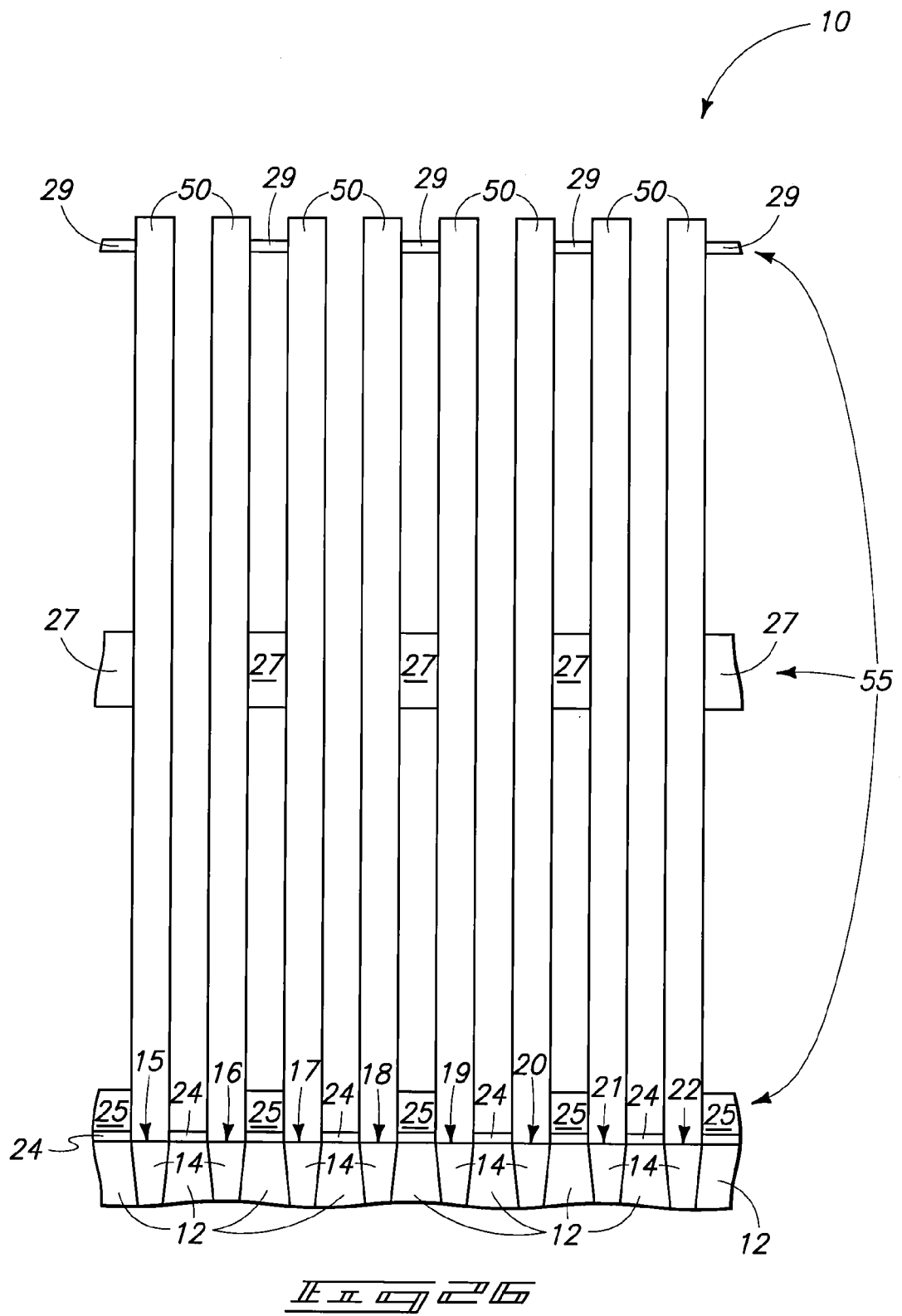
FIG. 26 is a section view taken through line 26-26 in FIG. 24.
Figure 27:
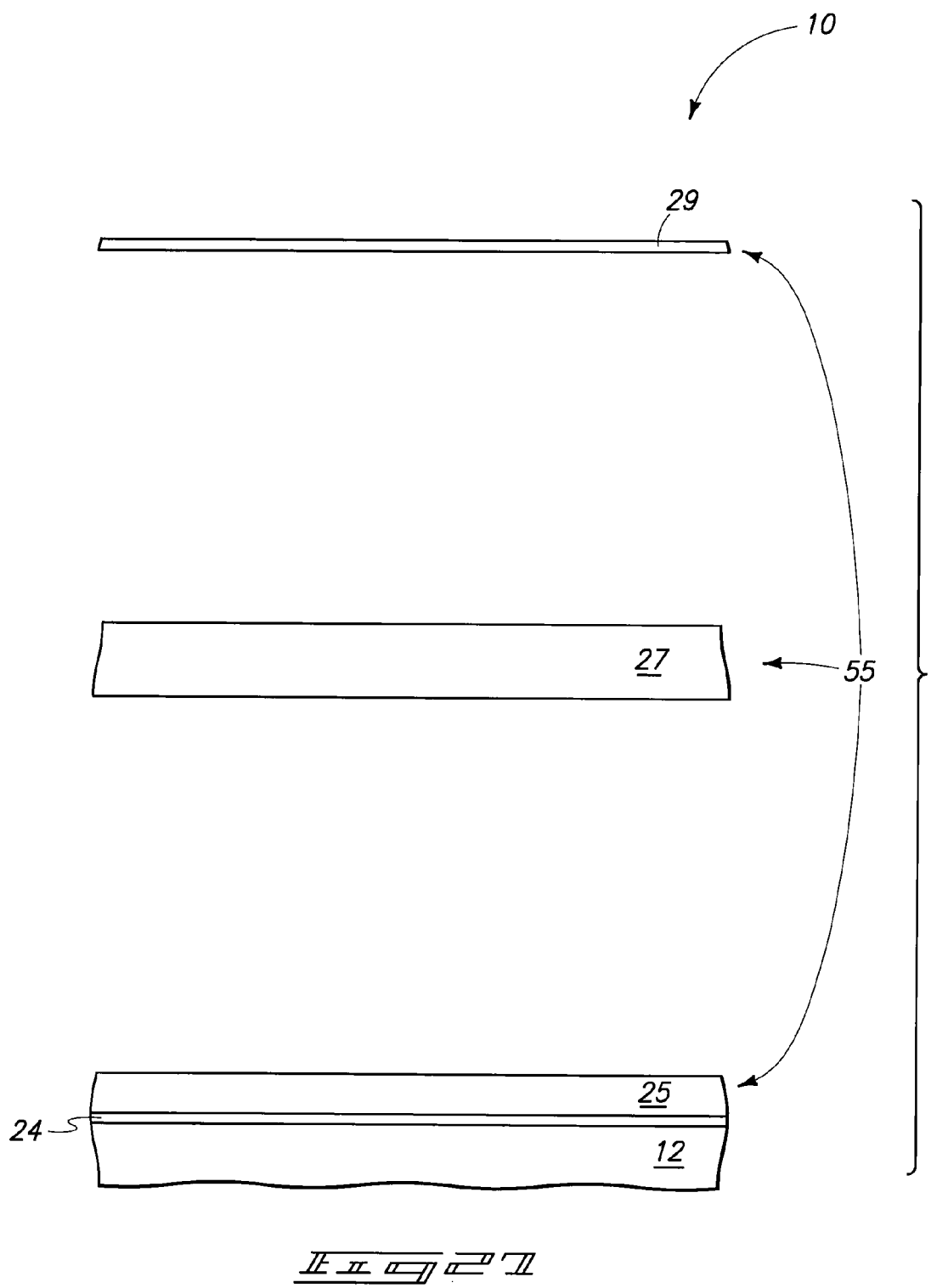
FIG. 27 is a section view taken through line 27-27 in FIG. 24.
Figure 28:
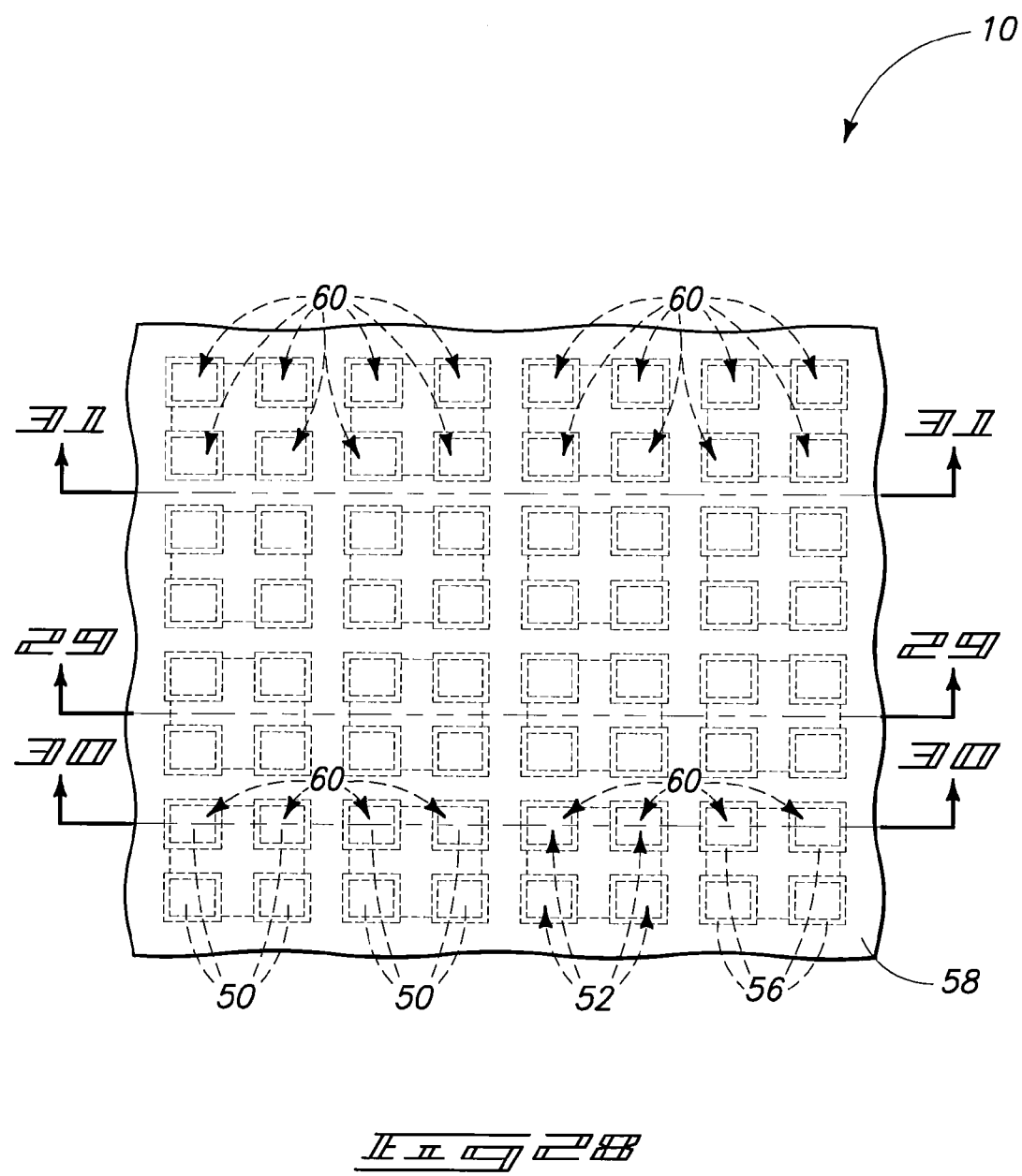
FIG. 28 is a diagrammatic top plan view of the substrate fragment of FIG. 24 at a processing step subsequent to that shown by FIG. 24.
Figure 29:
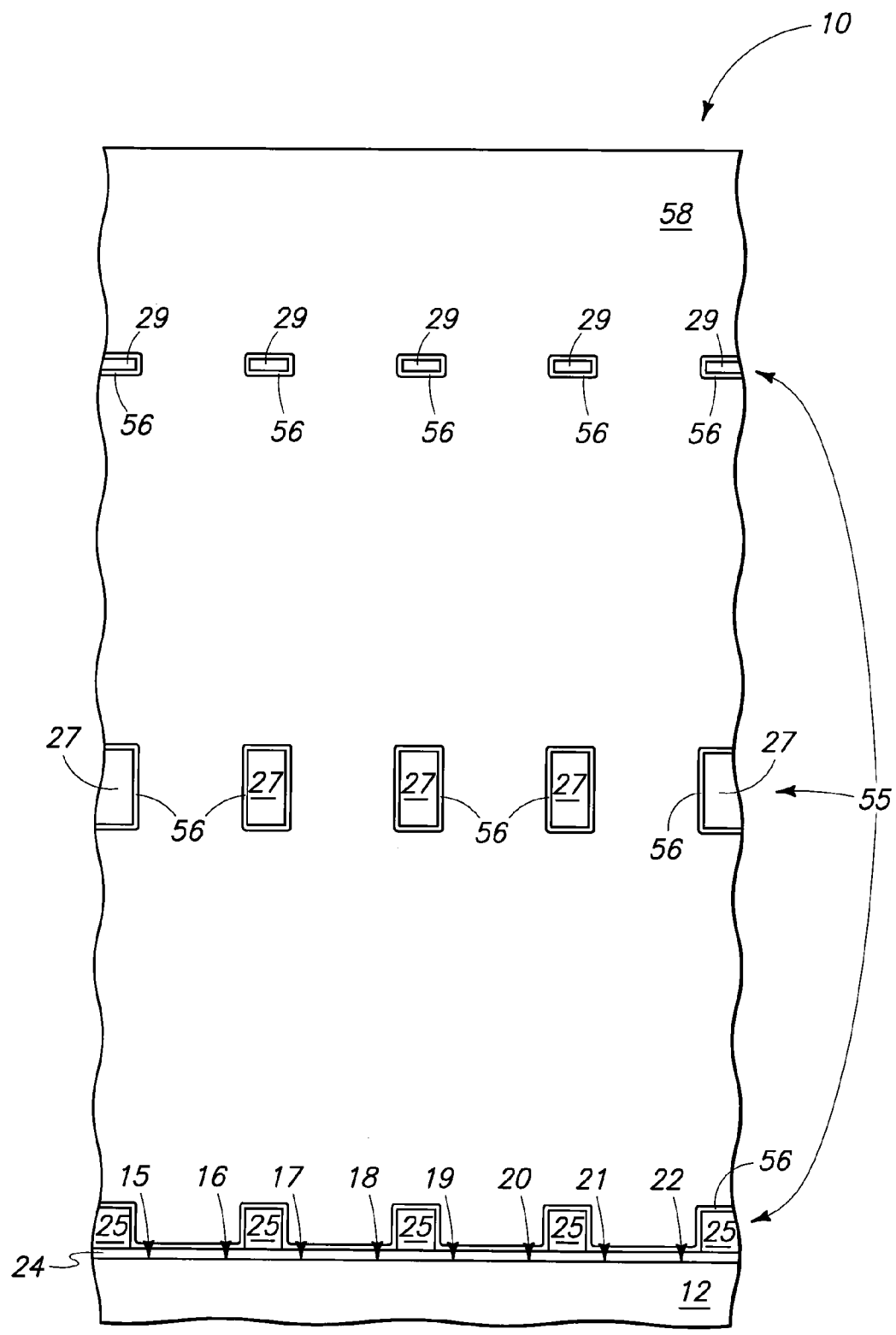
FIG. 29 is a section view taken through line 29-29 in FIG. 28.
Figure 30:
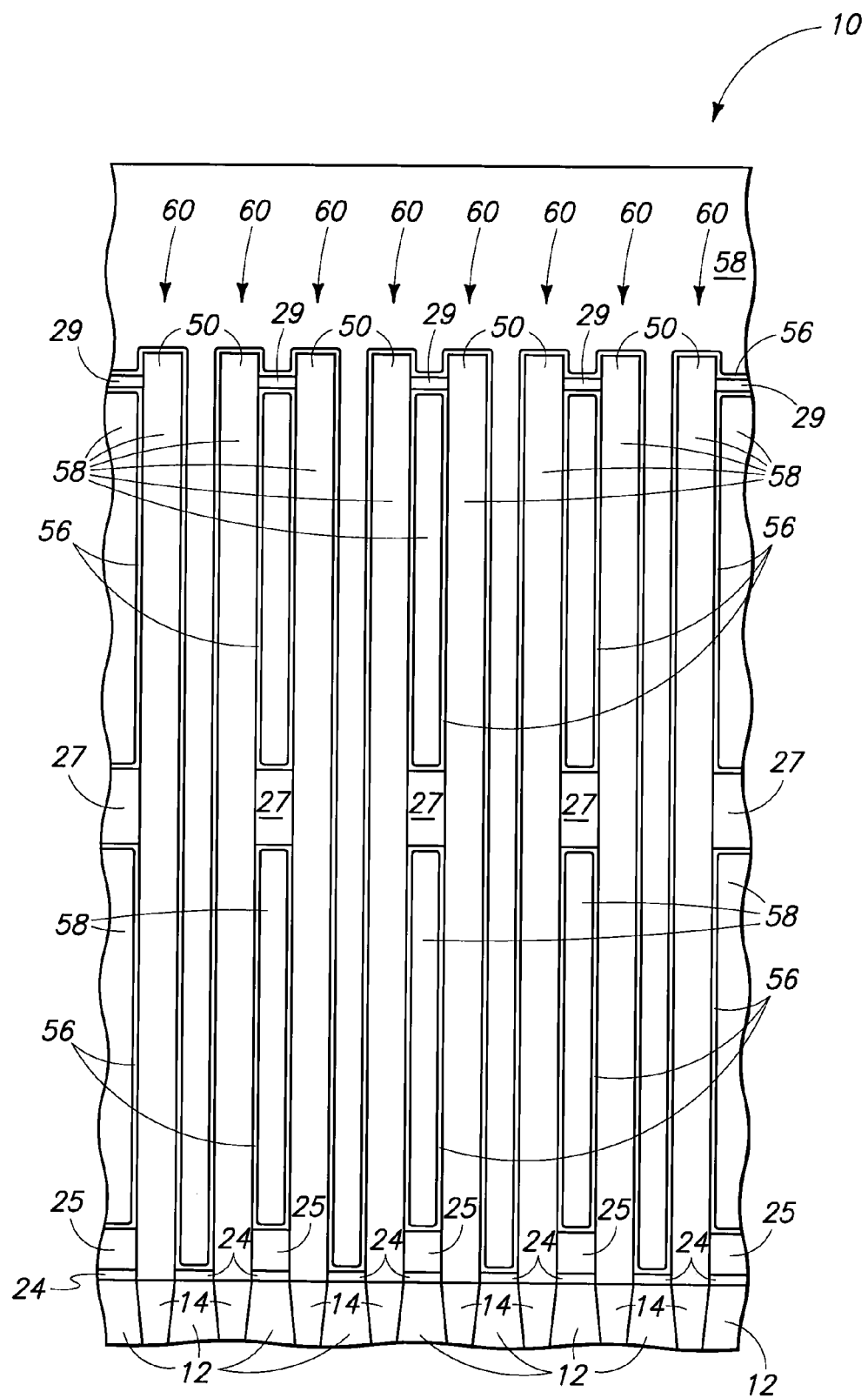
FIG. 30 is a section view taken through line 30-30 in FIG. 28.
Figure 31:
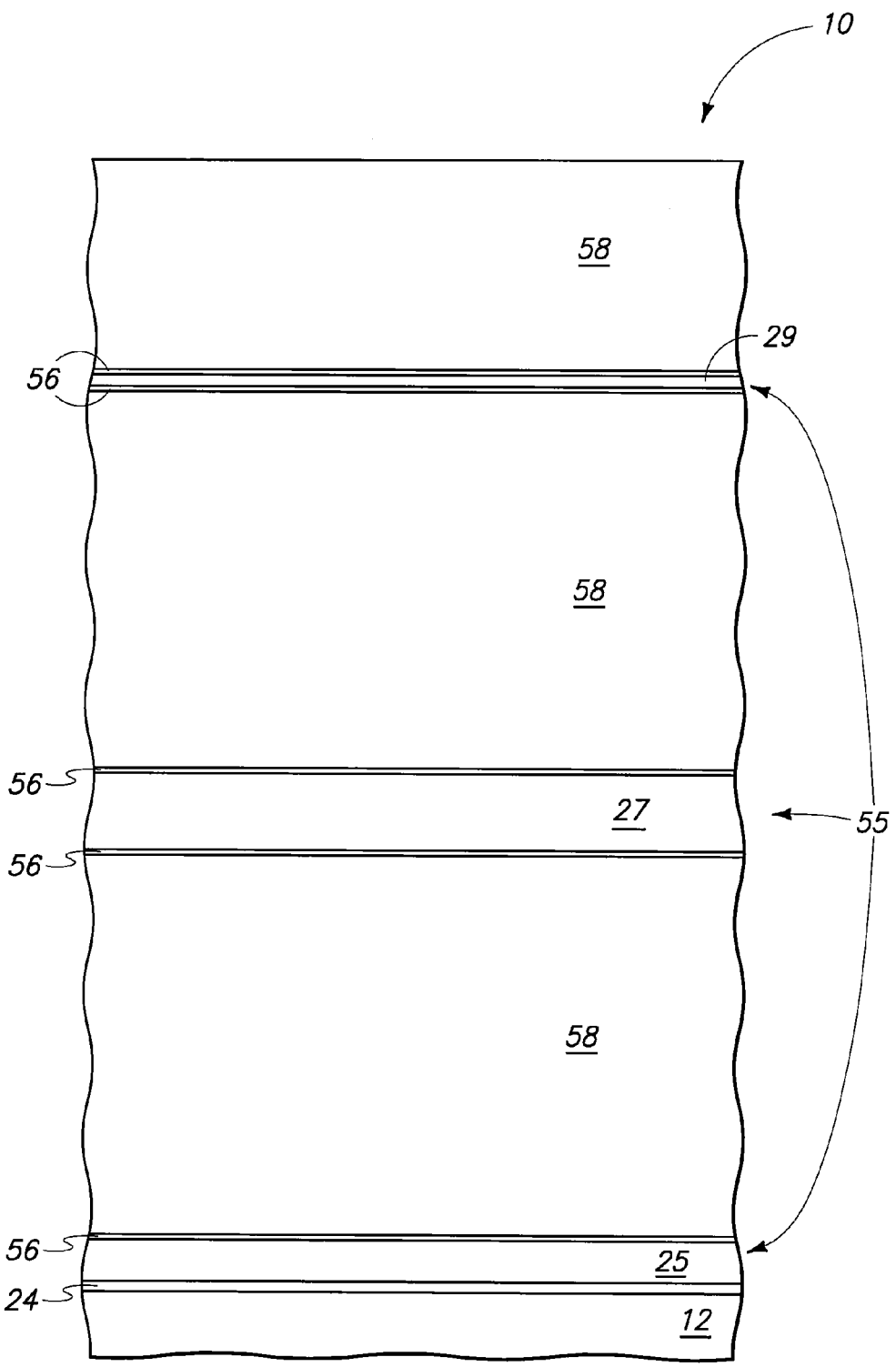
FIG. 31 is a section view taken through line 31-31 in FIG. 28.

Referring to FIGS. 15-17, conductive material 50 has been formed within first openings 34 in electrical connection with the respective storage node contacts, and comprise individual capacitor electrodes 52. By way of example only, an example material is titanium nitride. More than one conductive material might, of course, also be utilized, as well as materials other than titanium nitride. The depicted conductive material 50 has been etched back at least to first material 23 to form isolated individual capacitor electrodes 52. Such may also etch some of first material 23. FIGS. 18 and 19 depict some subsequent removal of first masking material 23, and particularly some of material 29, to provide a more planar outer surface configuration relative material 29, if desired.

Individual capacitor electrodes 52 are ultimately incorporated into a plurality of capacitors. Such may comprise etching some or all of remaining of masking material 36 and/or some or all remaining of second material 38 from first openings 34. For example and with reference to FIGS. 20-23, such depict etching of all remaining of masking material 36 (not shown) from first openings 34, and etching of all remaining of second material 38 (not shown) from first openings 34.

In one embodiment, some form of a lattice retaining structure might be formed to be received externally among the individual capacitor electrodes. For example and by way of example only, FIGS. 24-27 depict but one example manner by which such a lattice retaining structure might be formed. Specifically, second etchably different material 26, 28 (not shown) has been etched selectively relative to first etchably different material 25, 27 and 29, thereby forming a lattice retaining structure 55 comprised of first etchably different material 25, 27, 29 that is received externally among individual capacitor electrodes 52.

Figure 32:
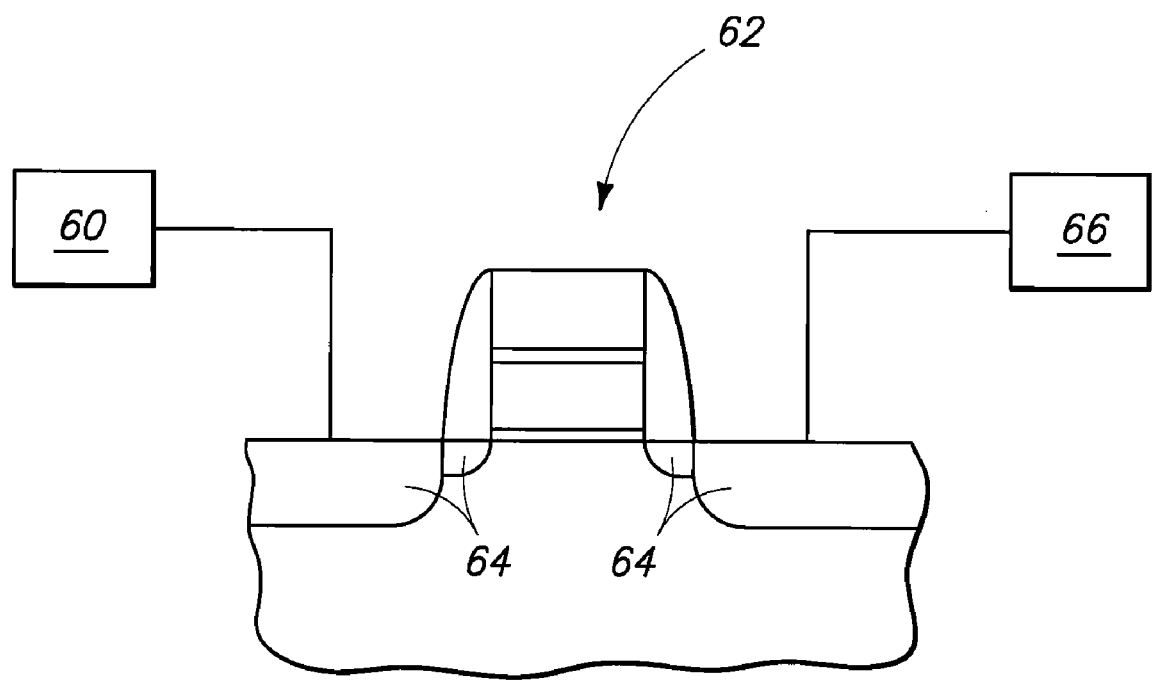
FIG. 32 is a diagrammatic view of a DRAM cell.
Figure 33:
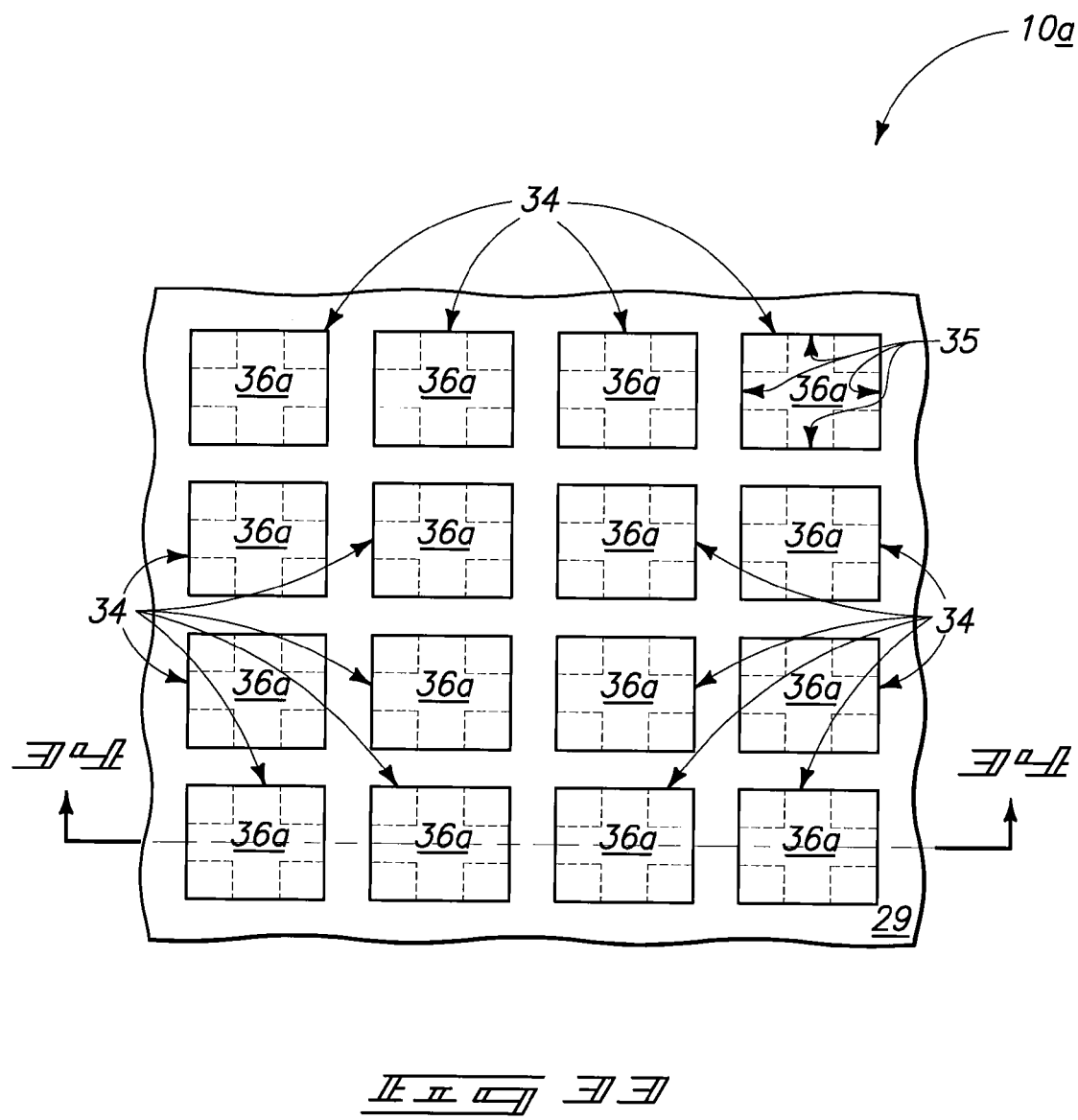
FIG. 33 is a diagrammatic top plan view of an alternate embodiment substrate fragment in process in accordance with an embodiment of the invention.
Figure 34:
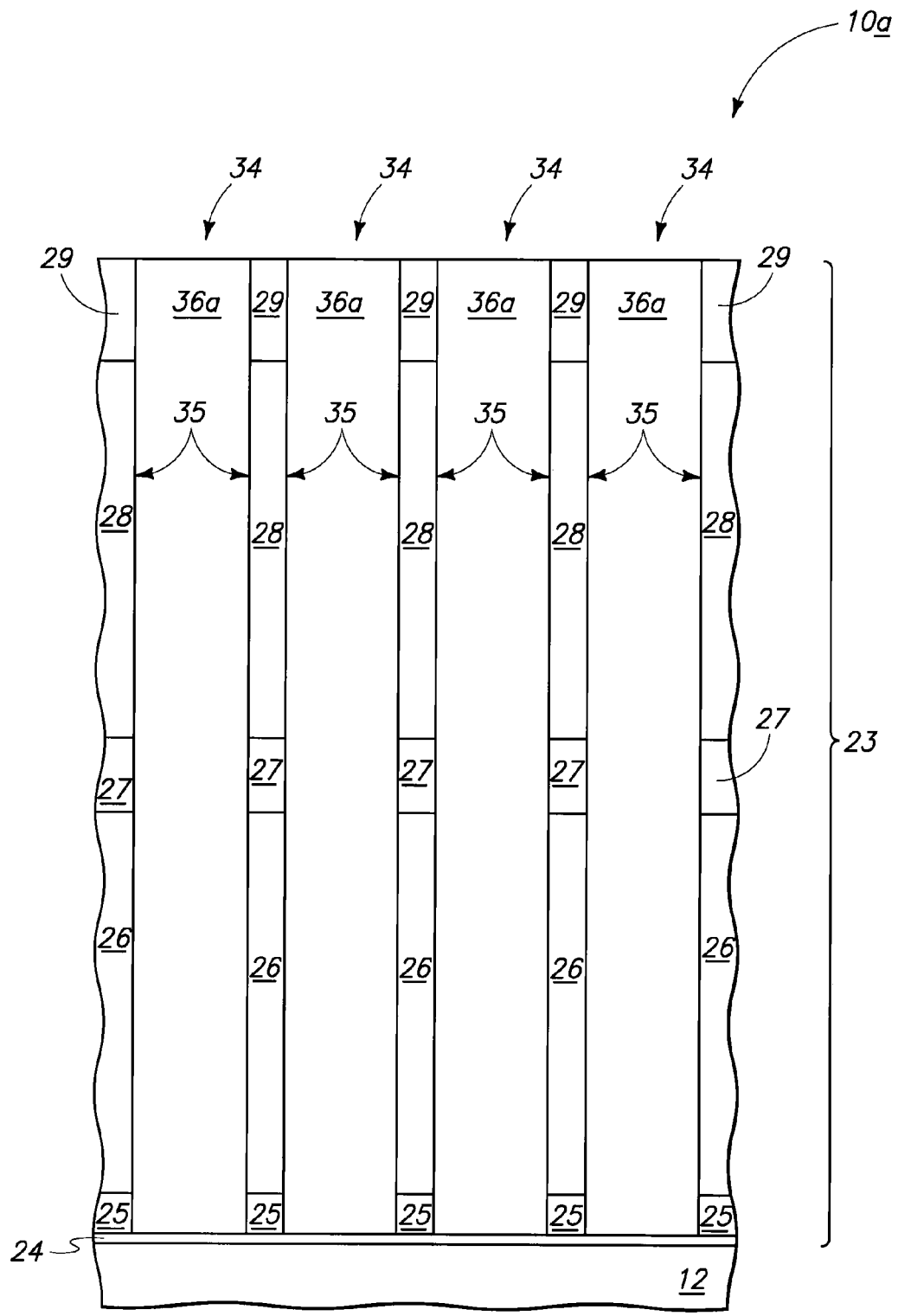
FIG. 34 is a section view taken through line 34-34 in FIG. 33.
Figure 35:
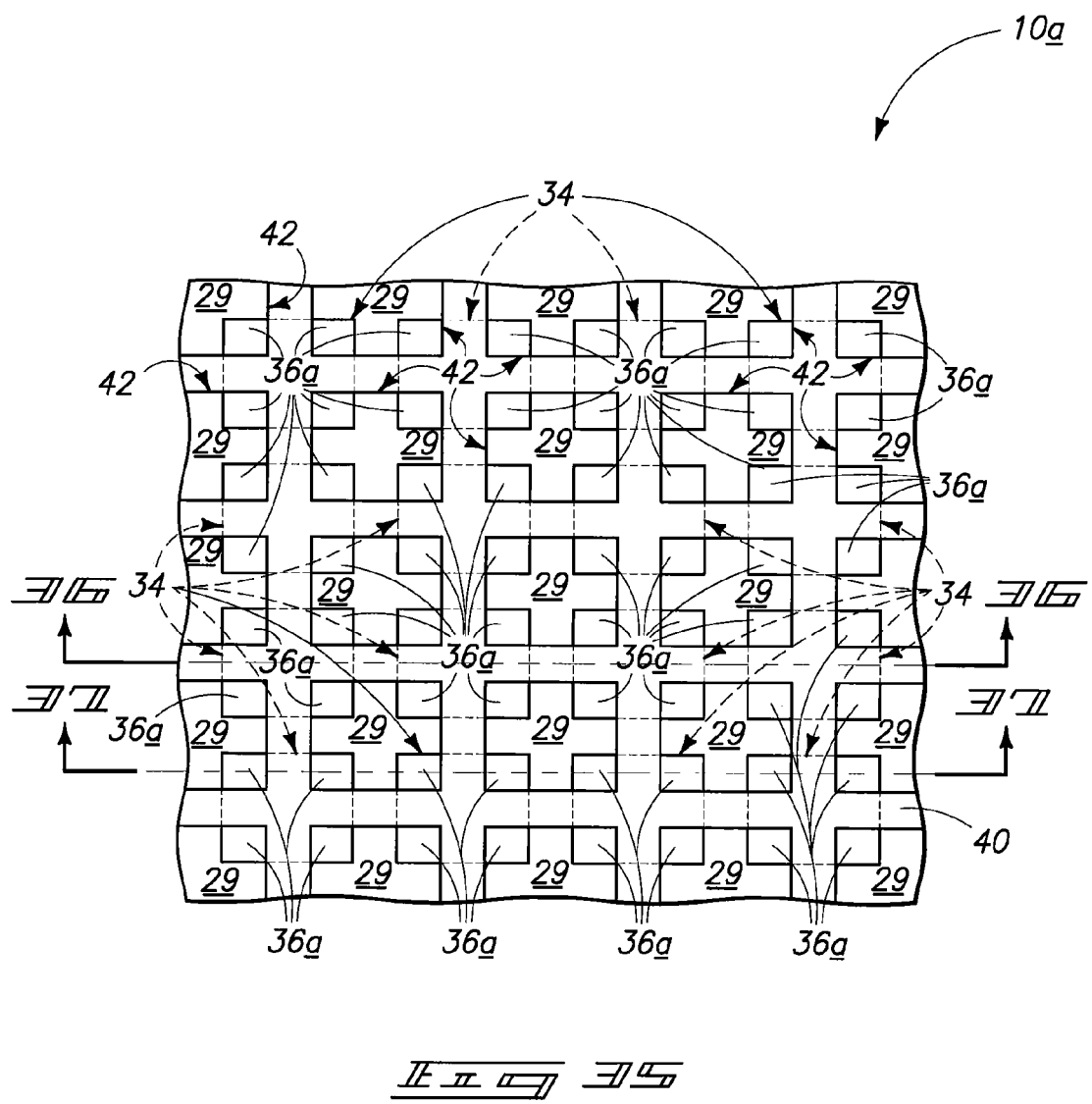
FIG. 35 is a diagrammatic top plan view of the substrate fragment of FIG. 33 at a processing step subsequent to that shown by FIG. 33.
Figure 36:
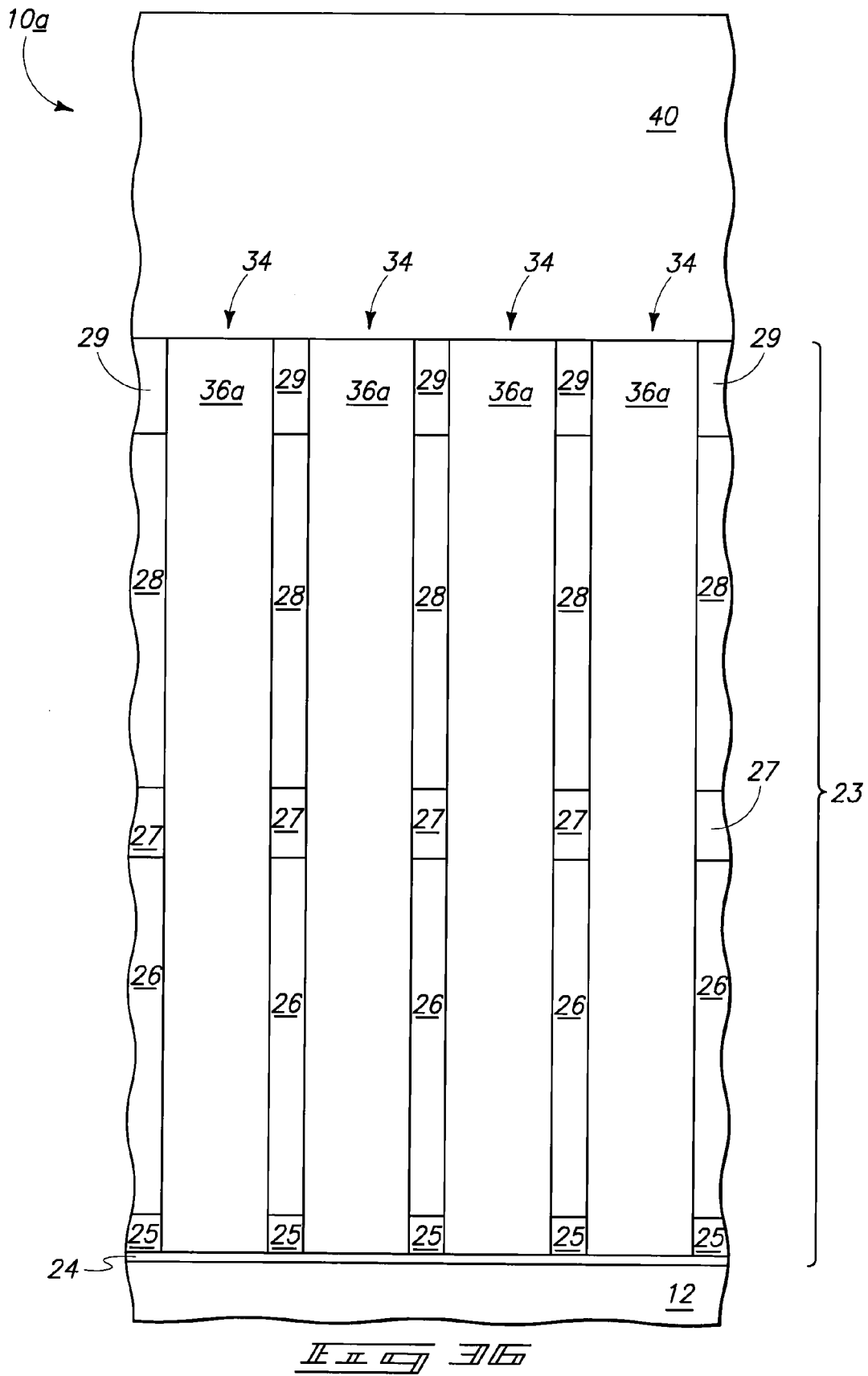
FIG. 36 is a section view taken through line 36-36 in FIG. 35.
Figure 37:
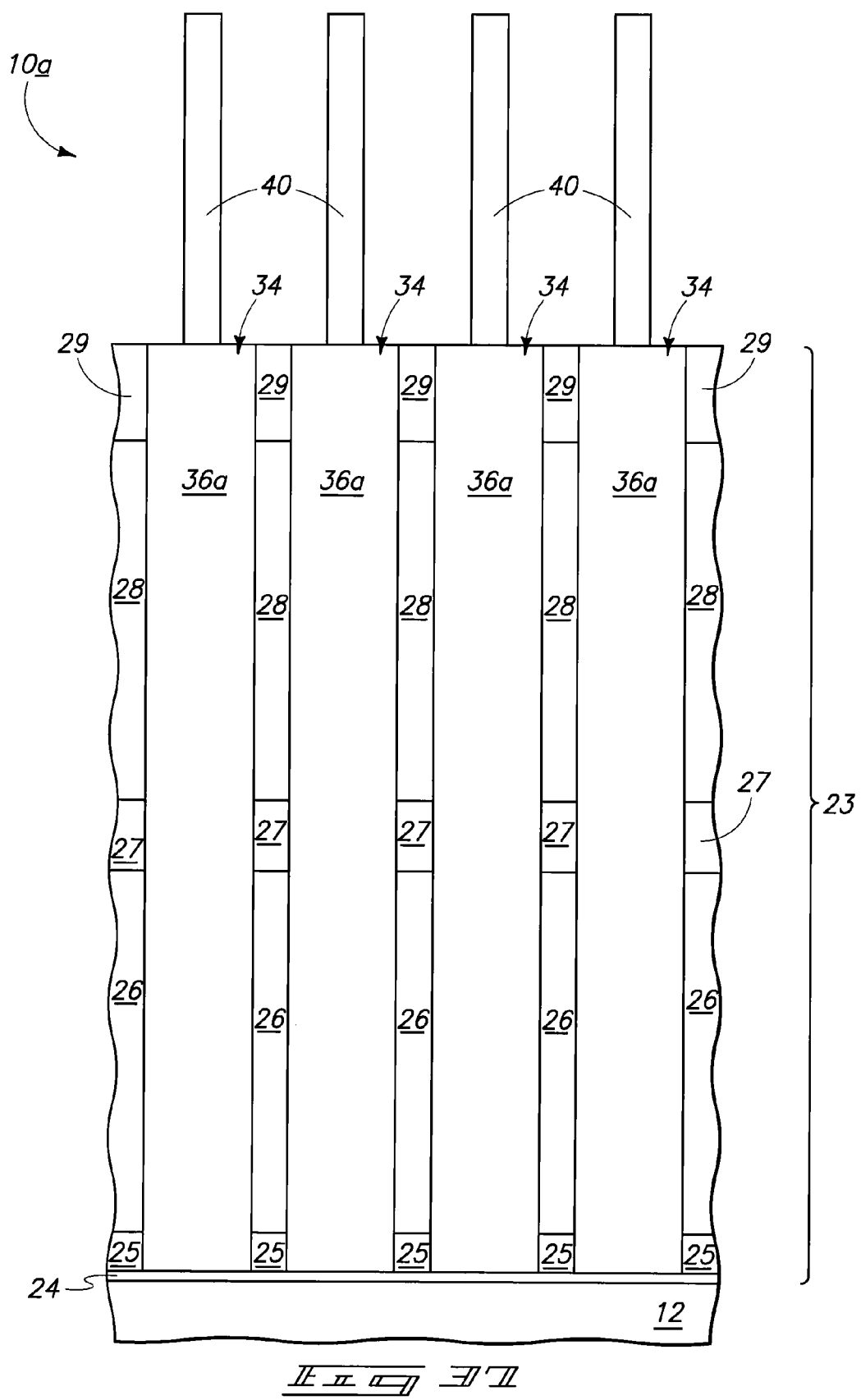
FIG. 37 is a section view taken through line 37-37 in FIG. 35.

Referring to FIGS. 28-31, a capacitor dielectric 56 and a cell capacitor electrode 58 have been deposited as part of substrate 10. Example capacitor dielectric materials include one or more of silicon dioxide, silicon nitride, a composite of silicon dioxide and silicon nitride, or any suitable high k dielectric, and whether existing or yet-to-be developed. By way of example only, high k dielectrics include $Ta_2O_5$ and barium strontium titanate. An example outer capacitor electrode layer comprises conductively doped polysilicon. Such thereby defines individual capacitors 60. Such are depicted as comprising a common cell capacitor plate to all of the depicted capacitors, for example as might be utilized in DRAM or other circuitry. For example and by way of example only, FIG. 32 depicts an example DRAM cell incorporating a capacitor 60. Such comprises an example transistor gate word line 62 having insulative sidewall spacers, an insulative cap and a conductive region under the cap such as a silicide, a conductive polysilicon region under the silicide, and gate dielectric region under the polysilicon. Source/drain regions 64 are shown formed within semiconductive material operatively proximate word line 62. One of such electrically connects with capacitor 60, and another of such electrically connects with a bit line 66.

The above-described embodiments depict examples where deposition of masking material 36 to within first openings 34 only partially fills remaining volume of first openings 34, for example lining the depicted surrounding first opening sidewalls 35 with such masking material. However, embodiments of the invention also include forming masking material to completely fill such first openings. For example, FIGS. 33-43 depict such an alternate example embodiment with respect to a substrate fragment 10a. Like numerals from the first-described embodiments have been utilized where appropriate, with differences being indicated with the suffix "a" or with different numerals.

Referring to FIGS. 33, 34, 35, 36 and 37, such correspond in sequence to the above-depicted FIGS. 6, 7, 8, 9, and 10, respectively, of the first-described embodiment. Except here, masking material 36a has been deposited to completely fill first openings 34. Accordingly, there is no internal volume within which a second material 38 (not shown) is available for deposition.

Figure 38:
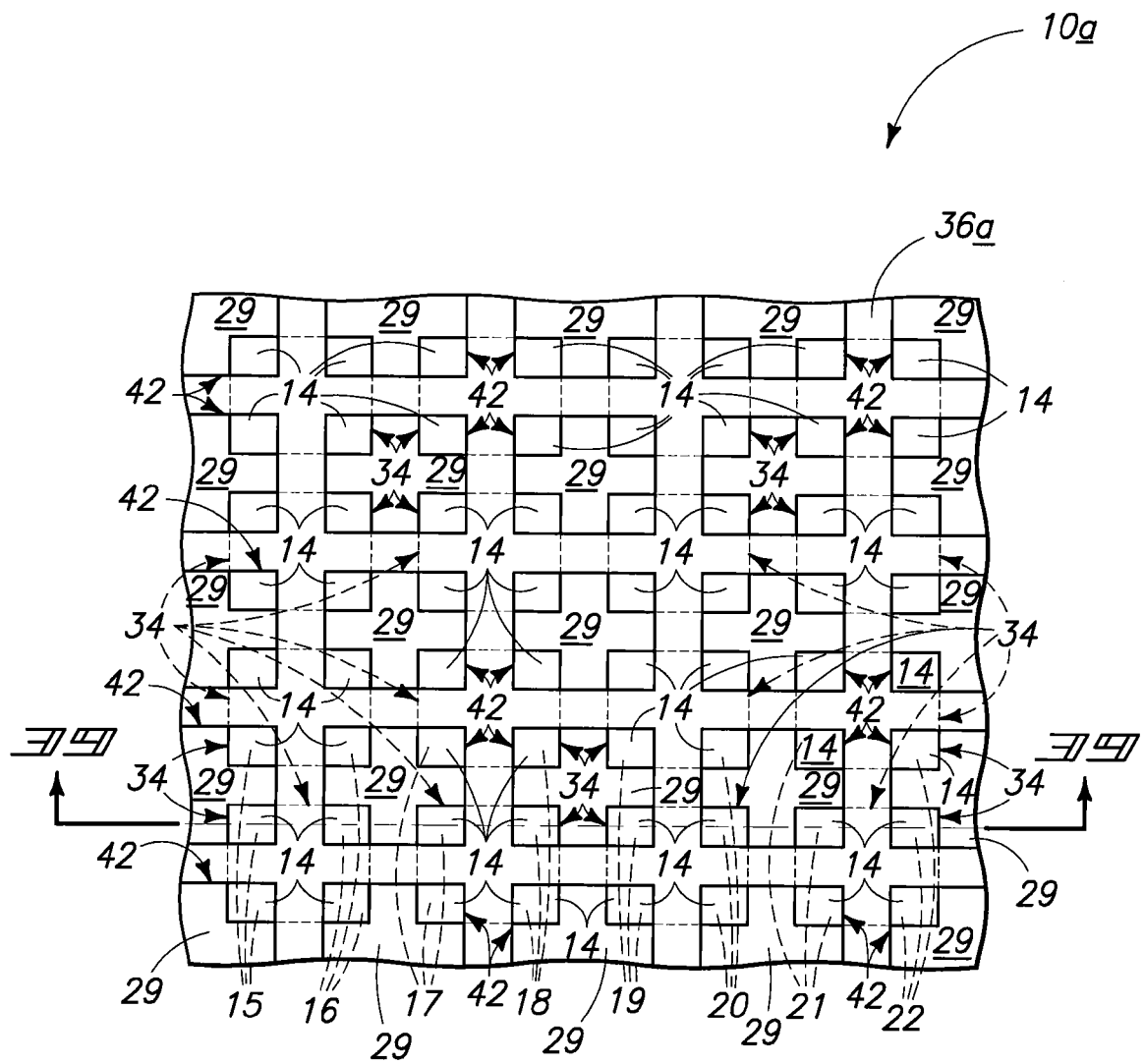
FIG. 38 is a diagrammatic top plan view of the substrate fragment of FIG. 35 at a processing step subsequent to that shown by FIG. 35.
Figure 39:
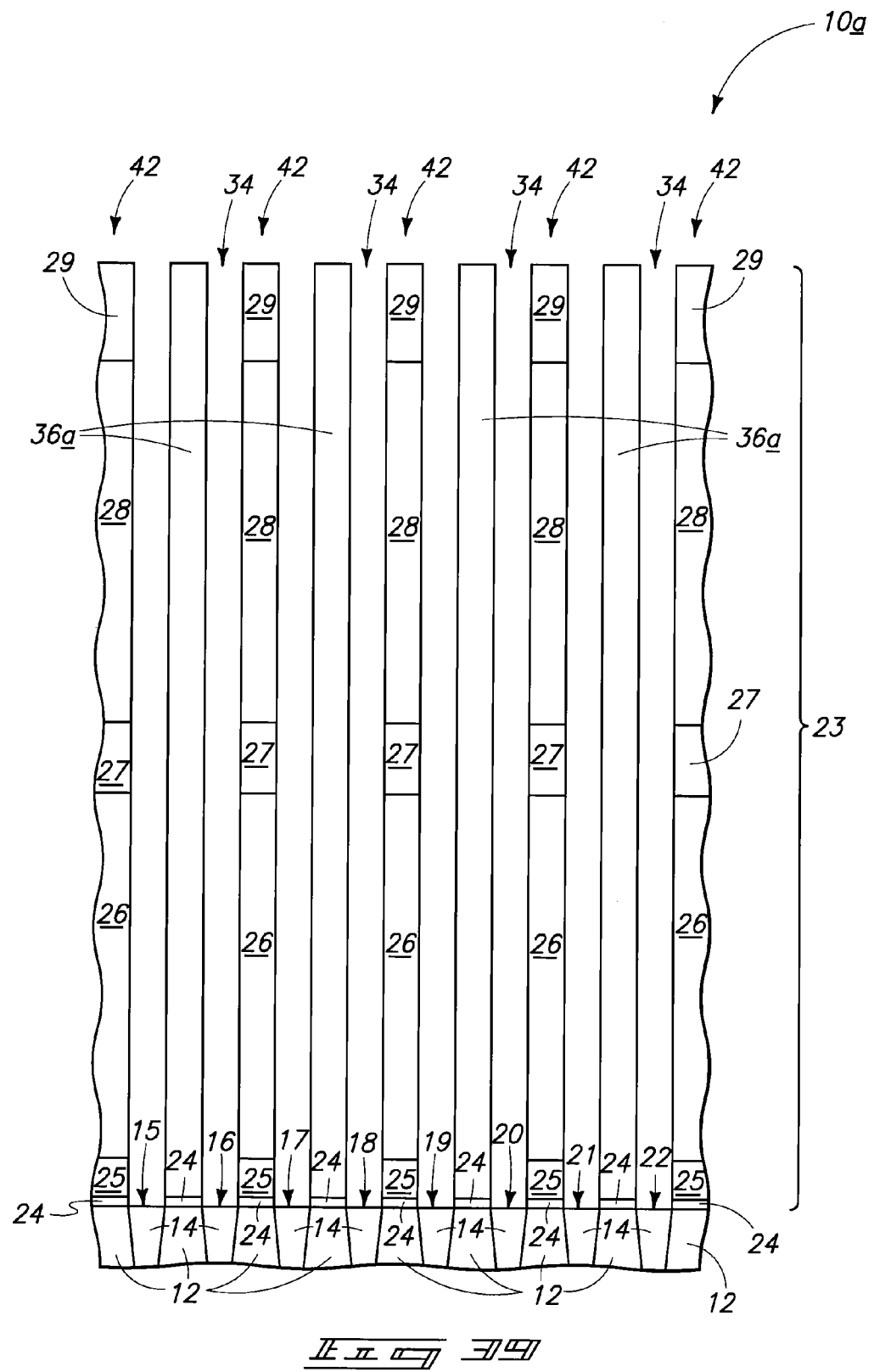
FIG. 39 is a section view taken through line 39-39 in FIG. 38.
Figure 40:
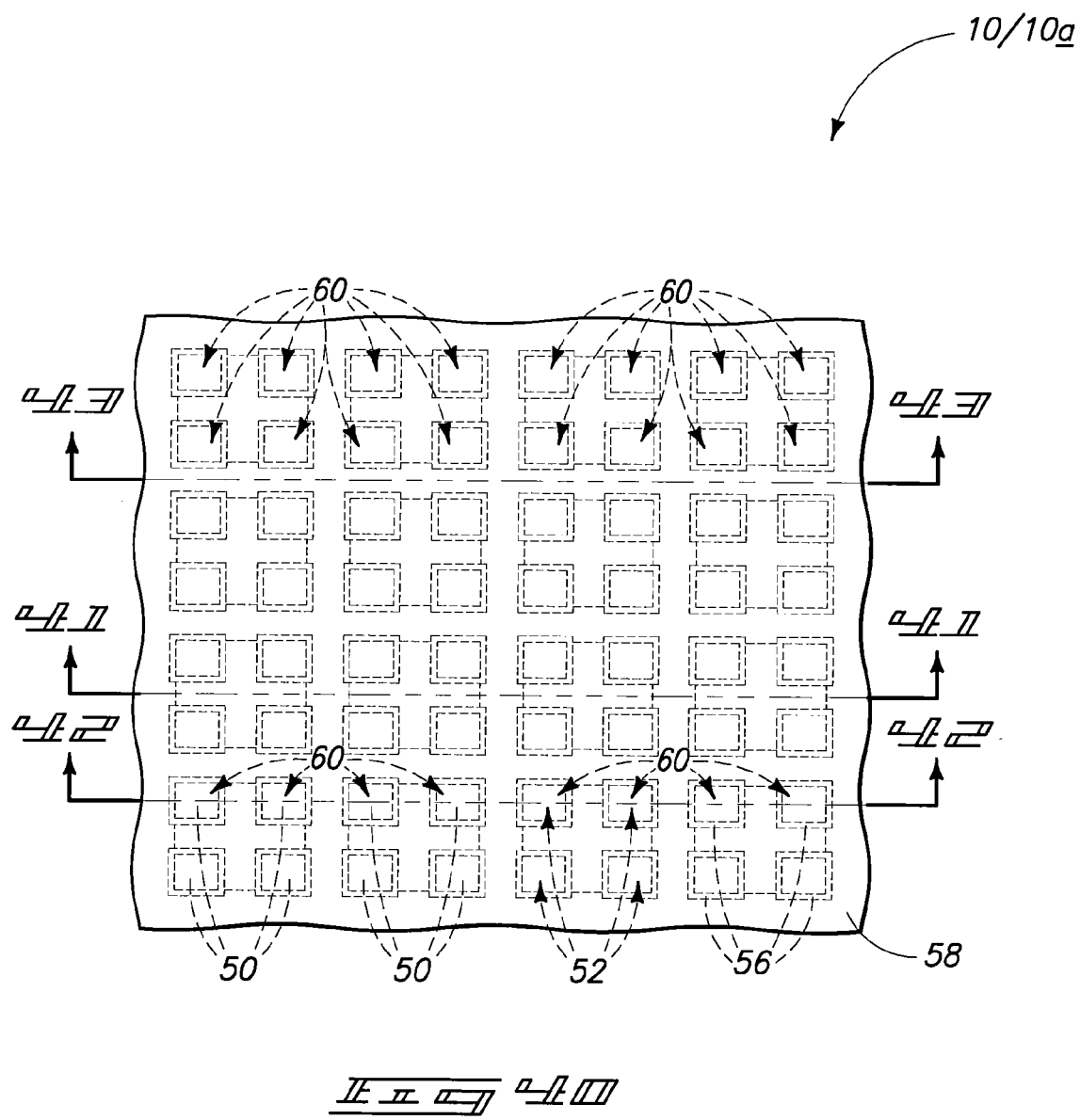
FIG. 40 is a diagrammatic top plan view of the substrate fragment of FIG. 38 at a processing step subsequent to that shown by FIG. 38.
Figure 41:
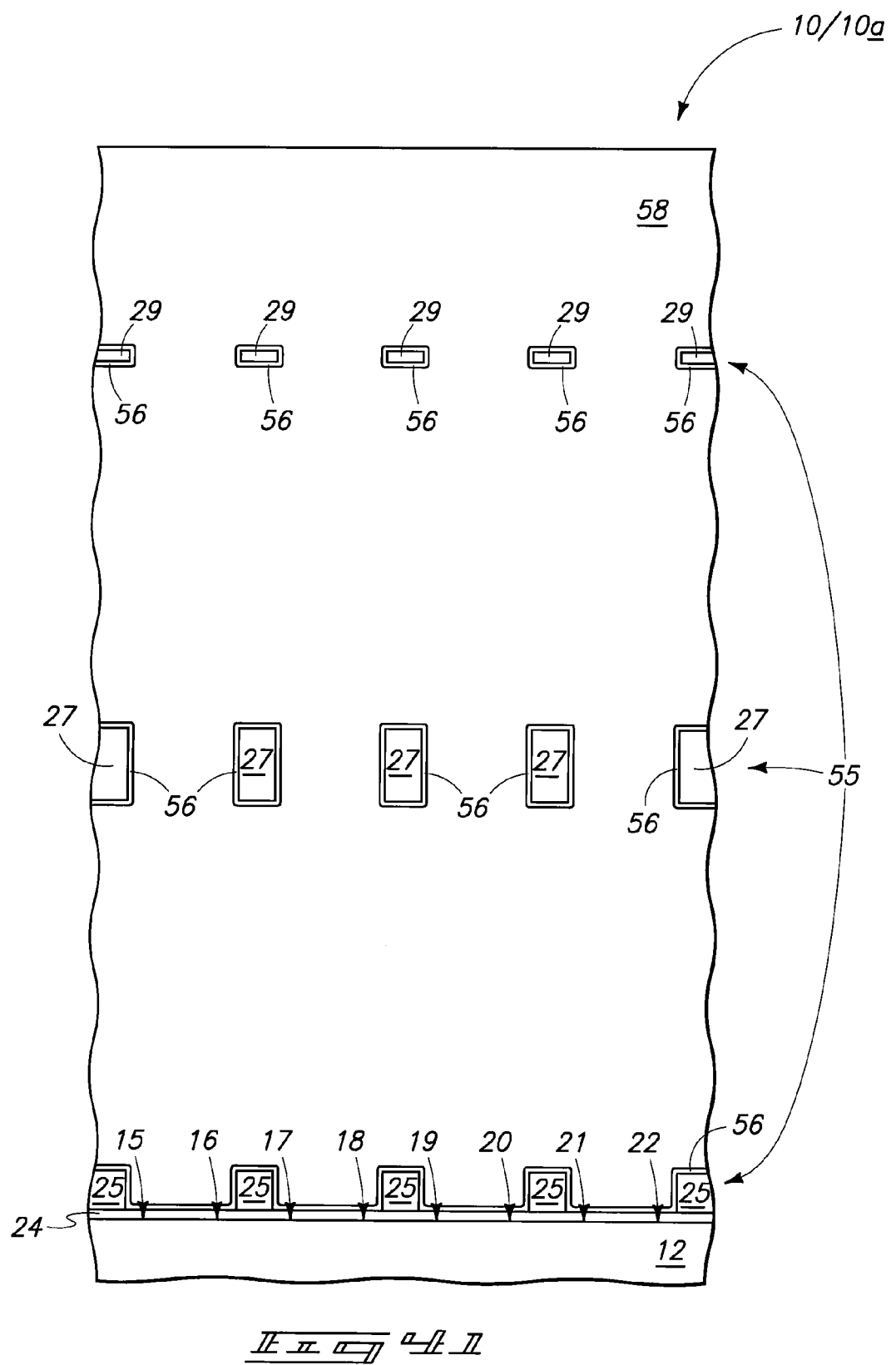
FIG. 41 is a section view taken through line 41-41 in FIG. 40.
Figure 42:
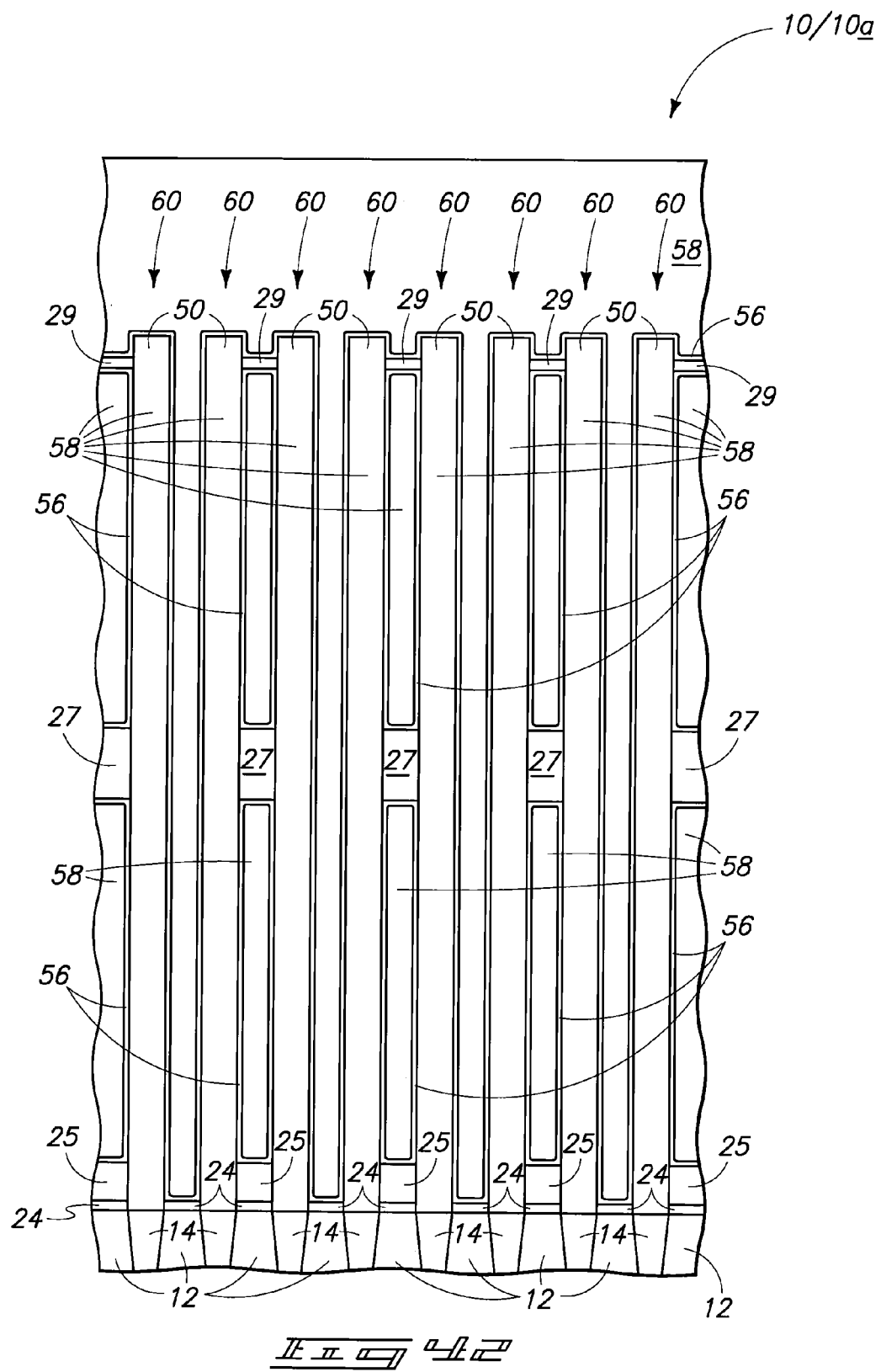
FIG. 42 is a section view taken through line 42-42 in FIG. 40.
Figure 43:
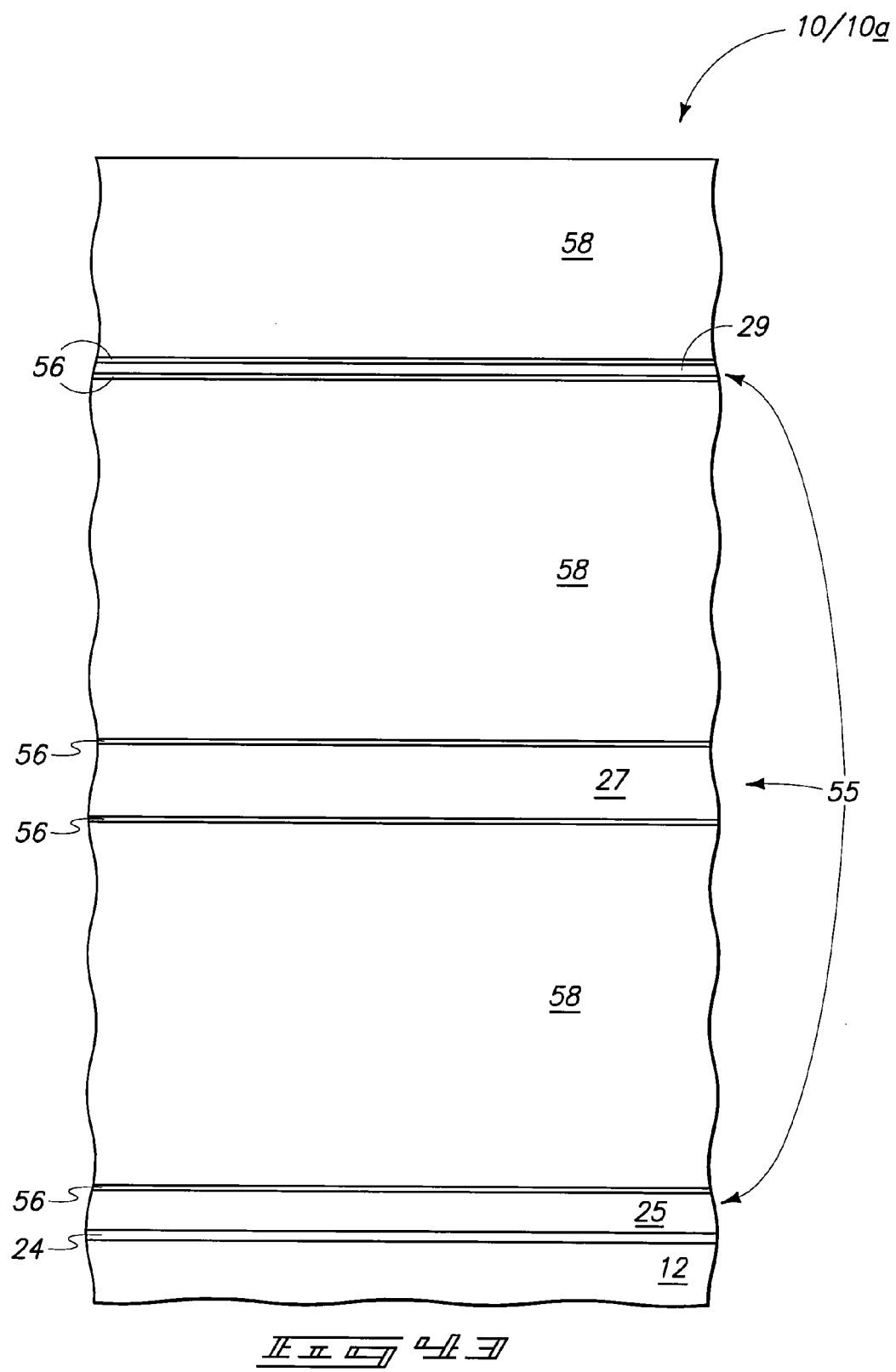
FIG. 43 is a section view taken through line 43-43 in FIG. 40.

Referring to FIGS. 38 and 39, masking material 36a has been etched through second openings 42 in mask 40 to remove masking material 36a from being received over the respective storage node contacts within first openings 34. FIGS. 38 and 39 correspond in sequence to those of FIGS. 11 and 13, respectively.

Referring to FIGS. 40-43, such correspond in sequence to those of FIGS. 28-31, respectively, of the first-described embodiment. Accordingly, subsequent processing has been conducted to form individual capacitor electrodes 52, followed by removal of all remaining of masking material 36a (not shown) to ultimately form capacitors 60 essentially that same as in FIGS. 28-31.

Figure 44:
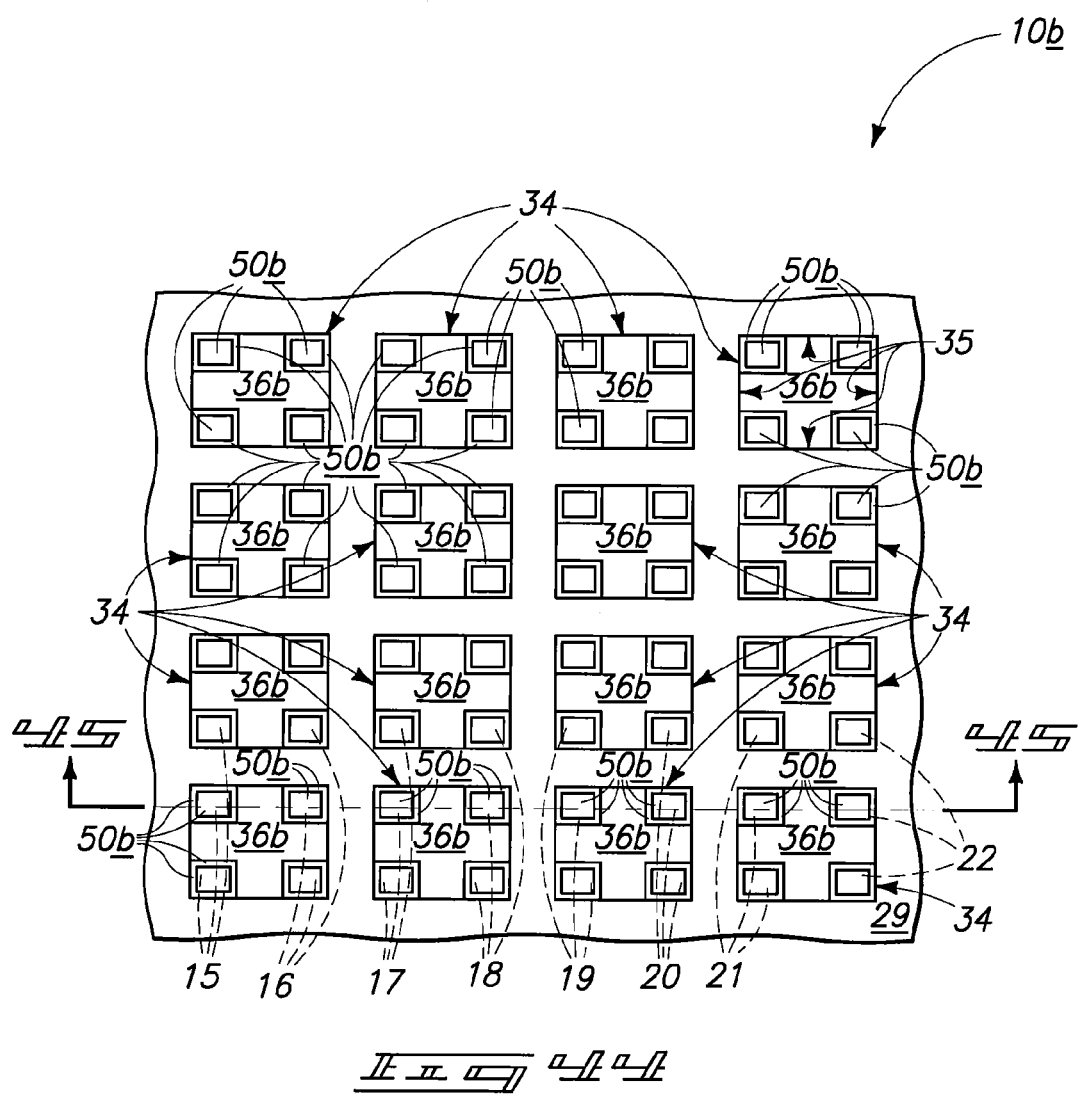
FIG. 44 is a diagrammatic top plan view of an alternate embodiment substrate fragment in process in accordance with an embodiment of the invention.
Figure 45:
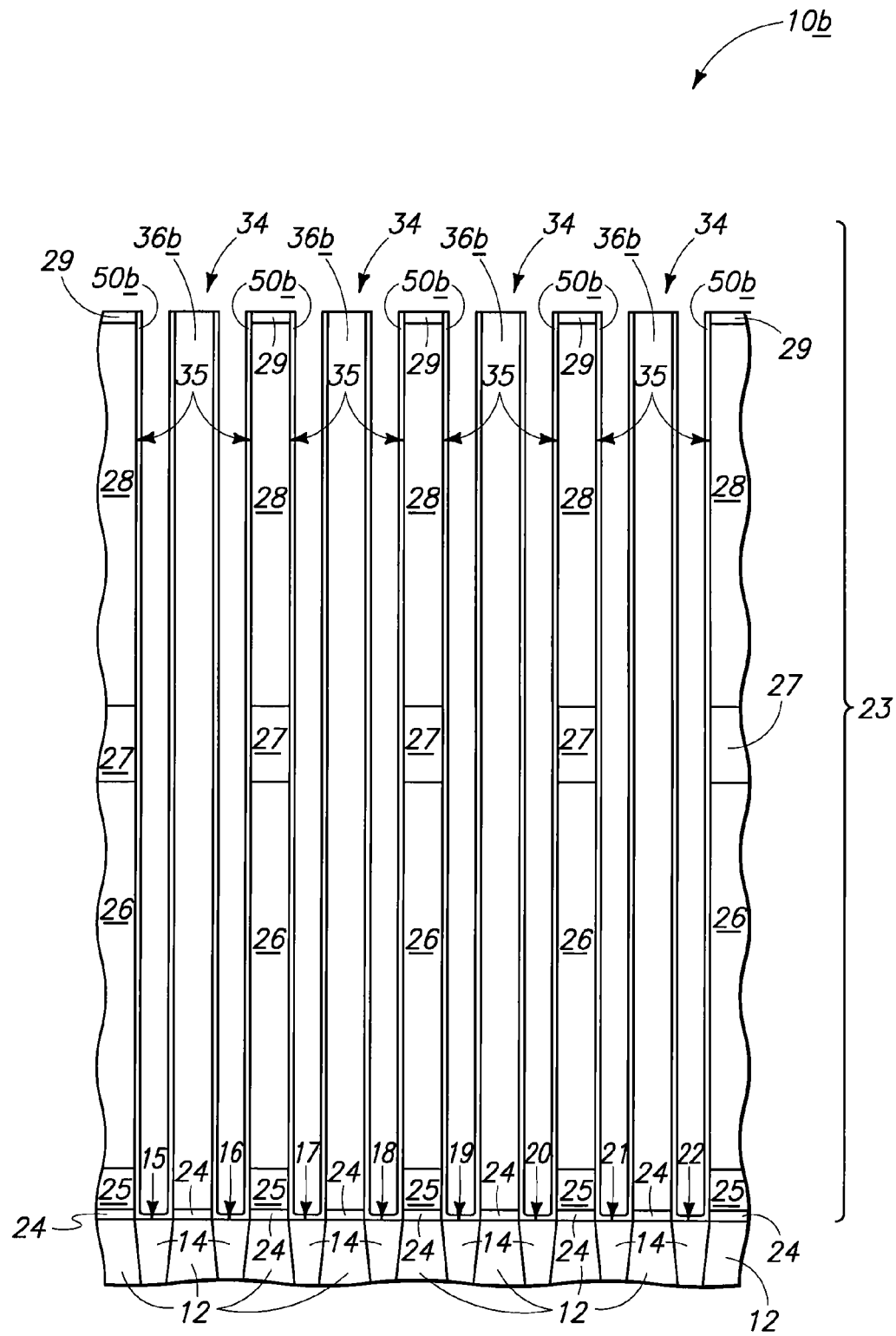
FIG. 45 is a section view taken through line 45-45 in FIG. 44.
Figure 46:
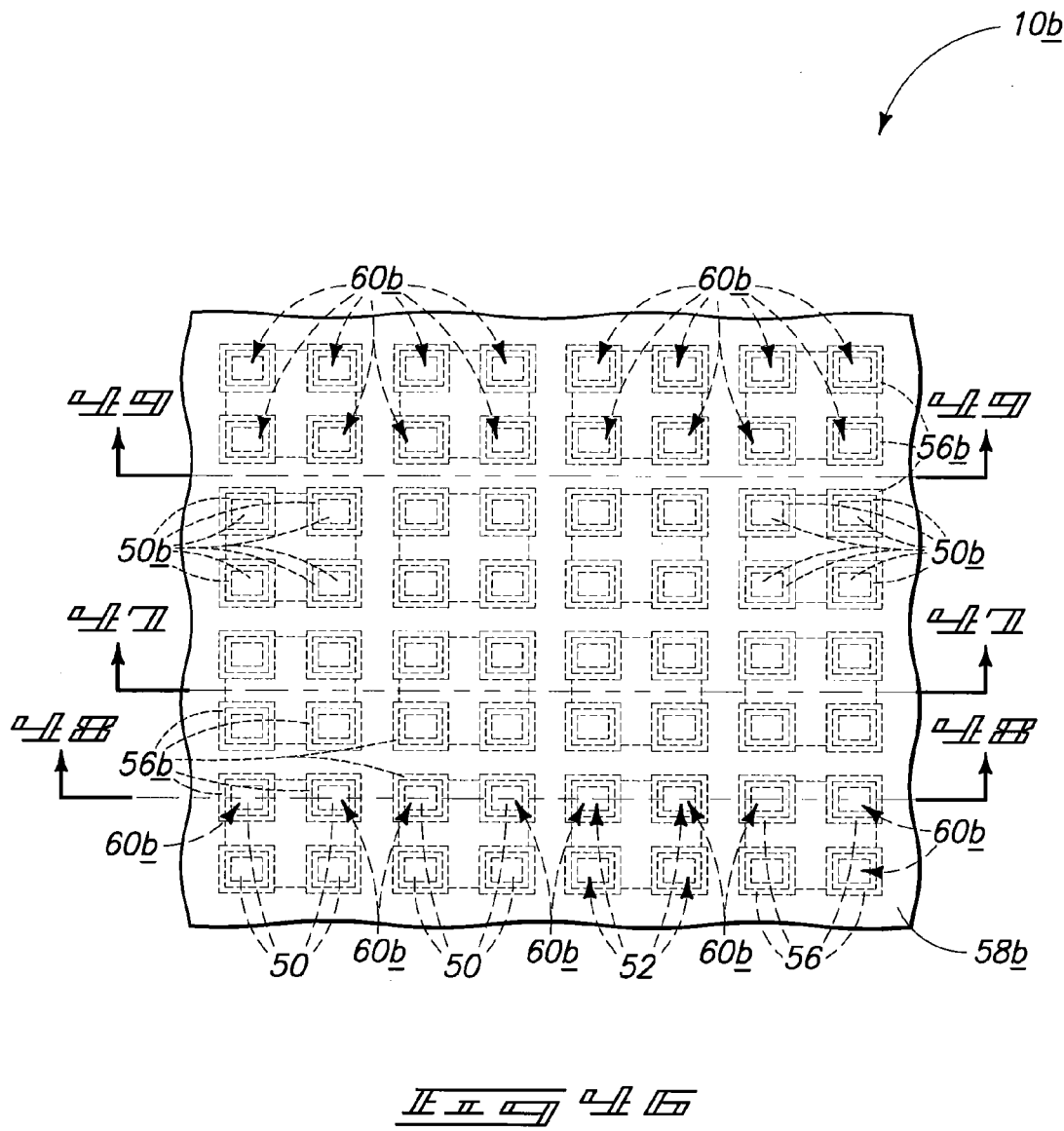
FIG. 46 is a diagrammatic top plan view of the substrate fragment of FIG. 44 at a processing step subsequent to that shown by FIG. 44.
Figure 47:
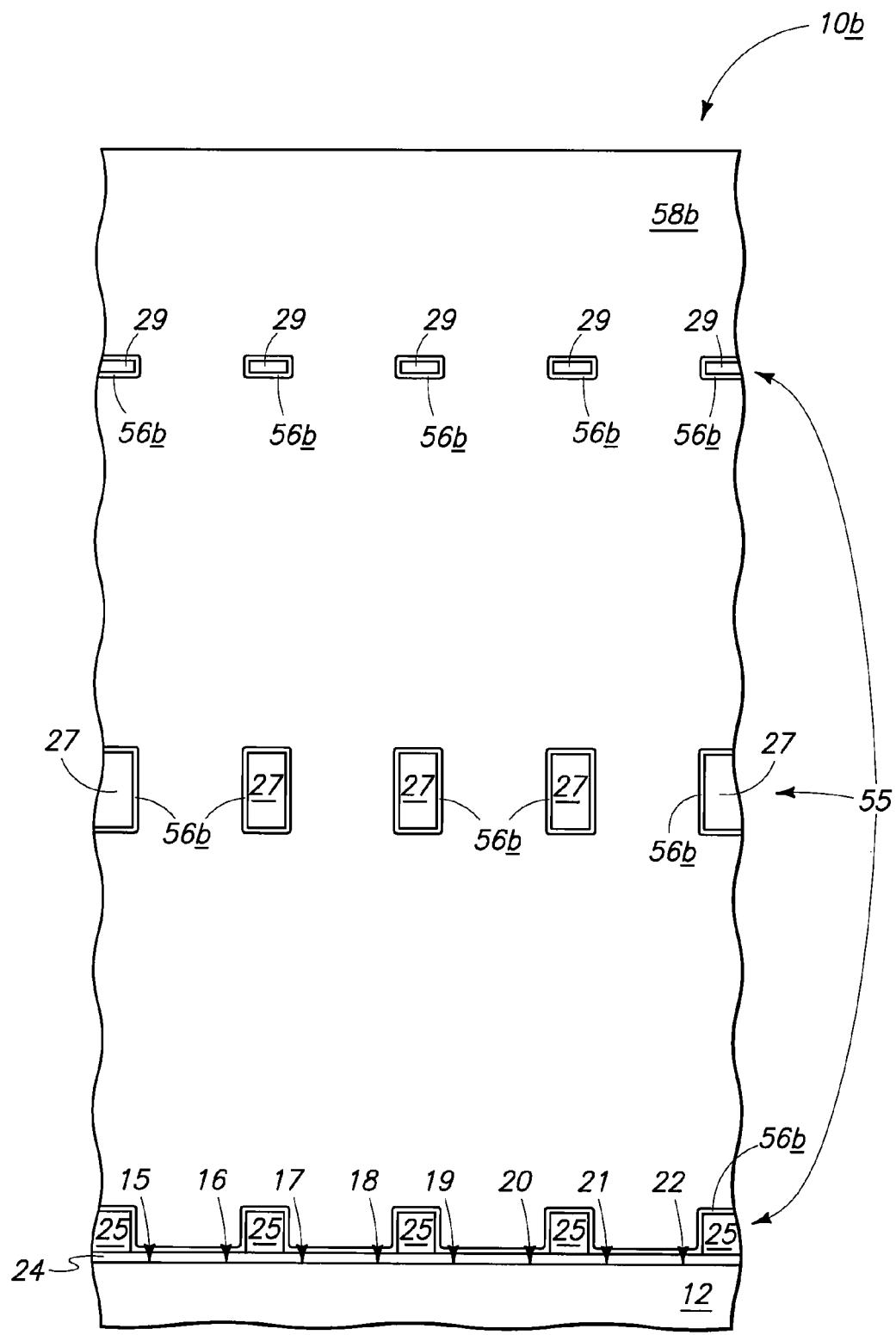
FIG. 47 is a section view taken through line 47-47 in FIG. 46.
Figure 48:
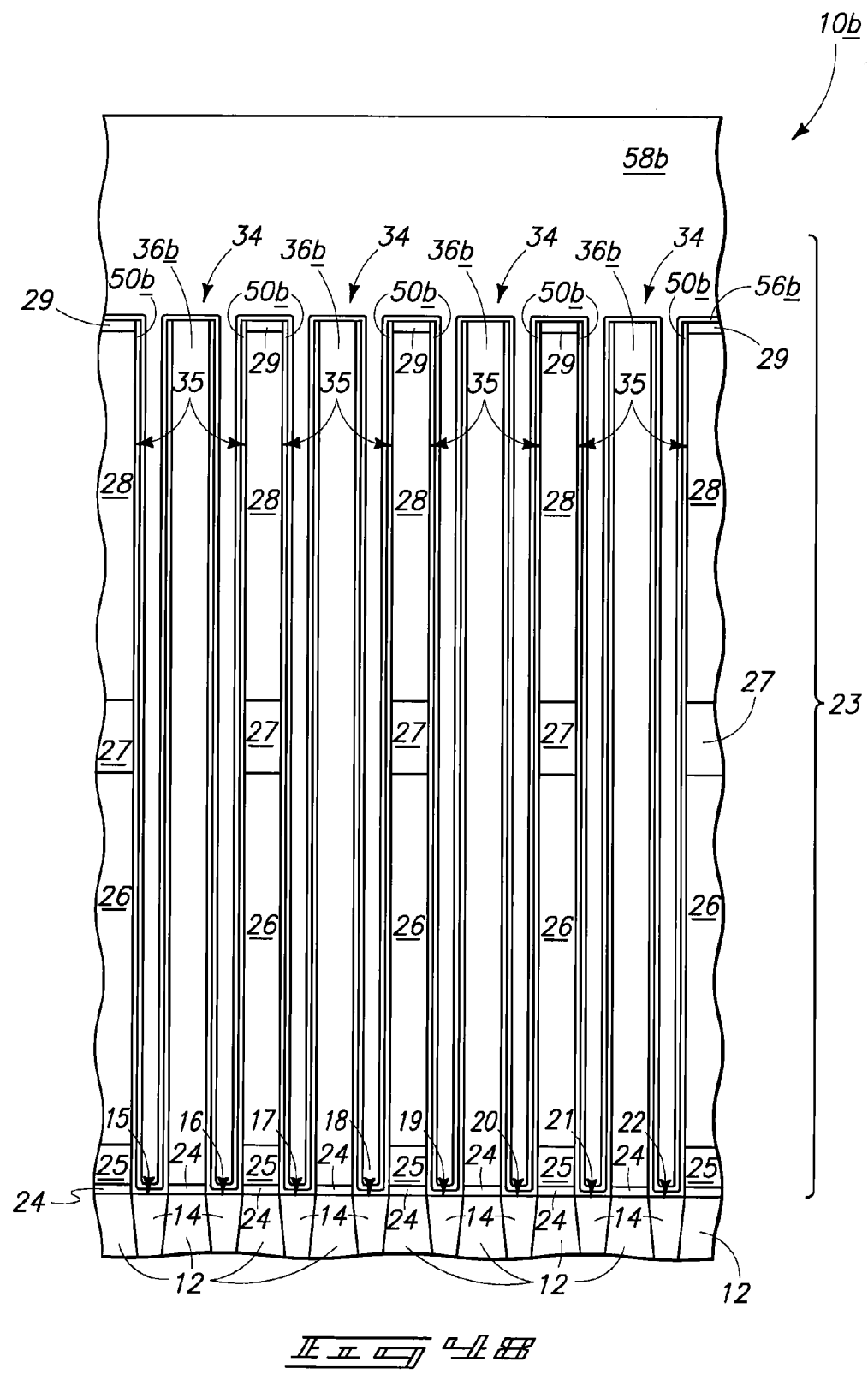
FIG. 48 is a section view taken through line 48-48 in FIG. 46.
Figure 49:
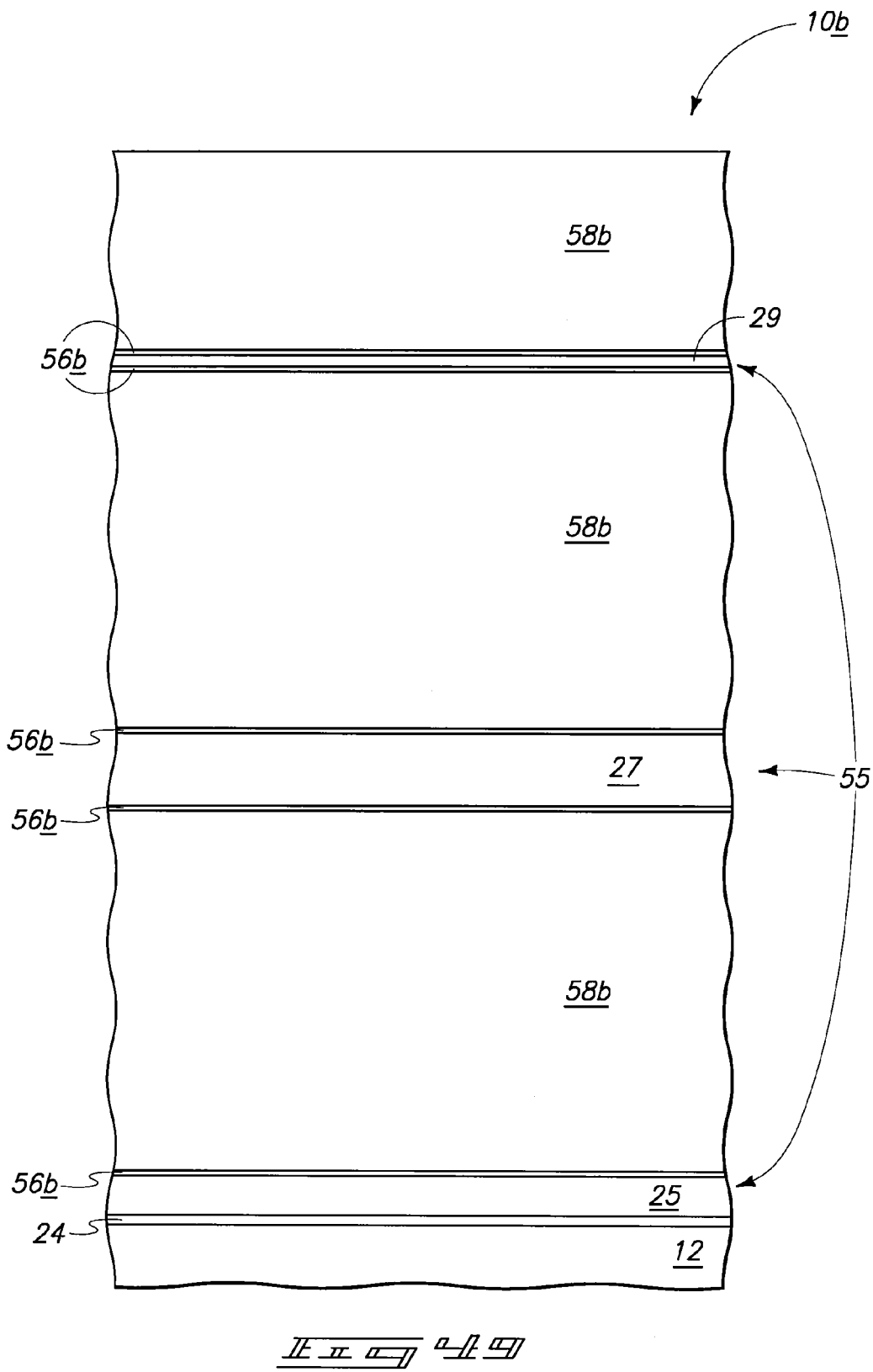
FIG. 49 is a section view taken through line 49-49 in FIG. 46.

The above example embodiments depict implementations wherein conductive material 50 is deposited to form individual capacitor electrodes 52 to comprise singular, essentially fully solid, pillars. However, aspects of the invention also contemplate forming such conductive material to be deposited to form individual capacitor electrodes to comprise open container shapes, or other shapes. For example, FIGS. 44 and 45 depict an alternate example substrate fragment 10b in comparison to substrate fragment 10a referred to above. Like numerals from the substrate 10a embodiment have been utilized where appropriate, with differences being indicated with the suffix "b" or with different numerals. FIGS. 44 and 45 depict deposition of conductive material 50b to less than fill the void created by removal of masking material 36b over the individual storage node contacts. FIGS. 46-49 depict subsequent corresponding processing having been conducted to form capacitors 60b wherein the individual inner capacitor electrodes 52b comprise open container shapes.

Embodiments as described herein encompass a method of forming a plurality of capacitors which comprises forming a plurality of individual capacitor electrodes comprising using two masking steps. An earlier of the two masking steps is used to form an array of first openings (i.e., first openings 34) over a plurality of storage node contacts. A later of the two masking steps is used to form an array of second openings (i.e., second openings 42) received partially over and partially offset from the array of first openings. Overlapping portions of the first and second openings are received over the storage node contacts. Masking steps might also be added before and after the stated earlier and later masking steps in fabrication of a plurality of individual capacitor electrodes.

After both of the two stated masking steps, conductive material of the individual capacitor electrodes is deposited into the overlapping portions of each of the first and second openings. The individual capacitor electrodes are ultimately incorporated into a plurality of capacitors. In some embodiments, the overlapping portions of the first and second openings have the same horizontal cross sectional size and shape as that of individual of the storage node contacts in at least one horizontal cross section, for example and by way of example only as is depicted in each of the above depicted embodiments. However, the overlapping portions might everywhere have different horizontal cross sectional size and shape to that of individual of the storage node contacts.

In some embodiments, at least the individual first openings within which the masking material is deposited are no greater than 3.5F×5.5F in horizontal size, where "F" is the minimum feature size measured orthogonally that is obtained using lithography to pattern features in fabrication of the plurality of capacitors. Each of the above-depicted FIGS. 1-49 embodiments may, for example, be utilized in fabricating individual first openings to have such a horizontal size which is less than or equal to 3.5F×5.5F.

Figure 50:
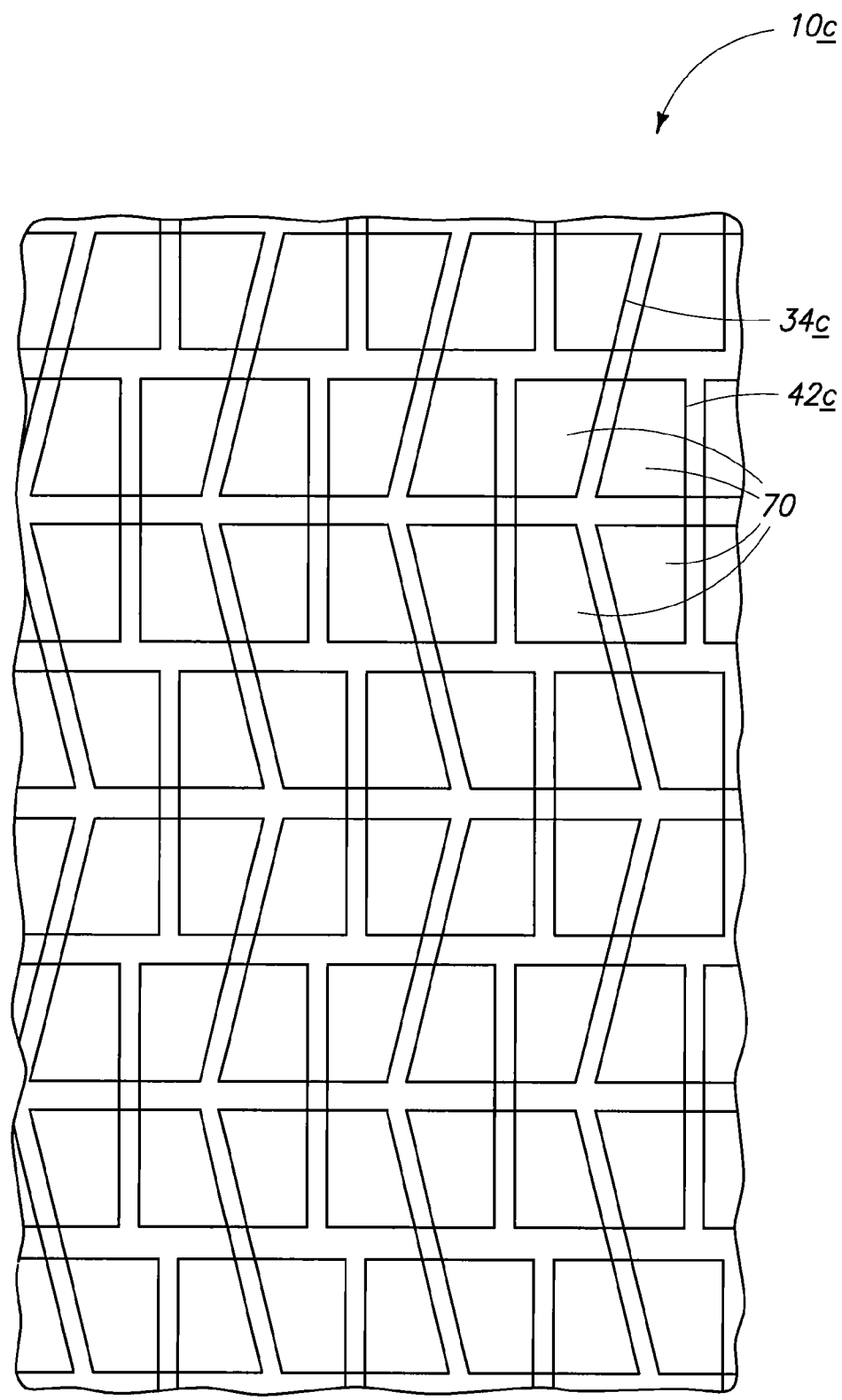
FIG. 50 is a diagrammatic top plan view of an alternate embodiment substrate fragment in process in accordance with an embodiment of the invention.

FIG. 50 diagrammatically depicts in top view an alternate example embodiment wherein each of individual first openings 34c and each of individual second openings 42c have respective horizontal sizes which are 3.5F×5.5F. FIG. 50 diagrammatically depicts a top view of a substrate fragment 10c. Like numerals from the above-described embodiments have been utilized where appropriate, with differences being indicated with the suffix "c" or with different numerals. By way of example only, each of first openings 34c and second openings 42c are quadrilateral in shape, yet of different shape.

Further by way of example only, the different shapes of openings 34c and 42c are each parallelograms. Further in one example embodiment and as shown, substrate fragment 10c is depicted as comprising overlapping portions 70 of first openings 34c and second openings 42c which are quadrilateral in shape, and in one embodiment yet which are not of a parallelogram shape. Further by way of example only, such depicts an example wherein overlapping portions 70 have different horizontal cross sectional size and shape from that of individual of the storage node contacts, where for example such were fabricated to be square or rectangular as in the above-depicted example FIGS. 1-49 embodiments, for example which could also may be incorporated in the FIG. 50 embodiment.

In some embodiments, at least the individual first openings within which the masking material may be deposited are no greater than F×F in horizontal size, where "F" is the minimum feature size measured orthogonally that is obtained using lithography to pattern features in fabrication of the plurality of capacitors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a plurality of capacitors, comprising:
    forming a plurality of individual capacitor electrodes comprising using two masking steps, an earlier of the two masking steps being used to form an array of first openings over a plurality of storage node contacts, a later of the two masking steps being used to form an array of second openings received partially over and partially offset from the array of first openings, overlapping portions of the first and second openings being received over the storage node contacts;
    after both of the two masking steps, depositing conductive material of the individual capacitor electrodes into the overlapping portions of each of the first and second openings; and
    incorporating the individual capacitor electrodes into a plurality of capacitors.

2. The method of claim 1 wherein the conductive material is deposited to form the individual capacitor electrodes to comprise an open container shape.

3. The method of claim 1 wherein the conductive material is deposited to form the individual capacitor electrodes to comprise a singular pillar.

4. The method of claim 1 wherein the overlapping portions have the same horizontal cross sectional size and shape as that of individual of the storage node contacts in at least one horizontal cross section.

5. The method of claim 1 wherein the overlapping portions everywhere have different horizontal cross sectional size and shape as that of individual of the storage node contacts.

6. A method of forming a plurality of capacitors, comprising:
    forming first material over an array of storage node contacts;
    forming an array of first openings into the first material over the storage node contacts, individual of the first openings being formed over at least two of the storage node contacts;
    depositing masking material within the first openings and which is received over the storage node contacts;
    forming an array of second openings in a mask, the array of second openings being received partially over and partially offset from the array of first openings, individual of the second openings being formed over at least two storage node contacts that are received under different and adjacent of the first openings;
    etching the masking material through the second openings in the mask to remove the masking material from being received over the storage node contacts within the first openings;
    after the etching, forming conductive material within the first openings in electrical connection with the storage node contacts and to comprise individual capacitor electrodes; and
    incorporating the individual capacitor electrodes into a plurality of capacitors.

7. The method of claim 6 wherein the individual first openings within which the masking material is deposited are no greater than 3.5F×5.5F in horizontal size, where "F" is the minimum feature size measured orthogonally that is obtained using lithography to pattern features in fabrication of the plurality of capacitors.

8. The method of claim 7 wherein the horizontal size is 3.5F×5.5F.

9. The method of claim 7 wherein the horizontal size is less than 3.5F×5.5F.

10. The method of claim 6 wherein the individual first openings within which the masking material is deposited are no greater than 5F×5F in horizontal size, where "F" is the minimum feature size measured orthogonally that is obtained using lithography to pattern features in fabrication of the plurality of capacitors.

11. The method of claim 6 wherein the individual of the first openings are formed over four or less of the storage node contacts.

12. The method of claim 6 wherein the first and second openings are all of the same size and shape in at least one horizontal cross section.

13. The method of claim 6 wherein the first and second openings are of different size and shape in at least one horizontal cross section.

14. The method of claim 13 wherein the different shapes are each parallelograms in the at least one horizontal cross section.

15. The method of claim 6 wherein the individual of the first openings are formed over only four of the storage node contacts, and the individual of the second openings are formed over only four of the storage node contacts.

16. The method of claim 15 wherein the first and second openings individually comprise parallelogram shapes in at least one horizontal cross section.

17. A method of forming a plurality of capacitors, comprising:
    forming first material over an array of storage node contacts;
    forming an array of first openings into the first material over the storage node contacts, individual of the first openings being formed over at least two of the storage node contacts and comprising surrounding sidewalls;

lining the surrounding first opening sidewalls with masking material which less than fills the first openings and is received over the storage node contacts;

forming second material to within the first openings adjacent the masking material;

forming an array of second openings in a mask, the array of second openings being received partially over and partially offset from the array of first openings, individual of the second openings being formed over at least two storage node contacts that are received under different and adjacent of the first openings;

etching the masking material selectively relative to the second material through the second openings in the mask to remove the masking material from being received over the storage node contacts within the first openings;

after the etching, forming conductive material within the first openings in electrical connection with the storage node contacts and to comprise individual capacitor electrodes; and incorporating the individual capacitor electrodes into a plurality of capacitors.

18. The method of claim 17 wherein the etching is conducted selectively relative to the first material.

19. The method of claim 17 wherein the first material comprises at least first and second etchably different materials, and further comprising etching the second etchably different material selectively relative to the first etchably different material to form a lattice retaining structure comprised of the first etchably different material that is received externally among the individual capacitor electrodes.

20. The method of claim 17 wherein the individual of the first openings are formed over four or less of the storage node contacts.

21. The method of claim 17 wherein the first openings within which the masking material is received do not extend to the storage node contacts.

22. The method of claim 17 wherein said lining comprises forming the masking material to have a lateral thickness within the first openings which is no greater than 40% of a minimum horizontal cross sectional open dimension at outermost portions of the individual first openings.

23. The method of claim 17 wherein the individual of the second openings are formed over four or less of the storage node contacts.

24. The method of claim 17 wherein the individual of the first openings are formed over only four of the storage node contacts, and the individual of the second openings are formed over only four of the storage node contacts.

25. The method of claim 24 wherein the first and second openings individually comprise parallelogram shapes in at least one horizontal cross section.

26. The method of claim 17 comprising after forming the conductive material, etching all remaining of said masking material from the first openings.

27. The method of claim 17 comprising after forming the conductive material, etching all remaining of said second material from the first openings.

28. A method of forming a plurality of capacitors, comprising:

forming first material over an array of storage node contacts;

forming an array of first openings into the first material over the storage node contacts, individual of the first openings being formed over at least two of the storage node contacts;

forming masking material to completely fill the first openings;

forming an array of second openings in a mask, the array of second openings being received partially over and partially offset from the array of first openings, individual of the second openings being formed over at least two storage node contacts that are received under different and adjacent of the first openings;

etching the masking material through the second openings in the mask to remove the masking material from being received over the storage node contacts within the first openings;

after the etching, forming conductive material within the first openings in electrical connection with the storage node contacts and to comprise individual capacitor electrodes; and incorporating the individual capacitor electrodes into a plurality of capacitors.

29. A method of forming a plurality of capacitors, comprising:

forming first material over an array of storage node contacts;

forming an array of first openings into the first material over the storage node contacts, individual of the first openings being formed over four of the storage node contacts;

depositing masking material within the first openings and which is received over the storage node contacts;

forming an array of second openings in a mask, the array of second openings being received partially over and partially offset from the array of first openings, overlapping portions of the first and second openings being received over the storage node contacts, individual of the second openings being formed over four of the storage node contacts that are received under different and adjacent of the first openings, the first and second openings individually being quadrilateral in shape in at least one horizontal cross section;

etching the masking material through the second openings in the mask to remove the masking material from being received over the storage node contacts within the first openings;

after the etching, forming conductive material within the first openings in electrical connection with the storage node contacts and to comprise individual capacitor electrodes; and incorporating the individual capacitor electrodes into a plurality of capacitors.

30. The method of claim 29 wherein the quadrilateral shapes of the first openings in the at least one cross section and the quadrilateral shapes of the second openings in the at least one cross sections comprise parallelograms.

31. The method of claim 29 wherein the quadrilateral shapes of the first openings in the at least one cross section and the quadrilateral shapes of the second openings in the at least one cross sections are of the same shape.

32. The method of claim 29 wherein the quadrilateral shapes of the first openings in the at least one cross section and the quadrilateral shapes of the second openings in the at least one cross sections are of different shape.

33. The method of claim 32 wherein the different shapes are each parallelograms.

34. The method of claim 29 wherein the overlapping portions are in quadrilateral shapes in at least one horizontal cross section.

35. The method of claim 34 wherein the quadrilateral shapes of the overlapping portions are not parallelograms.

* * * * *